US010541693B2

(12) United States Patent
Zerbe et al.

(10) Patent No.: US 10,541,693 B2
(45) Date of Patent: *Jan. 21, 2020

(54) METHOD AND APPARATUS FOR SOURCE-SYNCHRONOUS SIGNALING

(71) Applicant: Rambus Inc., Sunnyvale, CA (US)

(72) Inventors: Jared L. Zerbe, Woodside, CA (US); Brian S. Leibowitz, San Francisco, CA (US); Hsuan-Jung Su, Chapel Hill, NC (US); John Cronan Eble, III, Chapel Hill, NC (US); Barry William Daly, Chapel Hill, NC (US); Lei Luo, Chapel Hill, NC (US); Teva J. Stone, Chapel Hill, NC (US); John Wilson, Wake Forest, NC (US); Jihong Ren, Sunnyvale, CA (US); Wayne D. Dettloff, Cary, NC (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/242,475

(22) Filed: Jan. 8, 2019

(65) Prior Publication Data
US 2019/0238142 A1 Aug. 1, 2019

Related U.S. Application Data

(63) Continuation of application No. 15/667,184, filed on Aug. 2, 2017, now Pat. No. 10,211,841, which is a (Continued)

(51) Int. Cl.
*H03L 7/091* (2006.01)
*H03K 5/156* (2006.01)
(Continued)

(52) U.S. Cl.
CPC ............ *H03L 7/091* (2013.01); *G11C 7/1066* (2013.01); *G11C 7/1093* (2013.01); *G11C 7/222* (2013.01);
(Continued)

(58) Field of Classification Search
CPC ......... H03L 7/091; H03L 7/00; H03L 7/0802; H03L 7/099; H04L 7/033; H04L 7/0079;
(Continued)

(56) References Cited

U.S. PATENT DOCUMENTS

| 5,124,589 A | 6/1992 | Shiomi et al. |
| 5,515,403 A * | 5/1996 | Sloan ........................ G06F 1/12 327/144 |

(Continued)

OTHER PUBLICATIONS

Barroso, Luiz, et al., "The Case for Energy-Proportional Computing", Computer, Dec. 2007, pp. 33-37, vol. 40, No. 12. 5 pages.
(Continued)

*Primary Examiner* — Vibol Tan
(74) *Attorney, Agent, or Firm* — The Neudeck Law Firm, LLC

(57) ABSTRACT

A low-power, high-performance source-synchronous chip interface which provides rapid turn-on and facilitates high signaling rates between a transmitter and a receiver located on different chips is described in various embodiments. Some embodiments of the chip interface include, among others: a segmented "fast turn-on" bias circuit to reduce power supply ringing during the rapid power-on process; current mode logic clock buffers in a clock path of the chip interface to further reduce the effect of power supply ringing; a multiplying injection-locked oscillator (MILO) clock generator to generate higher frequency clock signals from a reference clock; a digitally controlled delay line which can be inserted in the clock path to mitigate deterministic jitter caused by the MILO clock generator; and circuits for
(Continued)

periodically re-evaluating whether it is safe to retime transmit data signals in the reference clock domain directly with the faster clock signals.

20 Claims, 25 Drawing Sheets

Related U.S. Application Data continuation of application No. 14/456,716, filed on Aug. 11, 2014, now Pat. No. 9,748,960, which is a continuation of application No. 13/523,631, filed on Jun. 14, 2012, now Pat. No. 8,836,394.

(60) Provisional application No. 61/615,691, filed on Mar. 26, 2012.

(51) Int. Cl.
| | |
|---|---|
| *H03L 7/00* | (2006.01) |
| *G11C 7/10* | (2006.01) |
| *G11C 7/22* | (2006.01) |
| *H04L 7/00* | (2006.01) |
| *H04L 7/033* | (2006.01) |
| *H03L 7/08* | (2006.01) |
| *H03L 7/099* | (2006.01) |
| *G11C 7/04* | (2006.01) |

(52) U.S. Cl.
CPC ............ *H03K 5/1565* (2013.01); *H03L 7/00* (2013.01); *H03L 7/0802* (2013.01); *H03L 7/099* (2013.01); *H04L 7/0079* (2013.01); *H04L 7/033* (2013.01); *G11C 7/04* (2013.01); *H04L 7/0008* (2013.01); *H04L 7/0037* (2013.01); *H04L 7/0087* (2013.01)

(58) Field of Classification Search
CPC ... H04L 7/0008; H04L 7/0087; H04L 7/0037; H03K 5/1565; G11C 7/1093; G11C 7/1066; G11C 7/222; G11C 7/04
See application file for complete search history.

(56) References Cited

U.S. PATENT DOCUMENTS

| | | | |
|---|---|---|---|
| 5,668,830 A * | 9/1997 | Georgiou | H03M 9/00 370/517 |
| 6,400,291 B1 | 6/2002 | Sankey | |
| 6,411,145 B1 | 6/2002 | Kueng | |
| 6,473,439 B1 | 10/2002 | Zerbe et al. | |
| 6,775,328 B1 | 8/2004 | Segaram | |
| 6,836,521 B2 | 12/2004 | Ware et al. | |
| 6,900,676 B1 | 5/2005 | Tamura | |
| 6,967,514 B2 | 11/2005 | Kizer et al. | |
| 7,003,423 B1 | 2/2006 | Kabani et al. | |
| 7,058,150 B2 | 6/2006 | Buchwald et al. | |
| 7,423,467 B1 | 9/2008 | Simon | |
| 7,471,691 B2 | 12/2008 | Black et al. | |
| 7,541,852 B2 | 6/2009 | Johnson | |
| 7,706,210 B2 | 4/2010 | Kim et al. | |
| 7,924,069 B2 | 4/2011 | Narathong et al. | |
| 8,000,166 B2 | 8/2011 | Kim et al. | |
| 8,271,824 B2 | 9/2012 | Kuroki | |
| 8,300,754 B2 | 10/2012 | Nedovic et al. | |
| 8,305,821 B2 | 11/2012 | Ware | |
| 8,509,371 B2 | 8/2013 | Kenney | |
| 8,643,409 B2 * | 2/2014 | Lu | H03L 7/0995 327/119 |
| 8,729,941 B2 | 5/2014 | Willey | |
| 8,836,394 B2 | 9/2014 | Zerbe et al. | |
| 9,154,145 B2 * | 10/2015 | Zerbe | H03K 3/0322 |
| 9,225,507 B1 * | 12/2015 | Lye | H04L 7/0331 |
| 9,306,585 B1 * | 4/2016 | Elkholy | H03L 7/0814 |
| 9,344,074 B2 * | 5/2016 | Zerbe | H03L 7/06 |
| 9,432,178 B2 * | 8/2016 | Liu | H04L 7/0276 |
| 9,735,791 B2 * | 8/2017 | Zerbe | H03L 7/06 |
| 9,735,792 B2 * | 8/2017 | Zerbe | H03K 3/0315 |
| 9,882,570 B1 | 1/2018 | Forey et al. | |
| 9,979,382 B1 | 5/2018 | Chao et al. | |
| 10,205,458 B2 * | 2/2019 | Zerbe | H03L 7/06 |
| 2007/0146011 A1 | 6/2007 | O'Mahony et al. | |
| 2008/0069278 A1 | 3/2008 | Baumgartner et al. | |
| 2010/0271092 A1 | 10/2010 | Zerbe et al. | |
| 2011/0235764 A1 | 9/2011 | Ware et al. | |

OTHER PUBLICATIONS

Chalvatzis et al., "Low-Voltage Topologies for 40-Gb/s Circuits in Nanoscale CMOS," IEEE Journal of Solid-State Circuits, vol. 42, No. 7, Jul. 2007, pp. 1564-1573. 10 pages.

Leibowitz, Brian, et al., "A 4.3 GB/s Mobile Memory Interface with Power-Efficient Bandwidth Scaling", IEEE Journal of Solid-state Circuits, Apr. 2010, pp. 889-898, vol. 45, No. 4. 10 pages.

O'Mahony, Frank et al., "A 47X10 Gb/s 1.4mW/Gb/s Parallel Interface in 45nm CMOS", IEEE Journal of Solid-State Circuits, Dec. 2010, pp. 2828-2837, vol. 45, No. 12. 10 pages.

Poulton, John, et al, "A 14-mW 6.25-Gb/s Transceiver in 90-nm CMOS", IEEE Journal of Solid-State Circuits. Dec. 2007, pp. 2745-2757, vol. 42, No. 12. 13 pages.

Zerbe et al., "A 5Gb/s Link with Clock Edge Matching and Embedded Common Mode Clock for Low Power Interfaces," reprinted from IEEE 2010 Symposium on VLSI Circuits. 3 pages.

Zerbe, Jared et al., "A 5 Gb/s Link With Matched Source Synchronous and Common-Mode Clocking Techniques", IEEE Journal of Solid-State Circuits, Apr. 2011, pp. 974-985,vol. 46, No. 4. 12 pages.

* cited by examiner

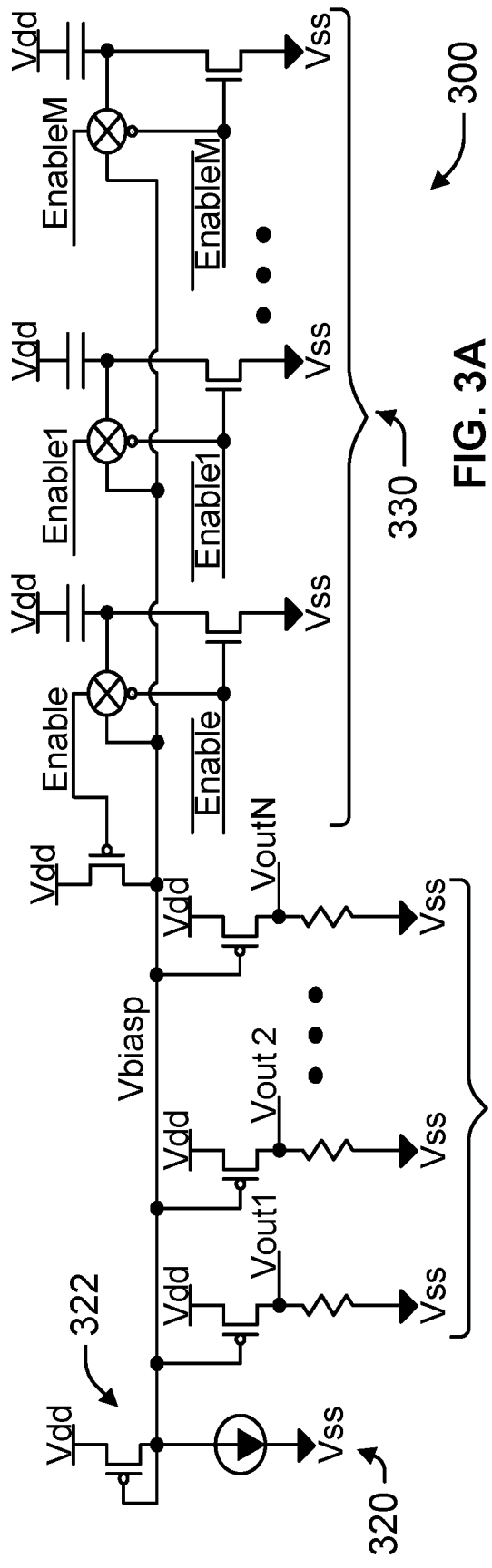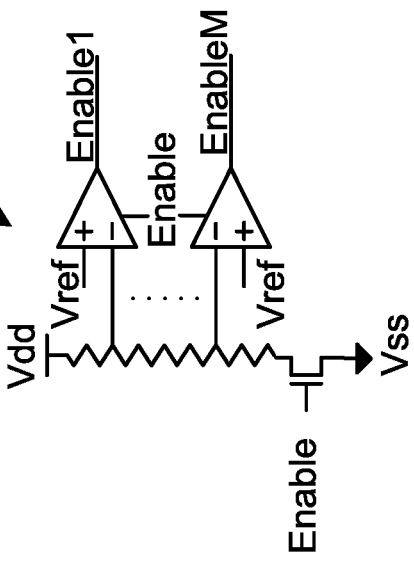
FIG. 3A
FIG. 3B

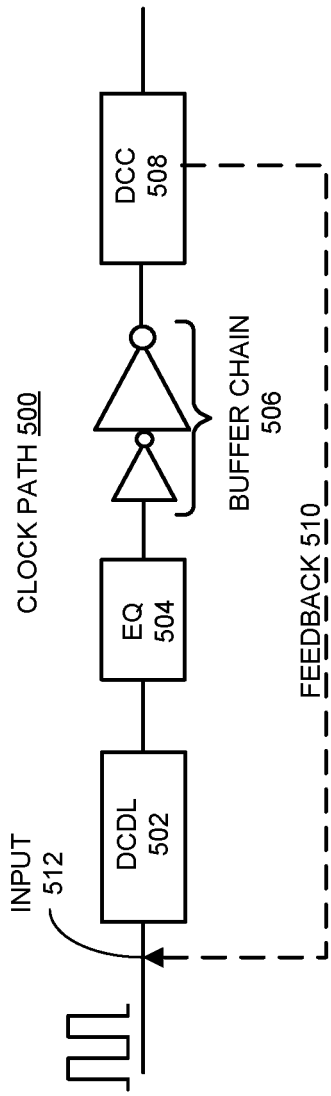
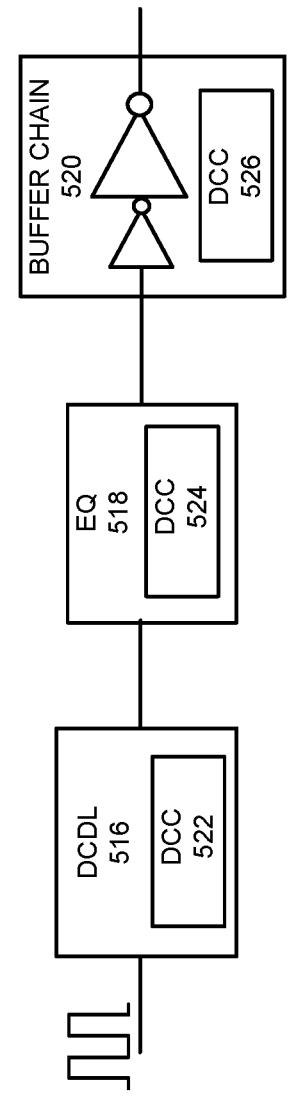
FIG. 5A
FIG. 5B

METHOD AND APPARATUS FOR SOURCE-SYNCHRONOUS SIGNALING

RELATED APPLICATIONS

This application is a continuation of U.S. application Ser. No. 15/667,184, filed Aug. 2, 2017, which is a continuation of U.S. application Ser. No. 14/456,716, filed Aug. 11, 2014, now U.S. Pat. No. 9,748,960, which is a continuation of U.S. application Ser. No. 13/523,631, filed 14 Jun. 2012 entitled "Method and Apparatus for Source-Synchronous Signaling" now U.S. Pat. No. 8,836,394, which are all hereby incorporated herein by reference for all purposes. This application claims priority to U.S. Provisional Application No. 61/615,691, entitled "Method and Apparatus for Source-Synchronous Signaling", by inventors Jared L. Zerbe, Brian S. Leibowitz, Hsuan-Jung Su, John Cronan Eble, Barry William Daly, Lei Luo, Teva J. Stone, John Wilson, Jihong Ren and Wayne D. Dettloff filed 26 Mar. 2012, the contents of which is hereby incorporated herein by reference for all purposes.

TECHNICAL FIELD

The present embodiments generally relate to circuits and techniques for communicating between integrated circuit devices.

BACKGROUND

Achieving effective power reduction in mobile system link architectures is a challenging task. Efficient low-power interfaces use circuits which may require turn-on or clock phase lock acquisition times. Unfortunately, the power consumption and latency resulting from such times may be inconsistent with the dynamic power and latency requirements of low-power systems. Moreover, architecting various power-modes to achieve bandwidth agility and lower total power involves additional delay to change between the power modes.

BRIEF DESCRIPTION OF THE FIGURES

FIG. 3A is a circuit diagram of a bias circuit having a selectable array of capacitors.

FIG. 3B is a circuit diagram of a control circuit for selecting the capacitors to be coupled to the bias node Vbiasp upon power-up of the bias circuit of FIG. 3A.

FIG. 5A presents a block diagram of a clock path which uses an end-point duty-cycle correction mechanism.

FIG. 5B presents a block diagram of a clock path which directly incorporates a distributed duty-cycle correction mechanism into one or more clock path circuits.

DETAILED DESCRIPTION

Overview

Figure 1:
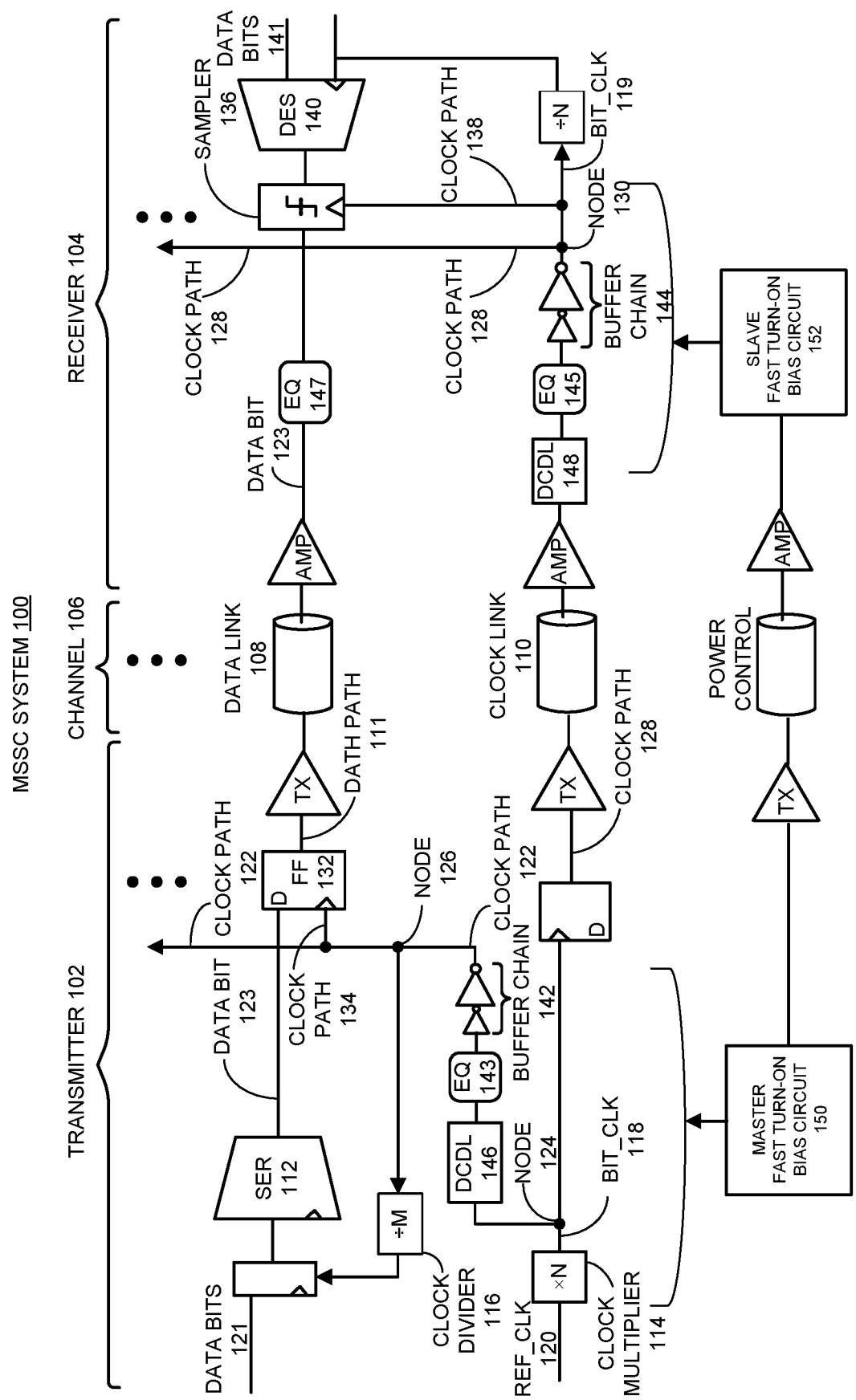
FIG. 1 presents a block diagram of a matched source-synchronous clocking (MSSC) system.

The following description presents various exemplary embodiments of a low power, high performance source synchronous chip interface which provides rapid turn-on to facilitate high signaling rates between a transmitter and a receiver located on different chips. In the embodiments presented herein, the chip interface (and associated methods of operation) employ various circuit blocks and techniques which together rapidly achieve a transition from a zero power state to a state in which full data rate transmission occurs, (for example, in about 8 nanoseconds or less). Moreover, in one embodiment, by removing one or more intermediate states between the zero power state and the full data rate state, a significant amount of power saving can be achieved.

However, rapid power switching within a device can cause significant power supply transients when the device goes through a turn-on/turn-off cycle. Some embodiments provide a "fast turn-on" bias circuit to reduce power supply ringing during the rapid power-on process. For example, the fast turn-on bias circuit can segment the bias into a multi-stage bias network configured to stagger the turn-on process into multiple steps to reduce the power supply ringing.

To further reduce the effect of power supply ringing during rapid power switching, some embodiments use current mode logic (CML) clock buffers in the clock distribution network of the chip interface. These CML clock buffers typically have high immunity to power supply noise and hence provide better power supply noise rejection when they are incorporated into a chip interface using the rapid power switching. In some embodiments, a digitally controlled delay line (DCDL) (which can be inserted in the clock path in series with a clock buffer) can also be implemented with CML circuits. Consequently, some embodiments provide a chip interface that uses rapid power switching implemented in the fast turn-on bias circuit, and combines CML clock buffers and CIVIL DCDLs to achieve both low overall power consumption and a high degree of power supply noise rejection.

In addition to facilitating low power operation, some embodiments achieve high operation speed in the chip interface by employing injection-locked oscillator (ILO)-based clock generation circuits. In some embodiments, ILO clock generation circuits multiply the frequency of reference clocks with a fast turn-on cycle. However, because the oscillator employed in such an ILO is periodically perturbed by the injected reference clock signal, the clock signal can suffer from relatively high deterministic jitter. To mitigate this problem, some embodiments employ matched source-synchronous clocking (MSSC) in combination with the ILO clock generator. In such systems, a DCDL can be inserted in a transmitter-side clock path to the data bits and another DCDL can optionally be inserted in a receiver-side clock path. Using these two delay elements facilitates performing arbitrary phase alignment between the clock and the corresponding data at the receiver. Further, the transmit side data-bit DCDL can be used to deskew the receive-side clock buffer. In this way, the clock edges can be ideally matched and the system can be made more tolerant to high frequency jitter in the ILO-generated source clock. In some embodiments, both the transmitter-side and receiver-side DCDLs are implemented using CML. In some embodiments, by design, the delay of the receive-side clock buffer ensures that all relative phases can be achieved by use of transmit-side DCDLs alone and no receive DCDL is required.

In some embodiments, instead of using a single DCDL in the transmitter-side or the receiver-side clock path in the MSSC system, a "master" DCDL is used in the main clock path to control delays in multiple data paths to compensate for skews that are common across all data paths, while multiple "micro" DCDLs can be added on a per-data pin basis to compensate for any "pin-to-pin" skews which are not covered by the master DCDL while the sum of both delays from both the master DCDL and a given micro DCDL still facilitate deskew of the receive-side clock buffer. In some embodiments, power consumption can be minimized by using fewer micro DCDLs and more main DCDLs by keeping the delays in common between multiple data bits. To further improve the immunity of the DCDLs to power supply induced jitter (PSIJ), some embodiments use DCDLs implemented using CIVIL circuits.

Some embodiments that employ CML circuits in a clock distribution circuit can reduce DC power consumption by turning down the voltage swing, but in doing so can cause large duty-cycle errors in the clock distribution circuit. To remedy this problem, some systems attempt to correct a cumulative duty-cycle error at an end point of a clock path in the clock distribution circuit. However this duty-cycle correction technique can introduce large jitter in the clock path from the accumulated duty-cycle error before the correction point. In some embodiments, distributed duty-cycle corrections can be employed at multiple locations along the clock path, so that the accumulated duty-cycle error can be corrected in smaller increments at these multiple locations.

In one embodiment, a chip interface employs a multiplying ILO (MILO) to multiply up and generate faster clock signals from a reference clock signal to facilitate converting parallel input data signals into a higher speed serial data signal. Some embodiments provide techniques for periodically re-evaluating whether it is safe to retime transmit data signals directly with the faster clock signal.

Embodiments presented herein make reference to a chip interface where source-synchronous signaling involves transmitting a timing reference, in the form of a strobe signal or clock signal, in a path along with data such that the timing reference can then be used at the data receiver for capturing the data. In particular embodiments, a data signal (which could comprise parallel data signals) and a first timing reference are transmitted such that the data signal and the first timing reference have a known phase-relationship with respect to each other. In some embodiments, clock edge transitions which are used to generate the beginning and ending of a particular unit bit time at the transmitter are subsequently used to recover the same bit at the receiver by use of an integrator. In some embodiments, this is achieved by using two delay elements, with one placed on the transmitter-side and the other on the receiver-side. In some embodiments either the edge used to start the bit or to end the bit at the transmitter are used to sample the bit at the receiver.

In the discussion below, timing references are described in the context of "clock signals" or "clocks." However, it should be understood that other forms of timing references, such as a strobe signal may be substituted for the clock signal, as applicable. Furthermore, the term "retiming" as used throughout the disclosure refers to the process of synchronizing a data signal with a clock signal so that the data signal and the clock signal have a known phase-relationship with respect to each other. When retiming across a mesochronous domain, retiming can also include the concept of moving data into the new clock domain with consistent latency. The term "CML" as used throughout the disclosure, sometimes referred to as "source-coupled logic," is a differential current-mode-logic signaling scheme that employs low voltage swings and differential noise immunity to achieve high signaling speeds. A CML buffer typically has high immunity to power supply noise and hence provides better power supply noise rejection when it is incorporated into a chip interface including rapid power switching.

Matched Source-Synchronous Clocking (MSSC)

FIG. 1 presents a block diagram of a MSSC system 100. MSSC system 100 includes a transmitter 102 that resides on a first integrated circuit device (e.g., a controller device), a receiver 104 that resides on a second integrated circuit device (e.g., a memory device), and a channel 106 between transmitter 102 and receiver 104. Channel 106, in this embodiment, includes a data link 108 and clock link 110. The transmitter 102 includes a serializer (SER) 112 configured to convert parallel data bits 121 to a serial data bit 123, and transmitter 102 also includes a clock multiplier (×N) 114 that is configured to generate a faster clock bit_clk 118, which has N times the frequency of a reference clock ref_clk 120. The transmitter 102 further includes a clock divider (÷M) 116, which is configured to take bit_clk 118 as an input signal and generate one or more slower clocks than bit_clk 118. In one embodiment, the one or more slower clocks include a clock having the same frequency as ref_clk 120. In an embodiment, the MSSC system 100 shown in FIG. 1 comprises a single clock link 110 and multiple data links (while only one data link 108 is explicitly shown). Also note that data path 111 between a serializer (e.g., serializer 112) on transmitter 102 and a deserializer, for example deserializer (DES) 140 that generates parallel data bits 141 on receiver 104, is a data path for one serial data bit, e.g., data bit 123. Although not explicitly shown, MSSC system 100 can include additional data paths which are substantially identical to data path 111 for transmitting parallel data signals from transmitter 102 to receiver 104.

Note that there are also multiple clock paths in MSSC system 100. A first clock path 122, which contains a segment between node 124 and node 126 on transmitter 102, provides a clock for retiming a serial data bit (e.g., data bit 123) on transmitter 102 before transmitting the data bit over channel 106. A second clock path 128, which contains a segment between transmitter node 124 and receiver node 130, provides the source-synchronous clock for retiming a received serial data bit on receiver 104 of MSSC system 100. Note that both clock paths 122 and 128 carry buffered and delayed versions of bit_clk 118 (note that bit_clk 118 is rename as bit_clk 119 on receiver 104 for clarification purposes), which was multiplied from ref_clk 120. Moreover, both clock paths 122 and 128 extend upward over the multiple parallel data paths. Hence, each of these clock paths is part of a global clock distribution network which distributes a master clock (bit_clk 118) to multiple data paths in MSSC system 100. At a local level, each of clock paths 122 and 128 is coupled to each data path through a local clock path. For example, clock path 122 is coupled to a flip-flop 132 associated with data bit 123 through a local clock path 134, while clock path 128 is coupled to a data sampler 136 associated with data bit 123 through a local clock path 138.

As is illustrated in FIG. 1, a clock buffer chain (or "buffer chain") 142 is inserted in clock path 122 on the transmitter side of MSSC system 100, while a clock buffer chain 144 is inserted in clock path 128 on the receiver side. Each of the buffer chains comprises a number of clock buffers coupled in series, wherein the clock buffers are smaller in size at the input side and increase in size toward the output side. This configuration is useful for generating a clock signal which can drive a large load. In some embodiments, clock buffers in each buffer chain are low-power CMOS clock buffers. In some embodiments, the clock buffers in each buffer chain are CML clock buffers that operate at low signal voltages relative to CMOS clock buffers. Other embodiments may use regulated CMOS buffers or other techniques used to buffer signals that are well known to those skilled in the art.

MSSC system 100 additionally includes a clock signal equalizer (EQ) 143 which is inserted in clock path 122 in series with buffer chain 142, and a clock signal equalizer (EQ) 145 in clock path 128 in series with buffer chain 144. These clock signal equalizers are used to equalize clock signals (e.g., bit_clk 118) distributed within MSSC system 100 to reduce increased jitter during idle to active state transitions caused by inter-symbol interference (ISI) that distorts initial clock edges, and therefore to reduce or eliminate the wait time otherwise required to settle on a stable clock signal. Additionally, the equalizers minimize any jitter amplification that may occur due to transmission of a clock in a band-limited channel. By reducing jitter in the clock signals, MSSC system 100 can transition more quickly between idle and active states. MSSC system 100 also includes an equalizer (EQ) 147 inserted in the receiver-side of data path 111 that can be used to match the delay and response of received data bit 123 with equalized clock signal bit_clk 118. In some embodiments, some of the equalizers in MSSC system 100 are continuous-time linear equalizers (CTLEs). A CTLE is an equalizer that is continuous in time, e.g. it does not use any clocking for signal decimation and operates over a range of frequencies.

Fast Turn-on Bias Circuit for Rapid Interface Turn-on/Off

One way to achieve low power operation in MSSC system 100 is to rapidly turn off the power to MSSC system 100 when the system is inactive (e.g., no data is being transmitted), and also to rapidly turn on the power when the system becomes active again. Note that such a fast turn-on/off system is often associated with high power supply induced jitter (PSIJ) because a rapid surge in current when the system is turned on (or off) leads to significant power supply transients which then cause jitter through the clock and data paths. In one embodiment, to reduce PSIJ during the rapid power switching, a "fast turn-on" bias circuit comprising one or more charge-sharing bias circuits configured with a staggered on/off mechanism may be used to provide bias voltages to various system components. For example, a "master" fast turn-on bias circuit 150 in MSSC system 100 provides bias voltages to transmitter-side circuits while a "slave" fast turn-on bias circuit 152 provides bias voltages to receiver-side circuits. Exemplary embodiments of the fast turn-on bias circuit with staggered on/off are described below in conjunction with FIGS. 2A, 2B, 3A, and 3B.

However, other embodiments of the fast turn-on bias circuit with staggered on/off can also be employed.

Generally, during power-up of a circuit, greater power is consumed to obtain a non-rail analog bias voltage in less time. For example, a circuit may be configured to obtain the desired non-rail voltage ("operating point") in minimal time by increasing the current in an op-amp based feedback loop, but such a loop may also consume excessive power during normal operation and cause excessive supply collapse by requiring a large current surge during the power-up. Further, in order to keep noise immunity, bypass capacitance may be placed from a bias line to a supply rail, further slowing down the activation of the bias line. Thus, to conserve operating power and maintain integrity of the supply, typical circuits generating non-rail bias voltages exhibit a relatively slow power-on process.

Further, typical integrated circuits exhibit substantial capacitance at the supply node. Due to the inductance of the supply line and on-chip capacitance to reduce noise between the supply rails, any change in current to the bias circuit will induce a ringing in the supply voltage. The "severity" of the ringing will be dependent upon the magnitude of the current change, the speed of the surge, the value of the inductance and effective capacitance, and other factors.

In view of the characteristics of bias circuits and, more generally, circuitry for maintaining a non-rail voltage, example embodiments described below provide optimized non-rail voltages while improving the start-up speed and without inducing a large supply current surge.

Figure 2A:
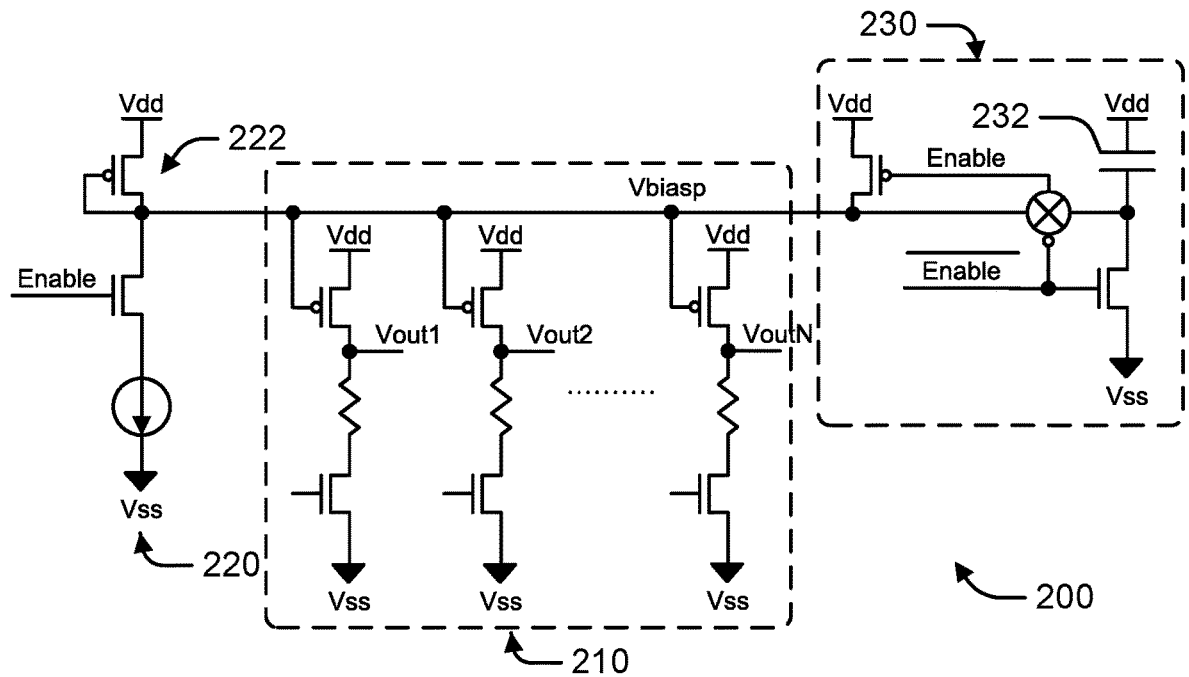
FIG. 2A is a circuit diagram of an embodiment of a bias circuit that enables fast turn on of chip interface circuits.

FIG. 2A is a circuit diagram of an embodiment of a bias circuit 200 that enables fast turn on of the applicable chip interface circuits described herein. The bias circuit 200 includes a current source 220 that is selectively enabled by the "Enable" signal to generate, along with a diode connected PMOS device 222, a voltage at the bias voltage node Vbiasp. A plurality of outputs 210, enabled by the bias voltage node Vbiasp, mirror a current at the current source 220. The output nodes Vout1, Vout2 and VoutN may be coupled to one or more nodes of a circuit (not shown) associated with the bias circuit 200. A control circuit 230 selectively couples a capacitor 232 to the network.

Under normal operating conditions (Enable="1"), the bias node Vbiasp is at a voltage between the supply rails Vdd, Vss. During power down (Enable="0"), Vbiasp is pulled to Vdd, which in turn disables the outputs 210 (Vout1, Vout2, VoutN). The current source 220 may also be turned off to complete a power down of the circuit. The "power on" time, being the time required for the node Vbiasp to transition from Vdd to the given operating voltage, is dependent upon the total capacitance at the node and the value of the current source 220 as well as the characteristics of the diode connected PMOS device 222. The "power on" time can be decreased by increasing operating power or the current at the current source 220 when the bias circuit 200 is initially powered on.

The control circuit 230 selectively couples the capacitor 232 to the network according to the "Enable" signal. In this manner, the capacitor 232 has zero volts on the lower terminal during power down, and, during power-up, is coupled to the bias node Vbiasp. Thus, upon startup, the charge on Vbiasp moves onto the capacitor 232, thus bringing the voltage at the bias node Vbiasp toward the operating point voltage. As a result of this charge-sharing, the operating voltage can be obtained quickly, with minimal impact upon normal operation, while simultaneously reducing a surge of supply current to the bias circuit 200.

In order to configure the control circuit 230 and capacitor 232 to achieve the operating voltage, the value of operating voltage for the bias node Vbiasp is first obtained. The total capacitance C for the node, including any residual capacitance exhibited by the circuit components, is obtained by measurement or estimation. The total capacitance C may then be divided into two domains in the power-down state: a first portion of C may be pulled to Vdd during power-down, while a second portion is pulled to Vss during power down. The domains are separated in the power-down state by the control circuit 230, which isolates them via a passgate structure. The domains may be configured to be proportional to the desired operating voltage, such that, when the domains are combined upon startup of the circuit 200 (the control circuit 230 enables the path at Vbiasp), a voltage approximating or matching the operating voltage appears at the bias node Vbiasp.

A "charge share" may be effected between the capacitor 232 and the capacitance at the bias node Vbiasp opposite the control circuit 230. Given two identical capacitors, if the first capacitor is charged to 1.2V, the second is completely discharged (to 0V), and the two are shorted together via a switch, the resultant voltage will be 0.6V, or halfway between the two capacitors' initial voltages. The charge on the first capacitor is "shared" to the second and since they are identical, the initial charge gets split equally. If the first capacitor is twice as large as the second, then the resultant voltage will be ⅔ of the initial voltage or 0.8V. Similarly, if the second is three times as large as the first, the final voltage will be ¼ of the 1.2V or 0.3V. By adjusting the ratio of capacitance, one can obtain a desired non-rail voltage.

Thus, with respect to the capacitor 232, the capacitance value of the capacitor 232 may be selected based on the proportional capacitance to be achieved as described above. In particular, the capacitor 232 may be configured as a portion of the total capacitance C that is pulled to Vdd during power down. When the Enable signal is asserted to initiate power-up of the bias circuit 200, the two domains combine ("charge share") to produce the desired operating voltage at Vbiasp.

During power-down, all nodes are pulled to supplies and hence only consume current from device leakage, which may be quite low, and is approximately the same as the leakage of the same capacitance used as bias bypass capacitance. Other supply voltages, if available, may also be employed to optimize start-up time, current surge reduction, silicon area or other design considerations. The additional circuitry can be implemented in parallel to the existing bias circuitry. It may be beneficial to add additional capacitance to the bias node Vbiasp to achieve the target proportion of capacitance at the two domains. For example, a circuit implementation may present obstacles to dividing a node between the two domains during power-down, necessitating the additional capacitance.

Further, the bias node Vbiasp may benefit from additional capacitance to increase noise immunity. By referencing both domains of the total capacitance C to either supply (Vdd, Vss), operational noise within the circuit 200 may be minimized. However, the circuit 200 may be configured to "charge share" at power-up as described above, and then disconnect some or all of the capacitance (e.g., capacitor 232) after a specified time or when the desired operating voltage is obtained.

For those cases where the desired operating point is a substantial portion of the supply, a single capacitor as shown may be sufficient to obtain (or approximate) the operating point within an acceptable time. When the operating point requires greater accuracy, or is dependent on characteristics of the circuit a number of alternative configurations to the bias circuit may be implemented. For example, an initial sharing may be conducted as described above, to an approximate voltage, followed by a period of normal active feedback control circuit operation to pull in the exact value. In this period the active circuitry consisting of the diode-configured PMOS device 222 and the current source 220 pull the bias node Vbiasp to the precise final value. Alternatively, an auto-adjust circuit may be employed to switch in more or less capacitance to compensate, in real time, for a change from the initial conditions. For example, just before a power-up sequence, the amount of capacitance may be adjusted in response to observation of the supply voltage, temperature, or some other circuit or environmental condition as well as the desired bias voltage. Further, a circuit may be implemented to perform a calibration that effectively measures change at the bias node and then adjusts the capacitance for the next power-up sequence. Example embodiments employing such configurations are described below with reference to FIGS. 3A and 3B.

Because the operating voltage and/or the capacitance of a bias node (e.g., bias node Vbiasp) may be dependent on manufacturing variations, or variations due to operating voltage or temperature, it may not be possible, during initial design of a bias circuit, to configure the capacitances of each domain to effect a "charge share" to obtain an exact voltage at power-on of the bias circuit. In such a case, a capacitance ratio can be selected to minimize startup time across corners. Alternatively, an additional bias circuit (not shown) omitting a control circuit may be employed in conjunction with the bias circuit 200, where the bias circuit 200 obtains an approximate of the operating point and the additional bias circuit transitions to the operating point with greater accuracy. In still further embodiments, a bias circuit may employ a programmable capacitance ratio, which may be adjusted automatically based on a comparison with a replica circuit, or may be adjusted periodically under settings maintained at a register. Examples of such embodiments are described below with reference to FIGS. 3A and 3B. Adjustable bias circuits may be configured to compensate for changes in capacitance or other circuit characteristics resulting from the fabrication process, supply voltage or temperature of the bias circuit.

Figure 2B:
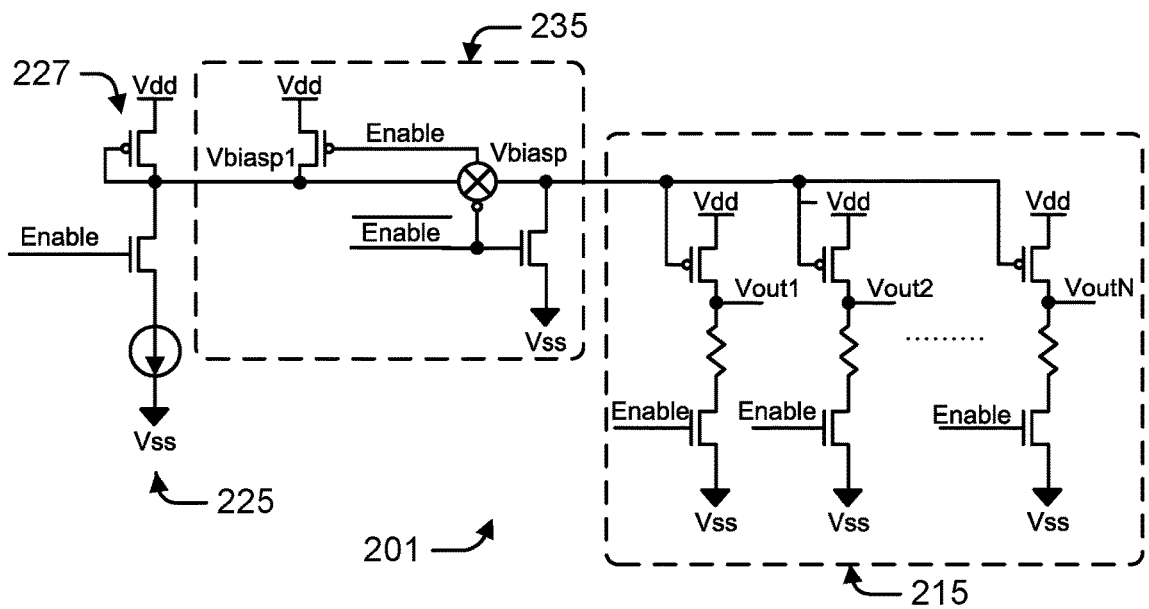
FIG. 2B is a circuit diagram of a bias circuit which is an alternative configuration of the bias circuit in FIG. 2A.

FIG. 2B is a circuit diagram of a bias circuit 201 comparable to the circuit 200 described above, in an alternative configuration. The circuit 201 includes a current source 225 that is selectively enabled by the "Enable" signal to generate, along with a diode connected PMOS device 227, a voltage at the bias voltage node Vbiasp. A plurality of outputs 215, enabled by the bias voltage node Vbiasp, generate output voltages at nodes Vout1, Vout2 and VoutN. The output voltages may be coupled to one or more nodes of a circuit (not shown) associated with the bias circuit 201. A control circuit 235, responsive to the "Enable" signal, selectively couples the two nodes Vbiasp1 and Vbiasp.

The bias circuit 201 may be configured to operate in a manner comparable to the bias circuit 200 described above with reference to FIG. 2A, with the exception that a discrete capacitor is omitted. Rather, the control circuit 235 selectively combines the capacitances inherent at each node Vbiasp1, Vbiasp during power-on of the circuit 201 to obtain the operating point at the bias node Vbiasp. To accomplish this, the control circuit 235 may be positioned within the circuit 201 so as to divide the bias node Vbiasp into the two nodes Vbiasp1, Vbiasp when the control circuit 235 is disabled. The position of the control circuit 235 may be selected so as to achieve a proportional capacitance between the nodes Vbiasp1, Vbiasp as a function of the desired operating point voltage.

When the bias circuit 201 enters a power-down mode, the control circuit 235 pulls the node Vbiasp1 to Vdd, and pulls the node Vbiasp to Vss. As a result, the PMOS transistors associated with outputs 215 are ON. To prevent any current in this mode, the NMOS transistors associated with outputs 215 are turn off by connection their gates to the "Enable" signal. Upon power-up of the circuit 201, the control circuit 235 combines the nodes Vbiasp1, Vbiasp to form the desired voltage at Vbiasp, and a "charge share" is effected between the capacitances of the nodes Vbiasp1, Vbiasp. As a result of these capacitances being proportional as described above, the bias node Vbiasp is brought to the operating point quickly following power-up of the bias circuit 201.

FIG. 3A is a circuit diagram of a bias circuit 300 having a selectable array of capacitors. The circuit 300 includes a current source 320 that is selectively enabled by the "Enable" signal to generate, along with the diode connected PMOS device 322, a voltage at the bias voltage node Vbiasp. A plurality of outputs 310, enabled by the bias voltage node Vbiasp, generate output voltages at nodes Vout1, Vout2 and VoutN. The output voltages may be coupled to one or more nodes of a circuit (not shown) associated with the bias circuit 300. A control circuit 330, responsive to the "Enable" signal, selectively couples an array of capacitors to bias node Vbiasp.

The bias circuit 300 may be configured to operate in a manner comparable to the bias circuit 200 described above with reference to FIG. 2A, with the exception that the control circuit 330 selectively enables a plurality of capacitors to be coupled to the bias node Vbiasp. In one embodiment, the control circuit 330 may be configured to couple all capacitors to the array during power-on of the bias circuit 300. The values of the capacitors may be selected, in a manner as described above with reference to FIG. 2A, to achieve a proportional charge-sharing upon power-on of the bias circuit 300 to obtain a voltage at the bias node Vbiasp that is at or near the desired operating point. In alternative embodiments, during the inactive state, a first portion of the capacitors may be pulled to one rail (e.g., Vdd), while a second portion of the capacitors may be pulled to another rail (e.g., Vss). Under this approach, the first and second portions of capacitors (in addition to other capacitances inherent at the bias node Vbiasp) may be configured proportionately so as to obtain the desired operating point upon power-up.

In further embodiments, the control circuit 330 may enable only a selection of the capacitors to be coupled to the bias node Vbiasp during power-up. The particular selection of capacitors may be changed over time in response to one or more characteristics of the bias circuit 300, a power supply or temperature variation, or associated circuitry. An example control circuit is described below with reference to FIG. 3B.

FIG. 3B is a circuit diagram of a control circuit 301 for selecting the capacitors to be coupled to the bias node Vbiasp upon power-up of the bias circuit 300 of FIG. 3A. This control circuit 301 may compensate for variations in the supply voltage Vdd. As Vdd decreases, more capacitance may be needed to bring Vbiasp to the appropriate value upon power-up of the bias circuit 300. Accordingly, the control circuit 301 compares multiple inputs (relative to Vdd) against a reference voltage Vref. Based on this comparison, and in response to the "Enable" signal, the control circuit 301 outputs a plurality of enable signals "Enable1" . . .

"EnableM" to enable a selection of the capacitors to be coupled to the bias node Vbiasp upon power-up of the bias circuit 300. In alternative embodiments, the control circuit 301 may be configured to output the enable signals based on other circuit characteristics, thereby compensating for factors such as temperature variations or differences in the implementation of the circuit 300 (i.e., process variations).

Fast Turn-on Bias Circuit with Current Mode Logic (CML) Clock Buffers

To further reduce the effect of power supply ringing during the rapid turn-on/off process in an MSSC system, some embodiments use clock buffers implemented with current mode logic (CML). CML as used herein, sometimes referred to as "source-coupled logic," refers to a differential signaling scheme that employs low voltage swings to achieve relatively high signaling speeds and linear amplification. In one embodiment, both clock buffers in buffer chains 142 and 144 are implemented using CML. These CML clock buffers typically have high immunity to power supply noise and hence provide better PSIJ rejection than CMOS clock buffers.

Note that CML clock buffers can also consume more DC power than CMOS clock buffers. However, this problem can be alleviated when CML buffer chains 142 and 144 are used in combination with the above-described fast turn-on bias circuit with staggered on/off mechanism. More specifically, when this combination is used during the rapid turn-on/off process, CML buffer chains 142 and 144 can be rapidly switched between a power-on state that consumes power and a non-functional power-off state that consumes zero or substantially less power. Hence, when MSSC system 100 is idle, the power consumed by these CML clock buffers can be completely turned off, so essentially no DC power is consumed by the CML clock buffers during the idle period. On the other hand, when MSSC system 100 becomes active again, the system (including CML buffer chains 142 and 144) can be turned on quickly with very low PSIJ.

Note that integrating the fast turn-on bias circuit and the CML clock buffers into the fast turn-on/off system facilitates achieving both low overall power consumption and high PSIJ rejection in a given clock path. Although the combined circuit of a fast turn-on bias circuit and CML clock buffers is described in the context of MSSC system 100, this combined circuit can generally be used in any type of clock distribution circuit which can experience times of inactivity.

MSSC System Employing a MILO

In some embodiments, to achieve high operating speeds in MSSC system 100, clock multiplier 114 is implemented using a multiplying injection-locked oscillator (MILO)-based clock generation circuit. However, because bit_clk 118, which is generated by such an MILO, is subject to periodic injection from ref_clk 120 that is not the same for every output cycle, bit_clk 118 can suffer from relatively high deterministic jitter. To mitigate this problem, MSSC system 100 includes a digitally controlled delay line (DCDL) 146 in clock path 122 in transmitter 102, and in some embodiments also includes a DCDL 148 in clock path 128 in receiver 104. Moreover, DCDL 146 is coupled in series with buffer chain 142 and equalizer 143, while DCDL 148 is coupled in series with buffer chain 144 and equalizer 145. In some embodiments, DCDLs 146 and 148 can be used to minimize or eliminate the skews between the data bits in the respective data paths (such as data path 111) and the master clock in the respective clock paths 122 and 128. In some embodiments there is no need for the receiver-side DCDL 148. In these embodiments, the delay of clock buffer chain 144, when properly designed, ensures that all deskewing can be achieved by using transmitter-side DCDL 146 alone.

In some embodiments, transmitter-side DCDL 146 and receiver-side DCDL 148 are collectively used to "color" the transmitter-side clock edges and the corresponding receiver-side clock edges. In other words, the individual clock edges which generate the beginning and ending of a particular data bit at the transmitter are transmitted in a source-synchronous fashion to the receiver and then the same two edges are used to recover the data bit at the receiver when using an integrating receiver, or one of the two edges is used when using a sampling receiver. As will be shown in more detail below, using these two delay elements facilitates performing arbitrary phase alignment between the clock and the corresponding data at the receiver. In this manner, the clock edges can be ideally matched to the data edges and the system made more tolerant to high frequency jitter in the MILO-generated source clock.

Figure 4A:
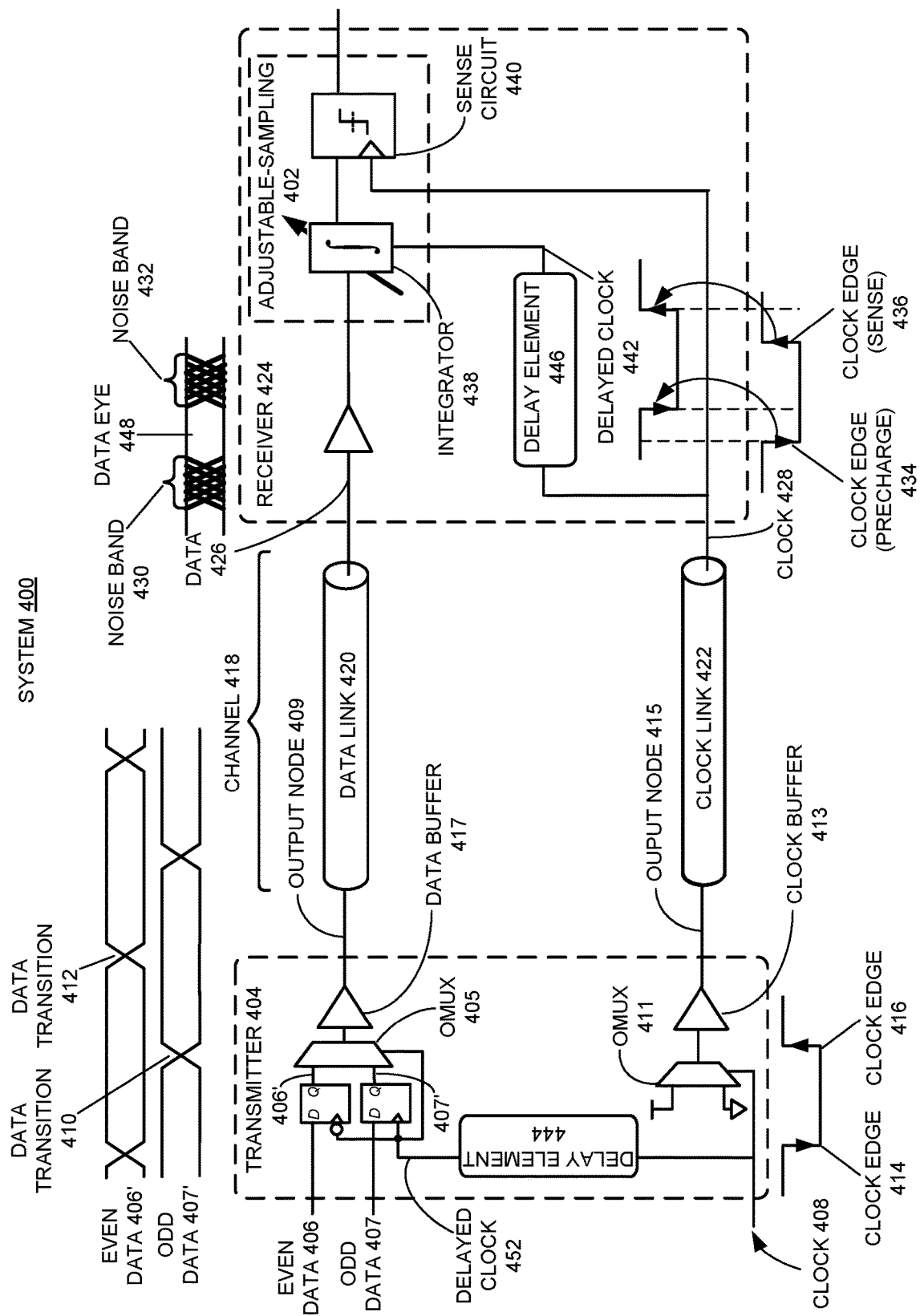
FIG. 4A presents a block diagram illustrating a system using both transmitter-side and receiver-side delay elements.
Figure 4B:
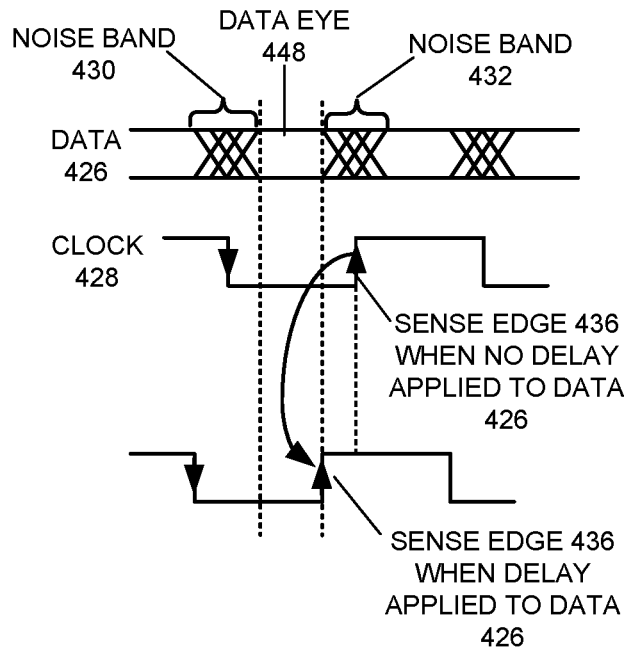
FIG. 4B illustrates how a noise band in the delayed data is adjusted relative to the sense edge.
Figure 4C:
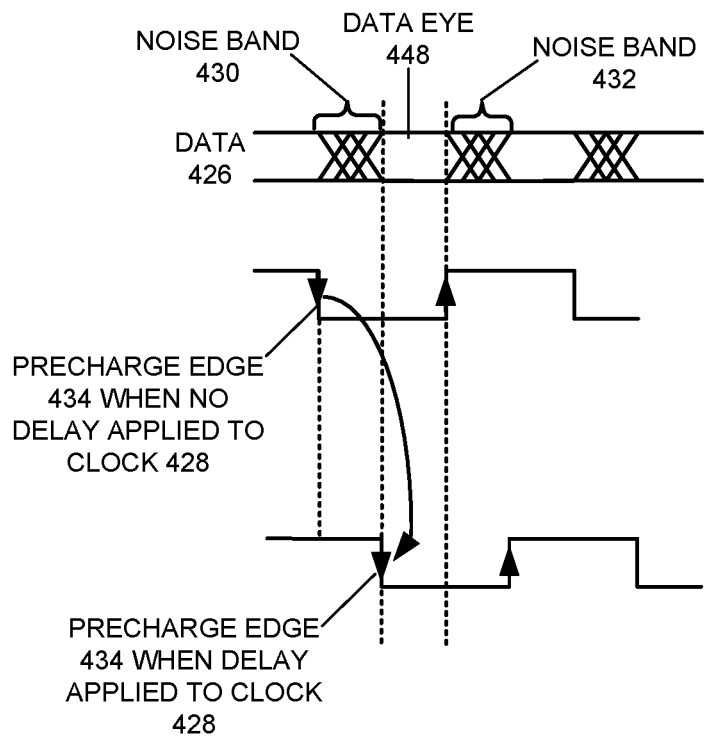
FIG. 4C illustrates how a precharge edge is adjusted relative to a noise band in the delayed data.

We now describe, in conjunction with FIGS. 4A-4C, high level operation of using the delay elements on both the transmitter and receiver sides to perform arbitrary phase alignment so that the same clock edges at the transmitter which are used to generate a data bit are also used to recover the data bit at the receiver.

FIG. 4A presents a block diagram illustrating a system 400 using both transmitter-side and receiver-side delay elements. Note that system 400 includes a transmitter 404 that receives even data stream 406, odd data stream 407 and clock 408. In this embodiment, a first data transition 410 in odd data stream 407' is followed by a second data transition 412 in even data stream 406', while clock 408 includes a clock window formed by a falling clock edge 414 followed by a rising clock edge 416. Note that although we describe the operation below in terms of a falling-edge-to-rising-edge clock window, the same description is equally applicable to the rising-edge-to-falling-edge clock window. In fact, while an interleaved double-data-rate ("DDR") system is shown, system 400 can include a single-data-rate ("SDR")-base system, a quad-data-rate ("QDR")-based system, an octal data rate ("ODR"), or systems based on other types of clocking modes.

Note that falling edge 414 and rising edge 416 are aligned to transition in approximately the center of odd and even data 406' and 407' after data transitions 410 and 412, respectively. In some embodiments, system 400 is a source-synchronous signaling system wherein data signal at output node 409 and clock signal at output node 415 are source-synchronized signals. In these embodiments, clock edges 414 and 416 are used to time the transmission of data resulting from transitions 410 and 412, respectively via appropriate switching of the output mux 405.

Transmitter 404 transmits even data stream 406 and odd data stream 407, which are interleaved together, as well as clock 408 over channel 418 through a data link 420 and a clock link 422, respectively. More specifically, even data stream 406 and odd data stream 407 pass through a pair of odd/even flip-flops and then through an output multiplexer (omux) 405, which combines the two data streams, before passing through a data buffer 417 to reach a first output node 409, where the combined data is transmitted onto data link 420. Separately, clock 408 passes through a 0/1-tied output multiplexer (omux) 411 and a clock buffer 413 to reach a second output node 415, where clock 408 is transmitted onto clock link 422. The combined data 406/407 and clock 408 are received at a receiver 424 as received data 426 and received clock 428, respectively. In some embodiments, however, the combined data 406/407 and clock 408 are transmitted over the same link between transmitter 404 and receiver 424. This can be accomplished by transmitting the data and clock signals over the same link in different modes. Note that the received data 426 includes a first noise band 430 corresponding to data resulting from transition 410 with timing from clock edge 414 which is followed by a second noise band 432 corresponding to data resulting from transition 412 with timing from clock edge 416. Moreover, received clock 428 includes a clock edge 434 associated with first noise band 430, followed by a clock edge 436 associated with second noise band 432.

Receiver 424 also includes the adjustable-sampling circuit 402, which comprises an integrator 438 coupled to a sense circuit 440. Integrator 438 receives data 426 as data input and a clock 442 that controls the start of the integration operation. The output of integrator 438 is coupled to the data input of sense circuit 440, which directly receives clock 428 to control the sense operation (which effectively ends the integration operation). In some embodiments, sense circuit 440 is an edge-triggered sense circuit.

Note that system 400 also includes a transmitter-side delay element 444 and a receiver-side delay element 446. Each of these delay elements can be implemented using a delay-line or other delay means (for example, the DCDL described above). In some embodiments the two different delay elements can use elements in-common, and in some cases, share some or all calibration codes in common. The two delay elements generate two relative timing delays which can be used to adjust the phase-relationships between received data 426 and received clock 428, so that adjustable-sampling circuit 402 operates with a window within the data eye 448 between noise bands 430 and 432. It should be noted that there are multiple ways of creating the delays needed on either the transmitter or the receiver side, and the techniques used need not be identical on both sides. In addition, some embodiments may use one or the other of delay elements 444 and 446 and not both and thereby experience some but not all of the benefits of a window tuned to eliminate both noise bands.

More specifically, transmitter-side delay element 444 delays the original clock 408 by a first delay time to generate a delayed clock 452. Delayed clock 452 is then used to clock even data stream 406 and odd data stream 407 through a pair of flip-flops, which delays the combined output data relative to the original transmitter clock 408 by the same delay time. Consequently, received clock 428 thus leads the received data 426 by the same amount because of delay element 444, assuming that data link 420 and clock link 422 have matching transport delays. In particular, the second clock edge 436 of the transmitted clock 428 is a sense edge which is coupled to the clock input of positive edge triggered sense circuit 440. Because of the first delay time, the second clock edge 436 triggers sensing of the received data 426 earlier than it would in a traditional source-synchronous system, thus facilitating the movement of it 'inside' the data eye 448 and before the noise band 432.

FIG. 4B illustrates how noise band 432 in the delayed data 426 is adjusted relative to sense edge 436. Note that without applying the delay to clock 408, sense edge 436 triggers the sense operation within the noise band 432. In FIG. 4A, second noise band 432 associated with data transition 412 is delayed relative to sense edge 436, which causes sense edge 436 to shift relative to the data earlier toward the center of the data eye 448 defined by the inner edges of the noise bands 430 and 432. The amount of delay is calibrated at the first delay element 444 so that sense edge 436 substantially aligns with the beginning (edge) of the second noise band 432 as shown in FIG. 4B. In some embodiments, this calibration accounts for delay mismatch between data link 420 and clock link 422. In some embodiments, the edge of noise band 432 can be defined based on where an acceptable bit-error-rate is achieved. In some embodiments, other techniques are used to define the edge of noise band 432. Consequently, the exactly location of the edge of noise band 432 may vary depending on the particular technique that is used.

Referring back to FIG. 4A, note that the receiver-side delay element 446 delays clock 428 by a second delay time to produce the delayed clock 442, which thus contains within it a delayed version of clock edge 434. In particular, the delayed version of clock edge 434 provides a precharge edge which determines the start of the integration operation on integrator 438.

FIG. 4C illustrates how the precharge edge (provided by the delayed version of clock edge 434) is adjusted relative to noise band 430 in delayed data 426. Note that without applying the delays to both clock 428 and data 426, the precharge edge is positioned relative to noise band 430 as shown in FIG. 4B. If a delay is applied to data 426 but no delay is applied to clock 428, in some embodiments the precharge edge is positioned relative to noise band 430 as shown in FIG. 4C which is to the left of noise band 430. Alternately with no delay applied to data 426 the precharge edge can be positioned in the center of noise band 430 similar to the sense case. In the embodiment illustrated in FIG. 4A, the precharge edge is delayed by delay element 446 so that it moves toward data eye 448, which is defined by the inner edges of the noise bands. The amount of delay is calibrated at second delay element 446 so that the precharge edge substantially aligns with the end of the first noise band 430 as shown in FIG. 4C. In some embodiments, the edge of noise band 430 can be defined based on where an acceptable bit-error-rate is achieved. In some embodiments, other techniques are used to define the edge of noise band 430. Consequently, the exactly location of the edge of noise band 430 may vary depending on the particular technique that is used.

Note that the two delays are introduced on integrated circuit devices positions at different sides of channel 418. More specifically, a sense-edge advance at receiver 424 is achieved by delaying the input data from the transmitter side, while the precharge-edge delay is achieved by delaying the received clock 428 at the receiver side. This facilitates maintaining the association between clock edges 414 and 416 and the data transitions triggered by these clock edges, thereby facilitating alignment of the precharge edge and sense edge with data eye 448. Further precision in the placement of the edges is allowed by use of two separate signals of the same (DDR) clock rate at the receiver. Note, in this example, that this delay and alignment technique does not require adding substantial delay to the clock as a method of deskewing clock and data by creating a skew whose phase would appear to be zero but is in fact 'rounded up' to become substantially an integer multiple of 1-unit-interval ("UI") as is commonly done. Maintaining matching (or 'coloring') between clock and data edges, in this example, better facilitates high-speed operation by facilitating keeping sources of jitter and distortion in-common between individual edges of clock and data.

In one embodiment, adjustable-sampling circuit 402 can include a control mechanism configured to disable/bypass the integrator 438 so that data 426 passes through integrator 438 to the sense circuit 440 without a substantial integration.

This configuration is useful during the process of calibrating the delay on delay element 444 for aligning the sense edge with the data eye. Adjustable-sampling circuit 402 is switched back to the regular integrating-sampling mode when this calibration is complete. Alternately the sense circuit may be use to directly sample data with the integrator bypassed if higher performance is achieved this way. In another embodiment, if system margins allow, the integrator may be removed entirely and a sampling receiver only may be used. In this embodiment, the matching of edges is not as ideal as it was with the integrator as the sampling receiver, with only a single edge, can align to only the starting or ending edge of the transmitted bit. However, if system margins allow for it the use of a sampling receiver alone without integration can simplify the MSSC system and circuit design.

Referring back to FIG. 1, in some embodiments, one or both DCDLs 146 and 148 in MSSC system 100 are implemented using CIVIL. As with the above-described CML clock buffers, these CML DCDLs provide high immunity to power supply noise and, hence, better PaI rejection than CMOS DCDLs. In these embodiments, the CML DCDLs can also receive bias voltage from a fast turn-on bias circuit configured with the staggered on/off to facilitate reducing PSIJ during rapid power on/off operations. Note that integrating the MILO-based clock generation (without phase detectors) and the CML DCDLs into MSSC system 100 facilitates both high-speed operation and high PSIJ rejection in a given clock path. Although a system comprising both MILO-based clock generation (without phase detectors) and CML DCDLs is described in the context of MSSC system 100, this combined circuit can generally be used in any type of source-synchronous system, not just the implementations of an MSSC system.

In some embodiments, MSSC system 100 simultaneously uses CIVIL buffer chains 142 and 144, CML DCDLs 146 and 148 in clock paths 122 and 128, and a fast turn-on bias circuit with staggered on/off (which is separated into master fast turn-on bias circuit 150 and slave fast turn-on bias circuit 152) to set the bias voltages for the CML clock buffers and CML DCDLs. More specifically, when this combination is used during the rapid turn-on/off process, CIVIL clock buffers and CML DCDLs can be rapidly switched between a power-on state, that consumes power, and a non-functional power-off state, that consumes zero or substantially less power. Hence, when MSSC system 100 is idle, the power consumed by these CML components can be completely turned off so that essentially no DC power is consumed by the CML clock buffers and CIVIL DCDLs during the idle period. Note that integrating the fast turn-on bias circuit and the CIVIL clock buffers and CML DCDLs into the fast turn-on/off system facilitates achieving both low power consumption and high PSIJ rejection in a given clock path.

Distribution of Duty-Cycle Correction in a Clock Path

Some embodiments which employ CML clock buffers and/or CML DCDLs in MSSC system 100 can reduce DC power consumption by turning down the voltage swing, but in doing so can cause large duty-cycle errors in the clock distribution circuits. Some systems attempt to correct a cumulative duty-cycle error at an end point of a clock path.

FIG. 5A presents a block diagram of a clock path 500 which uses an end-point duty-cycle correction mechanism. As illustrated in FIG. 5A, clock path 500 includes a DCDL 502, an equalizer (EQ) 504 and a buffer chain 506 coupled in series. The portion of clock path 500 which includes these circuits can represent clock path 122 in FIG. 1. Note that clock path 500 can also include additional clock path circuits. In some embodiments, DCDL 502, EQ 504 and buffer chain 506 are made of CML circuits. For low power operation in a CML-based clock path, it is desirable to reduce the rail-to-rail voltage supplied to the CIVIL-based circuits as well as the output swing voltage. This, however, can lead to increased duty-cycle errors in the clock distribution circuits. In one embodiment, to resolve this conflict, a duty-cycle corrector (DCC), such as DCC 508, is added at the end of the clock path to detect and correct duty-cycle errors. In the embodiment shown in FIG. 5A, the system attempts to correct a cumulative duty-cycle error through clock path 500 from DCDL 502, EQ 504 and buffer chain 506 all at once. However, this end-point correction technique can result in large jitter in the clock path before the correction block, with associated side effects due to pulse shortening and duty-cycle error amplification in cascaded stages.

Note that, while DCC 508 is shown as a self-contained circuit placed at the end of the forward clock path 500, DCC 508 can also be configured as a closed loop circuit with a feedback coupled to an earlier location in clock path 500. For example, FIG. 5A illustrates an exemplary feedback 510 (the dotted line) from DCC 508, which measures the duty-cycle error at the end of the path, to the input 512 of DCDL 502. In this embodiment, feedback 510 can send a control signal from DCC 508 to enable a duty-cycle adjustment at input 512.

FIG. 5B presents a block diagram of a clock path 514 which directly incorporates a distributed duty-cycle correction mechanism into one or more clock path circuits. Similarly to clock path 500 in FIG. 5A, clock path 514 also includes a DCDL 516, an EQ 518, and a buffer chain 520 coupled in series. Note that clock path 514 can also include additional clock path circuits. In some embodiments, these clock path circuits are CML-based circuits. However, instead of using a single end-point DCC, clock path 514 uses distributed DCCs integrated with clock path circuits. For example, DCDL 516 is integrated with a DCC 522, EQ 518 is integrated with a DCC 524, and buffer chain 520 is integrated with a DCC 526. Note that in some embodiments one or more clock path circuits are not integrated with a DCC module. For example, in one embodiment, only DCDL 516 and buffer chain 520 are integrated with DCC modules. In one embodiment, these distributed DCCs provide an equal amount of duty-cycle corrections; hence, each of the DCCs is responsible for correcting approximately ⅓ of the overall duty-cycle error in clock path 514. To achieve this objective, the system can measure the overall duty-cycle error at the end of clock path 514, and subsequently compute a common control signal representing ⅓ of the correction amount. All three DCCs can receive this common control signal and then perform an equal amount of duty-cycle correction. Note that this distributed duty-cycle correction technique produces lower accumulated duty-cycle error within clock path 514 than the end-point correction technique.

Figure 5C:
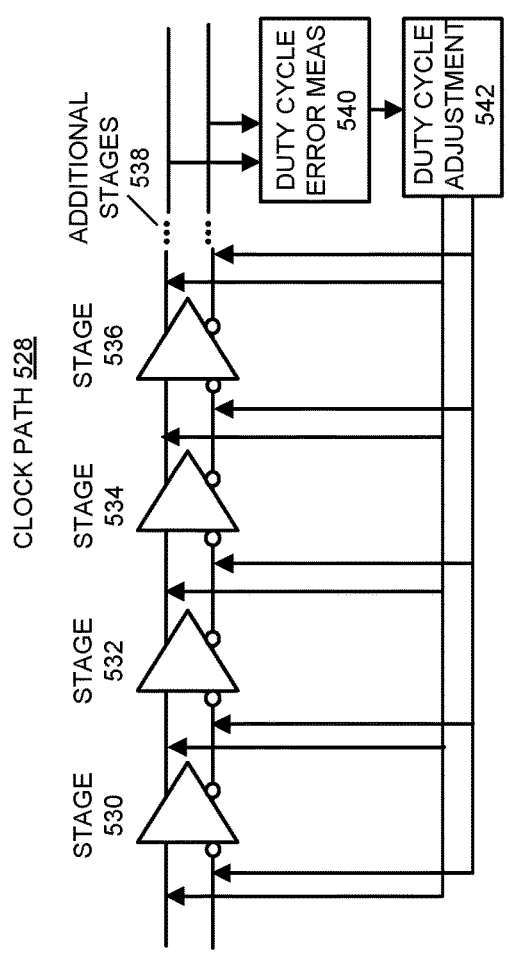
FIG. 5C presents a block diagram of a clock path which uses an end-point measurement and distributed duty-cycle correction mechanism.

FIG. 5C presents a block diagram of a clock path 528 which uses an end-point measurement and distributed duty-cycle correction mechanism. Similarly to clock path 514 in FIG. 5B, clock path 524 provides distributed duty-cycle corrections at a series of locations along the clock path. However, instead of providing one DCC for each functional clock path circuit, the embodiment of clock path 528 treats multiple clock path circuits collectively as a set of serially coupled clock path stages (or "stages"), such as CML stages 530-536 and one or more additional stages 538, and performs distributed duty-cycle corrections on each stage in the set of stages. Note that each functional clock path circuit, such as a DCDL or a buffer chain, can comprise multiple clock path stages, and each clock path stage (or "stage") can include a simple inverter or a delay element. The set of clock path stages collectively form the clock path. In the embodiment shown, each stage receives a common control signal at its respective differential inputs so that each stage produces an equal amount of duty-cycle correction.

More specifically, a duty-cycle error measurement module 540 measures the overall duty-cycle error for clock path 528 at the end of clock path 528. Next, a duty-cycle adjustment circuit 542 generates the common control signal based on the duty-cycle error measured by duty-cycle error measurement module 540, wherein the common control signal represents a fraction of the total measured duty-cycle error. For example, if the total measured duty-cycle error is 8% and there are 10 stages involved in the duty-cycle correction, then the common control signal can represent approximately 0.8% of the duty-cycle correction for each stage. Note that in FIG. 5C a series of feedback paths coupled between duty-cycle adjustment module 542 and the set of stages apply the common control signal to the differential inputs of these stages. In one embodiment, the common control signal adjusts the differential current source for each CML stage to cause a voltage offset at the outputs of the stage that adjusts the duty-cycle.

While the embodiment illustrated in FIG. 5C performs duty-cycle corrections at each stage within clock path 528, other embodiments perform distributed duty-cycle corrections at only a subset of the stages, for example, at every other stage instead of every stage. In some embodiments, distributed duty-cycle corrections are only performed on those stages associated with specific clock path circuits. For example, one embodiment performs duty-cycle correction only in stages associated with the DCDL and clock buffers. Note that this distributed duty-cycle correction technique can significantly reduce jitter along the clock path when compared with the end-point correction technique illustrated in FIG. 5A.

Figure 5D:
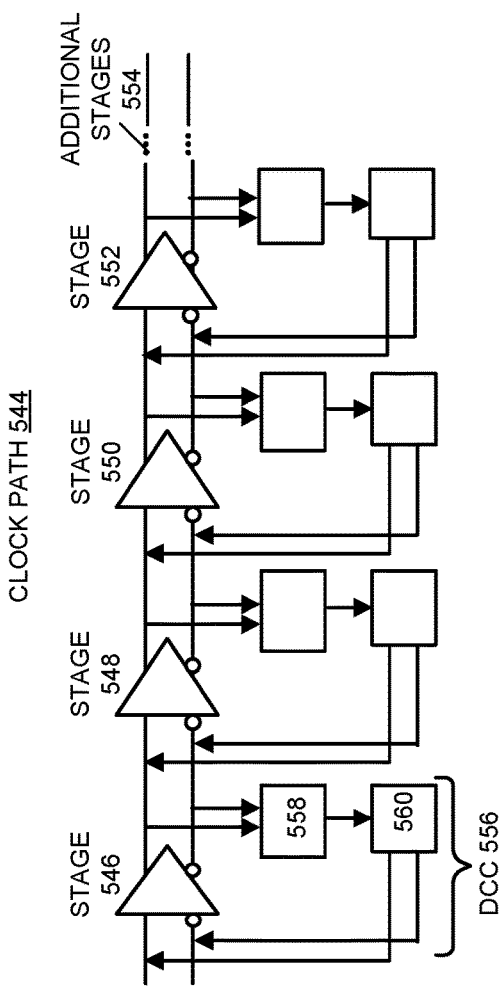
FIG. 5D presents a block diagram of a clock path which uses a distributed duty-cycle measurement and correction mechanism.

FIG. 5D presents a block diagram of a clock path 544 which uses a distributed duty-cycle measurement and correction mechanism. Similarly to clock path 528 in FIG. 5C, clock path 544 includes a set of stages, such as CML stages 546-552 and one or more additional stages 554. However, distributed duty-cycle corrections in clock path 544 are not controlled by a common control signal as in FIG. 5C. Instead, each of the clock path stages uses a separate DCC for duty-cycle error measurement and correction. For example, a dedicated DCC 556 for stage 546 includes a duty-cycle error measurement module 558 which measures an amount of duty-cycle error at the differential outputs of stage 546. Dedicated DCC 556 also includes a duty-cycle adjustment module 560 which generates a control signal based on the duty-cycle error measured by duty-cycle error measurement module 558. This control signal is coupled from duty-cycle adjustment module 560 to the differential inputs of stage 546 through a feedback path of DCC 556. In one embodiment, the control signal adjusts a differential current source for stage 546 to cause a voltage offset at the outputs of the stage that adjusts the duty-cycle for stage 546. Note that each of the other stages in clock path 544 is also associated with a dedicated DCC to perform the separate duty-cycle measurement and correction operations for that stage.

The illustrated embodiment of clock path 544 not only reduces duty-cycle error through a distributed duty-cycle error correction mechanism, but also keeps duty-cycle errors bounded at each stage, thereby increasing resolution in duty-cycle correction by avoiding the non-linear amplification of duty-cycle errors that can occur when such errors become too large. While FIG. 5D illustrates performing duty-cycle measurements and corrections at each stage within clock path 544, other embodiments can perform distributed duty-cycle measurements and corrections at only a selected subset of the stages, for example, at every other stage in clock path 544. In some embodiments, distributed duty-cycle measurements and corrections are only performed on those stages associated with specific clock path circuits, such as the DCDL and the clock buffers or in a CML to CMOS signaling conversion stage.

Distribution of DCDLs Through Master DCDLs and Micro DCDLs

Figure 6:
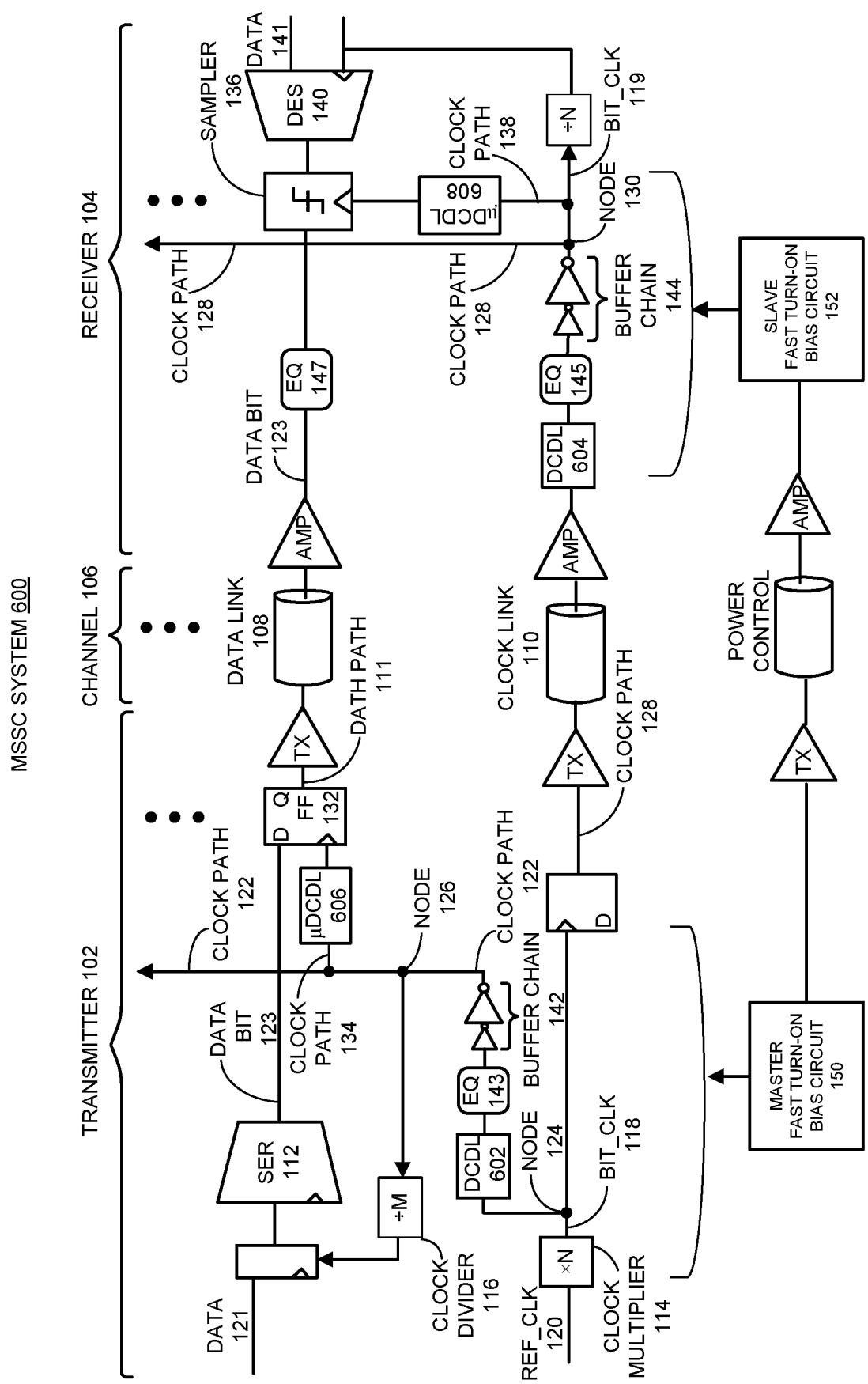
FIG. 6 presents a block diagram of an MSSC system including distributed DCDLs.

FIG. 6 presents a block diagram of an MSSC system 600 which uses distributed DCDLs. As is illustrated in FIG. 6, MSSC system 600 is substantially the same as MSSC system 100, except that MSSC system 600 uses distributed DCDLs, which are implemented by separating DCDLs 146 and 148 in MSSC system 100 into "master" DCDLs (602 and 604) and "micro" DCDLs (μDCDLs) (e.g., μDCDLs 606 and 608).

Master DCDLs 602 and 604 remain inserted in the global clock paths 122 and 128 that bring a master clock to the multiple data paths. Hence, master DCDLs 602 and 604 can be used to compensate for skews that are common for all data paths. For example, master DCDL 602 can be used to compensate for skews in clock path 122 caused by buffer chain 142, while master DCDL 604 can be used to compensate for skews in clock path 128 caused by buffer chain 144. In one embodiment, master DCDLs 602 and 604 are configured to compensate for a data path having the maximum skew among the multiple data paths.

In contrast, μDCDLs 606 and 608 are inserted into local clock paths, such as clock paths 134 and 138, to provide local clock skew compensation for each data bit, such as data bit 123. While not explicitly shown, additional pairs of μDCDLs (on both transmitter 102 and receiver 104) are also present at equivalent locations in the local clock paths associated with other data paths in MSSC 600. Generally, these μDCDLs compensate for skews which are not corrected by the master DCDLs, thereby providing fine-tuning to the skew associated with a given data bit. For example, these μDCDLs can be used to compensate for "pin-to-pin" skews, i.e., to add additional delays for shorter data links to compensate for skews between shorter data links and longer data links. In some embodiments latter, unused stages of the DCDLs are powered down to minimize power consumption. Note that in these embodiments, power consumption can be reduced by shortening the total delays on the μDCDLs and the longest common delay on the master DCDLs. This can be conveniently calibrated by setting the master DCDL delay (with μDCDL delay set to minimum) to be that of the bit requiring the shortest delay of the parallel data bits, then setting the remaining delay required in the other parallel data μDCDLs.

Source-Synchronous Clock Retiming

In some high-speed chip interfaces, a multiplying ILO (MILO) without phase-locking is used to generate higher frequency clock signals from a reference clock signal to facilitate converting parallel data signals into a serial data signal. While absence of phase-locking facilitates achieving a short turn-on cycle time, it is necessary in such systems to retime the input data from the reference clock domain into the faster clock domain.

Figure 7:
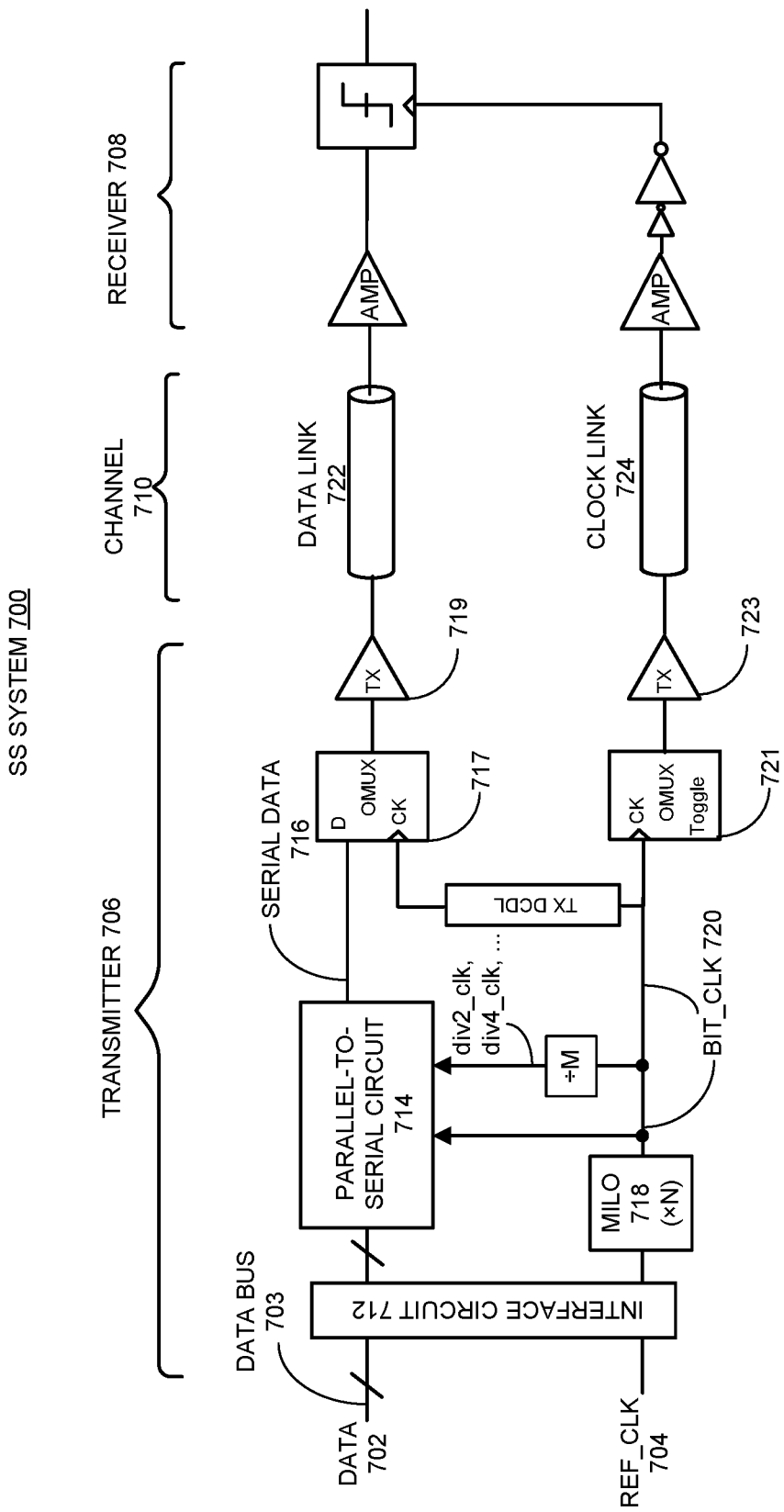
FIG. 7 illustrates a source-synchronous (SS) system including a multiplying injection oscillator (MILO) for transmitting a data signal and an associated clock over a communication channel.

FIG. 7 illustrates a source-synchronous (SS) system 700 including a MILO for transmitting a serial data signal and an associated clock from a transmitter 706 to a receiver 708 over a communication channel 710. In particular, the serial data signal and the associated clock are synchronized at the source device to reduce timing skews between the two signals. In one embodiment, SS system 700 is a simplified version of MSSC system 100.

As illustrated in FIG. 7, data 702 and a reference clock ("ref_clk") 704 are inputs to transmitter 706, for example, through an interface circuit 712 within transmitter 706. In the embodiment shown, data 702 is parallel data and data bus 703 includes a group of parallel channels (shown as the slash on the data path). In some embodiments, data bus 703 can include a power-of-2 number of channels (e.g., 4, 8, 16 channels, etc.) In one embodiment, the frequency "$f_{ref}$" of ref_clk 704 is the same as the data rate of each parallel channel within data bus 703 (e.g. parallel data is edge-triggered off of a single edge into the parallel interface).

A parallel-to-serial circuit 714 converts parallel data 702 into serial data 716 which has a data rate equal to N times the data rate of each parallel channel in data bus 703, wherein N is the number of parallel channels in data bus 703. We refer to the data rate of serial data 716 as a "bit rate." This assumes that parallel data 702 and serial data 716 are binary coded data transmitting one bit per symbol, but a similar procedure exists for signaling systems encoding more or less than one bit per symbol, in which case the symbol rate and the bit rate may be different. Serial data 716 passes through a flip-flop/output multiplexer (OMUX) 717 and a data buffer 719 before being transmitted onto data link 722. Separately, bit_clk 720 passes through a flip-flop/OMUX 721 and a clock buffer 723 before being transmitted onto clock link 724.

In order to provide timing information for serial data 716, transmitter 706 includes a MILO 718, which takes ref_clk 704 as an input and generates a fast clock (referred to as a "bit_clk") 720 based on ref_clk 704. In one embodiment, the frequency "$f_{bit}$" of bit_clk 720 is N times the frequency $f_{ref}$. To provide timing information for parallel-to-serial circuit 714, bit_clk 720 is used to derive a number of slower clocks, which have the frequencies of $f_{bit}/2$, $f_{bit}/4$, . . . , and $f_{bit}/N$, wherein $f_{bit}/N$ equals $f_{ref}$ of ref_clk 704. These slower clocks which are derived from bit_clk 720 may be referred to as "div2_clk," "div4_clk," . . . , "divN_clk" in accordance with their respective frequencies, for example, div2_clk has the frequency $f_{bit}/2$. Note that these derived slower clocks may be substantially phase-aligned with bit_clk 720. In some embodiments, each of the clock edges within a derived slower clock is substantially aligned with a clock edge in bit_clk 720. In some embodiments the derived slower clocks may be phase-aligned but delayed slightly by the Clk to Q of the particular divider circuitry used.

Note that in some embodiments, the input clock (ref_clk 704) and the output clock (bit_clk 720) of MILO 718 are not contained in a feedback loop that locks the output clock to a reference clock and therefore fast locking behavior is achieved. Furthermore, when MILO 718 is turned on, an undetermined (but limited) number of cycles may occur on bit_clk 720 before the clock has substantially stabilized to its steady state amplitude and phase. Therefore, both because ref_clk 704 and bit_clk 720 have an unknown phase-relationship and because of this lack of determinism in the startup of the MILO, while the derived clocks div2_, div4_, . . . , etc. have a known phase relationship with respect to bit_clk 720, they may have an unknown phase-relationships with respect to ref_clk 704. Moreover, in the embodiment shown, transmitter 706 does not include a phase-alignment mechanism (e.g., a PLL module or a DLL module) to perform a phase-alignment between ref_clk 704 and bit_clk 720, or between any of the derived clocks div2_clk, div4_clk, . . . , and ref_clk 704.

Note that eliminating a slow phase-locking process facilitates a rapid transitioning of SS system 700 from a power-off state to a power-on state. However, the phase-relationship between ref_clk 704 and bit_clk 720 or any of the derived clocks div2_, div4_clk, . . . , is an unknown and may change value each time SS system 700 is transitions from an idle to an active state, most typically when the MILO is turned on and relocked.

Circuit 714 also includes a retiming mechanism (not shown) which synchronizes serial data 716 with bit_clk 720. In one embodiment, this synchronization can be achieved by retiming parallel data 702 using the divN_clk prior to performing the parallel-to-serial conversions in circuit 714. Note that the divN_clk is a mesochronous clock (same frequency, indeterminate phase) with respect to ref_clk 704. After parallel data 702 are retimed into the divN_clk domain, the parallel-to-serial conversion which uses the derived slower clocks and optionally bit_clk 720 can be safely performed, and as a result, input data 702 can be correctly retimed and serialized from the domain of ref_clk 704 into the domain of bit_clk 720. Finally, serial data 716 and bit_clk 720 are transmitted over channel 710 (through data link 722 and clock link 724, respectively) to receiver 708.

Figure 8:
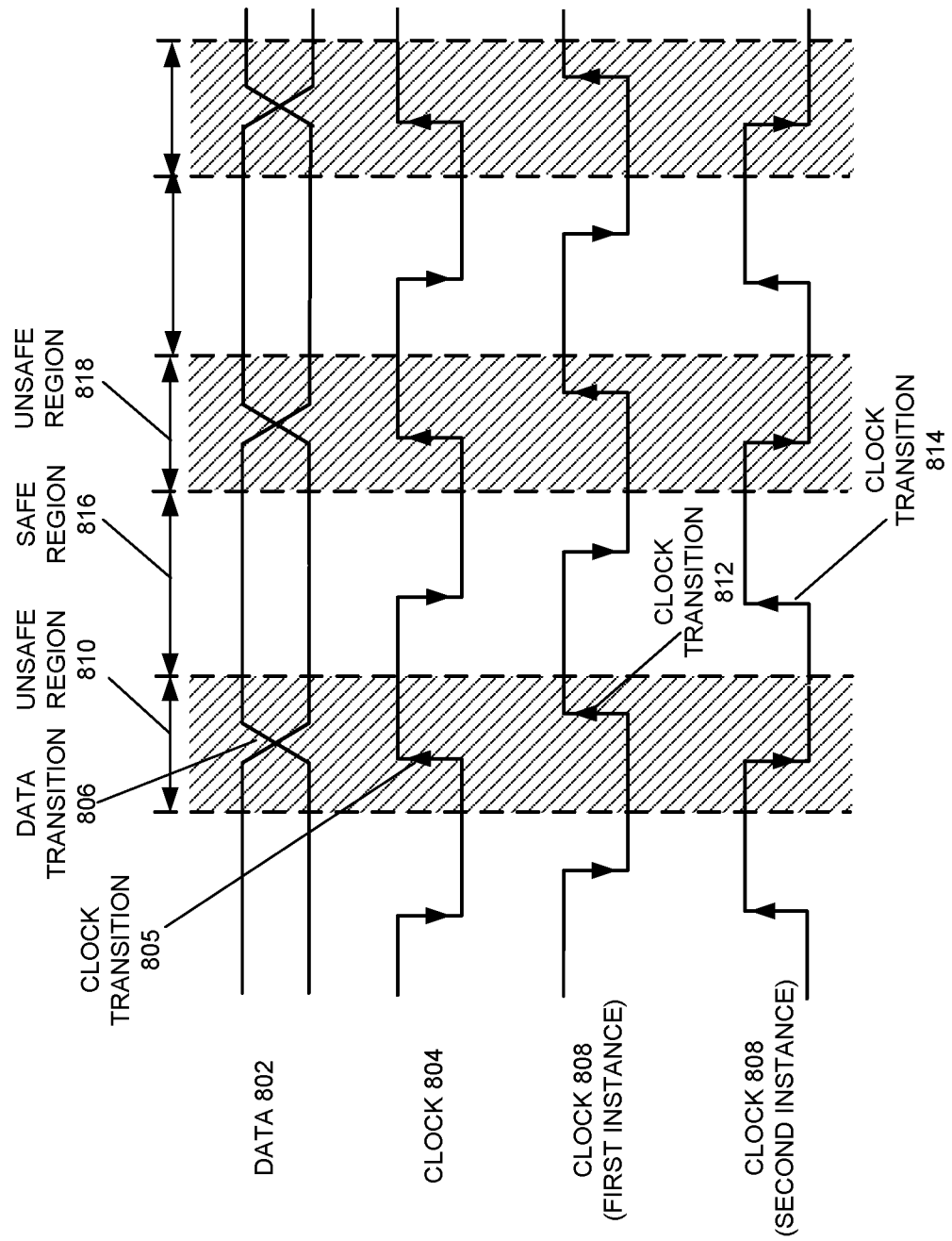
FIG. 8 provides a timing diagram illustrating risks involved in retiming a data signal from a first clock domain to a second clock domain when the two clock domains have an unknown phase-relationship.

FIG. 8 provides a timing diagram illustrating the risk involved in retiming a data signal from a first clock domain to a second clock domain when the two clock domains have an unknown phase-relationship. In reference to the embodiment illustrated in FIG. 7, data 802 in FIG. 8 is an exemplary embodiment of data 702 in FIG. 7, clock 804 is an exemplary embodiment of ref_clk 704 in FIG. 7, and clock 808 is an exemplary embodiment of divN_clk in FIG. 7.

As illustrated in FIG. 8, data 802 is timed using clock 804 such that a rising edge transition (e.g., clock transition 805) of clock 804 generates a data transition (e.g., data transition 806) in data 802. At this point, data 802 is in the domain of clock 804. Also shown in FIG. 8 is a mesochronous clock 808 of clock 804, wherein the phase-relationship between the two clocks is unknown. In some embodiments, clock 808 is used to retime data 802 from the domain of clock 804 to the domain of clock 808.

Shadowed region 810 in FIG. 8 represents an unsafe region of data 802 for retiming data 802 with respect to clock 808. Specifically, region 810 is a region centered around data transition 806 where the data value may be in transition and could be uncertain. In other words, when sampling data 802 in the vicinity of data transition 806, the sampled value is uncertain. Sampling the data at such a point could lead to metastability in an output flip-flop. For example, in this region non-idealities such as jitter on clock 804 or clock 808 or skew on data 802 can cause an error in the data sampling. As is illustrated in FIG. 8, in the first instance of clock 808, a rising edge transition 812 (assuming rising edge triggered flip-flops are used for the retiming operation) falls within unsafe region 810. In such instances, it is unsafe to retime data 802 directly using clock 808.

Note that the boundaries of an unsafe region may vary for different links, and under different operation environments. In one embodiment, the unsafe region is defined by two boundaries surrounding a data transition region, wherein each boundary has a phase distance from the center of the data transition region greater than a threshold phase value.

For example, in one embodiment, the unsafe region is defined by two boundaries located −30° and 30° from the center of a data transition (defined as 0°) in data 802. In one embodiment, this threshold phase value may be calibrated based on a bit error rate (BER) value, and the threshold phase value represents a location where the BER becomes consistently acceptable.

Because data 802 has periodic unit intervals (UI) for each bit, each interval can be divided into an unsafe region and a safe region. For example, when the unsafe region for retiming data 802 using clock 808 varies between −30° and 30° with respect to a data transition, the safe region for retiming data 802 includes the remainder of the UI between 30° and 330° with respect to the same data transition. As is illustrated in FIG. 8, in the second instance of clock 808, a rising edge transition 814 (assuming rising edge triggered flip-flops are used) falls within safe region 816 between two unsafe regions 810 and 818. In such instances, it is safe to retime data 802 using clock 808 directly. Note that the safe regions and unsafe regions are interleaved with the same period as clock 804 or clock 808.

Note that the size of an unsafe region may also have an upper bound. Because the retimed data value becomes increasingly more deterministic when a sampling edge (e.g., clock transition 812 of clock 808) is further away (including in both directions) from the center of the data transition, at a certain phase distance from the data transition, the unsafe region crosses into the safe region. One may choose a location in the safe region well beyond the threshold phase value described above as the upper bound of the unsafe region. For example, in one embodiment, the unsafe region may be defined by two boundaries located between −90° and 90° from the center of data transitions in data 802. In this embodiment, the safe region for retiming data 802 is located between 90° and 270° from the same data transition, and hence has the same size as the unsafe region. Note that, if the safe region and the unsafe region for each UI have substantially the same size, (i.e., each is approximately 180°, which can conservatively be defined if the true unsafe region is less than or equal to 180°), it becomes possible to determine whether a sampling edge is within the safe region or the unsafe region by using a binary relative clock phase detector. As the data and clocks are essentially mesochronous to each other as long as retiming flip-flops with adequate performance are used, there will generally be a significant overlap region between the two clock domains where data can be successfully retimed with a latch or sampled with an edge-triggered flip-flop.

FIG. 9A illustrates a logic circuit 900 for determining whether a phase-relationship between a first clock 902 and a second clock 904 is within an unsafe region for retiming a data signal using the second clock 904. It is assumed that the data signal has been previously retimed using clock 902, and that clock 902 and clock 904 have an unknown phase-relationship.

In the embodiment shown in FIG. 9A, logic circuit 900 includes a sampling circuit 901, wherein clock 904 is the sampling clock and clock 902 is the input to sampling circuit 901. The clock path of clock 904 also includes a delay module 906 which causes a predetermined delay $t_d$ to clock 904. Next, the delayed clock 904' is used to sample clock 902.

FIG. 9B illustrates a timing diagram 910 associated with logic circuit 900 which describes the operation of circuit 900. Note that, if no delay $t_d$ is added to clock 904, sampling circuit 901 outputs logic value 1 when a rising edge transition (e.g., clock transition 912) of clock 904 falls within the half cycle 914 of clock 902 associated with logic high, and outputs logic value 0 when a rising edge transition of clock 904 falls within the half cycle 916 of clock 902 associated with logic low (for simplicity, this neglects internal delay in sampling circuit 901 itself, which can easily be included). However, as explained in FIG. 8, half cycles 914 and 916 often do not provide useful representations of safe regions and unsafe regions. This is because an unsafe region as described above is a region encompassing a rising edge transition of clock 902, whereas both half cycles 914 and 916 are equivalently positioned on either side of a rising edge transition of clock 902.

As illustrated in FIG. 9B, by adding delay $t_d$ to clock 904 and using the delayed clock 904' to sample input clock 902, sampling circuit 901 outputs logic value 1 when a rising edge transition (e.g., delayed clock transition 912') of delayed clock 904' falls within the half cycle 914 of clock 902, and outputs logic value 0 when a rising edge transition of delayed clock 904' falls within the half cycle 916 of clock 902. Moreover, the output value 1 corresponds to when a rising edge transition of clock 904 (e.g., clock transition 912) falls within a phase-shifted half cycle 918 defined by boundaries [−$t_d$; −$t_d$+180°] with respect to a rising edge transition of clock 902. In contrast, an output value 0 corresponds to when a rising edge transition of clock 904 falls within a phase-shifted half cycle 920 defined by boundaries [−$t_d$+180°; −$t_d$+360°] with respect to a rising edge transition of clock 902. Note that the region defined by [−$t_d$; −$t_d$+180°] can be made to encompass a rising edge transition of clock 902 if delay $t_d$ is carefully selected. Moreover, delay $t_d$ can also be used to compensate for the different setup and hold times between the clock paths of clock 902 and clock 904.

For example, when $t_d$=30°, the two half-cycle regions corresponding to the output logic values of 1 and 0 become [−30°, 150°] and [150°, 330°], respectively. Note that this example is similar to the first instance of clock 808 described in FIG. 8, wherein [−30°, 30°] and [30°, 330°] correspond to the unsafe region and the safe region, respectively. In this example, logic circuit 900 can be used to determine that clock transition 912 is in an unsafe region when sampling circuit 901 outputs logic 1, and that clock transition 912 is in a safe region if sampling circuit 901 outputs logic 0. In another example, when $t_d$=90°, the two half-cycle regions corresponding to the output values of 1 and 0 become [−90°, 90°] and [90°, 270°], respectively. Note that these two phase regions match the unsafe region and safe region described in the second instance of clock 808 in FIG. 8. Similarly, logic circuit 900 can be used to determine that clock transition 912 is in an unsafe region when sampling circuit 901 outputs logic 1, and that clock transition 912 is in a safe region when sampling circuit 901 outputs logic 0. In this manner, logic circuit 900 can be used to determine whether clock 904 is in the unsafe region or the safe region to retime the data signal based on the outputs of sampling circuit 901.

Note that by using logic circuit 900, each clock cycle can be divided into a half cycle which is safe for data retiming based on the retiming clock and the other half cycle which is unsafe for data retiming based on the retiming clock. Also note that, when a transition of the retiming clock is in the unsafe half cycle, the opposite transition of the retiming clock is in the safe half cycle.

Figure 10:
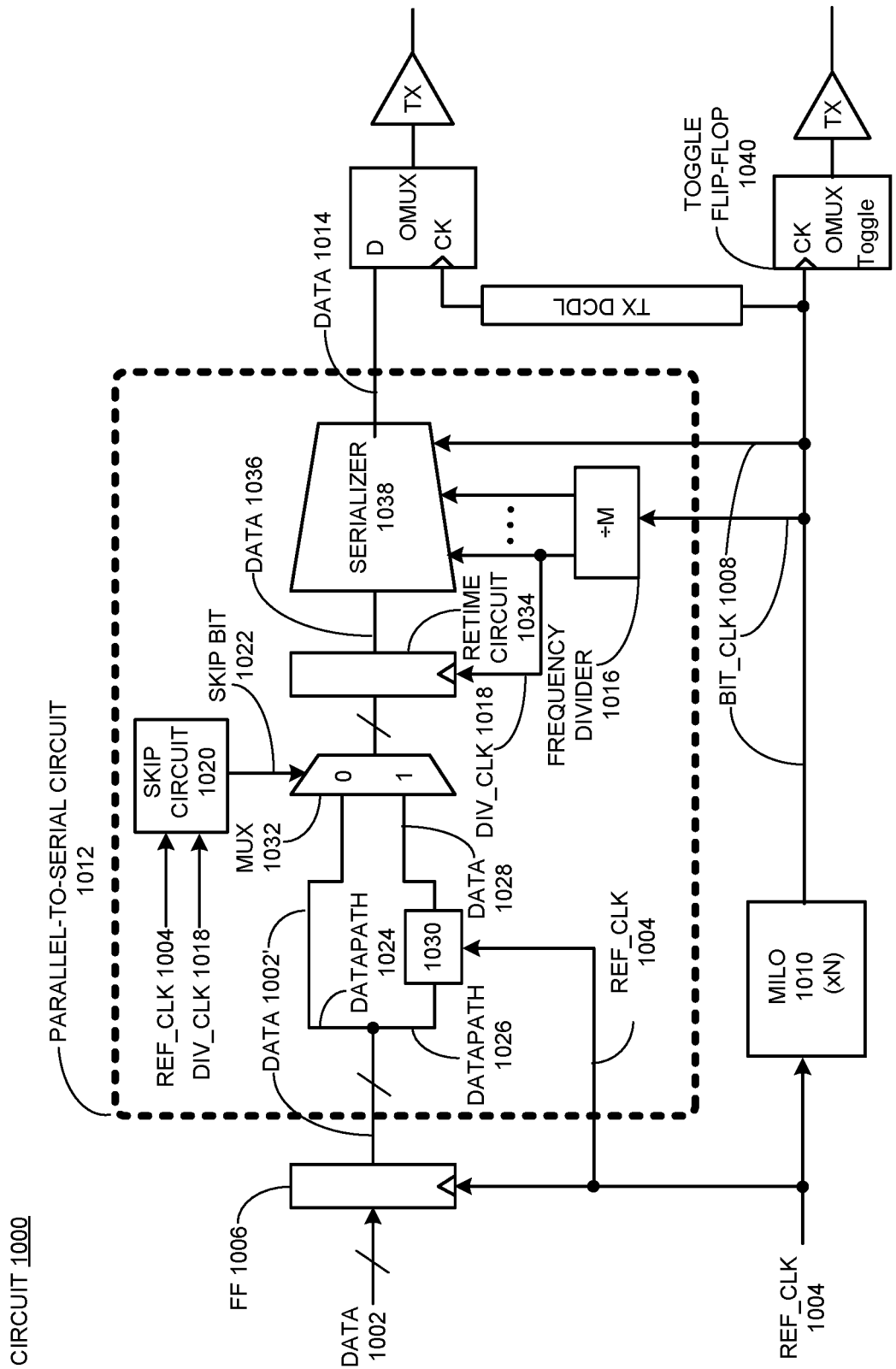
FIG. 10 presents a circuit which includes a mechanism for retiming a data signal from a first clock domain to a second clock domain where the two clock domains have an unknown phase-relationship.

FIG. 10 presents a circuit 1000 illustrating an exemplary embodiment of transmitter 706 in FIG. 7, which includes a mechanism for retiming a data signal from a first clock domain to a second clock domain where the two clock domains have an unknown phase-relationship.

As illustrated in FIG. 10, circuit 1000 receives parallel data 1002 and reference clock ("ref_clk") 1004 having a frequency of $f_{ref}$. Data 1002 is then phase-realigned with ref_clk 1004, for example, using a rising edge triggered flip-flop 1006, which produces phase-realigned data 1002'. Note that ref_clk 1004 is also used to generate a fast clock ("bit_clk") 1008 having a frequency of $f_{bit}$ through a MILO 1010 without a phase detector. As a result, bit_clk 1008 has an unknown phase-relationship with respect to ref_clk 1004. As such, bit_clk 1008 is in a different clock domain from ref_clk 1004.

Circuit 1000 includes a parallel-to-serial circuit 1012 which receives parallel data 1002' and bit_clk 1008 and converts parallel data 1002' into serial data 1014 based on bit_clk 1008. More specifically, bit_clk 1008, which is a fast clock, is used to generate new clocks with fractional frequencies. For example, parallel-to-serial circuit 1012 can include a frequency divider 1016 which receives bit_clk 1008 as an input. In one embodiment, frequency divider 1016 comprises a set of serially coupled divide-by-2 frequency dividers which sequentially generate clocks with fractional frequencies of $f_{bit}/2$, $f_{bit}/4$, . . . , $f_{bit}/N$, wherein $f_{bit}/N$ equals $f_{ref}$. For example, when MILO 1010 produces bit_clk 1008 which has a frequency of $f_{bit}=8\times f_{ref}$, frequency divider 1016 can include three serially coupled divide-by-2 frequency dividers to sequentially generate clocks with frequencies of $f_{bit}/2$, $f_{bit}/4$, and $f_{bit}/8=f_{ref}$. Note that new clock ("div_clk") 1018 with frequency $f_{ref}$ can be a mesochronous clock with respect to ref_clk 1004. In one embodiment, all derived clocks, including div_clk 1018, are substantially phase-aligned with bit_clk 1008, or have approximately static phase offsets relative to bit_clk 1008, and hence are not phase-locked to data 1002'. However, bit_clk 1008 and each of the derived clocks from bit_clk 1008 are considered to be in the same clock domain.

Figure 9:
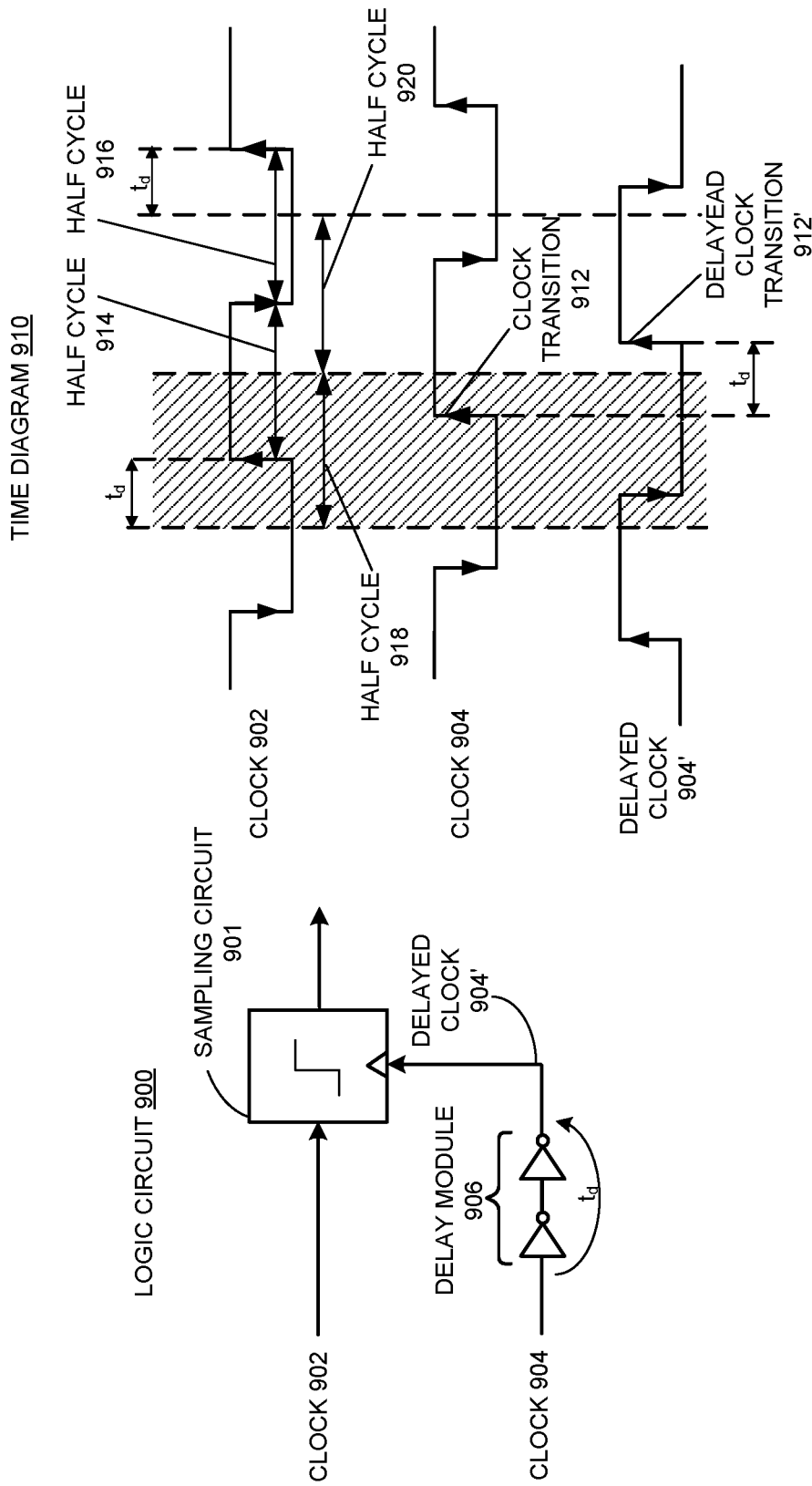
FIG. 9A illustrates a logic circuit for determining whether a phase-relationship between a first clock and a second clock is within an unsafe region for retiming a data signal using the second clock.
FIG. 9B illustrates a timing diagram associated with the logic circuit in FIG. 9A.

As illustrated in FIG. 10, div_clk 1018 is the primary clock which is used to retime parallel data 1002'. In order to retime data 1002' from the domain of ref_clk 1004 to the domain of div_clk 1018, parallel-to-serial circuit 1012 provides a mechanism to determine whether div_clk 1018 is in the unsafe region or the safe region for retiming data 1002' according to the discussions in conjunction with FIGS. 8 and 9. In the illustrated embodiment, a "skip" circuit 1020 is provided to determine the relative phase-relationship between ref_clk 1004 and div_clk 1018. Skip circuit 1020 generates a skip bit 1022, wherein a value of 1 indicates div_clk 1018 is in the unsafe region and a value of 0 indicates div_clk 1018 is in the safe region. While logic circuit 900 in FIG. 9 provides an exemplary embodiment of skip circuit 1020, other embodiments of skip circuit 1020 which can produce the equivalent skip bit 1022 can be used for skip circuit 1020.

Additionally, parallel-to-serial circuit 1012 provides two independent data paths for data 1002': a first data path 1024 which is selected when it is safe to directly retime data 1002' using div_clk 1018 and a second data path 1026 which is selected when it is unsafe to directly retime data 1002' using div_clk 1018.

More specifically, data path 1024 simply passes data 1002' to the retiming portion of parallel-to-serial circuit 1012; whereas data path 1026 delays data 1002' and then passes the phase-delayed data 1028 to the retiming portion of parallel-to-serial circuit 1012. In one embodiment, data path 1026 uses a delay element 1030 to delay data 1002' relative to ref_clk 1004 by one half of a cycle of ref_clk 1004. For example, delay element 1030 can include a falling edge triggered flip-flop or other types of latch circuits which are falling edge triggered. Because data transitions in data 1002' are generated by the rising edge transitions of ref_clk 1004, retiming data 1002' using the falling edge transitions of ref_clk 1004 causes a 180° phase delay of data 1002' relative to ref_clk 1004. As described in conjunction with FIGS. 8 and 9, the 180° phase-delay to data 1002' causes a rising edge transition of div_clk 1018 to relocate from the unsafe region to the safe region for retiming purposes. Note that while the embodiment above adjusts the phase of data signal 1002' relative to the phase of div_clk 1018, it is also possible to adjust the phase of div_clk 1018 relative to the phase of data signal 1002' so that the phase-relationship between data signal 1002' and the phase-adjusted div_clk 1018 is within a safe range for retiming data signal 1002' using the phase-adjusted div_clk 1018. This can be accomplished fairly easily by use of the higher frequency bit_clk 1008.

Moreover, both data paths 1024 and 1026 are the inputs to a multiplexer (MUX) 1032, which receives skip bit 1022 of skip circuit 1020 as the selection signal. Hence, when div_clk 1018 is safe for retiming data 1002' (i.e., skip bit=0), MUX 1032 chooses data path 1024, i.e., the original data 1002' as the output. Otherwise (i.e., skip bit=1), MUX 1032 chooses data path 1026, i.e., phase-delayed data 1028 as the output. In both cases, it becomes safe to retime the output data from MUX 1032 using div_clk 1018 at retiming circuit 1034. The retimed parallel data 1036 is now in the domain of div_clk 1018. Next, a serializer 1038 converts the retimed parallel data 1036 into serial data 1014. In one embodiment, serializer 1038 is a pipelined converter which sequentially multiplexes parallel data channels by a factor of two until all parallel data channels are combined into a signal data channel. In this embodiment, each pipeline stage in serializer 1038 is synchronized to an increasingly faster derived clock from bit_clk 1008, and the final serial data 1014 is synchronized to bit_clk 1008 at the highest bit rate.

Note that circuit 1000 and hence transmitter 706 in FIG. 7 automatically determine the phase-relationship between a reference clock and a mesochronous clock generated from the reference clock but in a different clock domain from the reference clock each time the associated communication system is transitioned from a power-off state to a power-on state. More specifically, skip bit 1022 is re-evaluated each time the system is powered on by comparing the phases of the reference clock and the mesochronous clock, and a new data path 1024 or 1026 is reselected.

In some embodiments, each time when skip bit 1022 is being re-evaluated, input data 1002 does not become active until after a predetermined number of reference clock cycles has elapsed in order to allow for skip circuit 1020 to complete skip bit calculation first. Moreover, because no data is being transmitted during skip bit calculation, the forwarded clock on the clock path accompanying data 1014 should also be idle. In other words, toggle flip-flop 1040 does not start to toggle until a clock cycle of bit_clk 1008 corresponding to the first data bit of data 1014 is sent. In one embodiment, this can be achieved by replacing toggle flip-flop 1040 with a copy of parallel-to-serial circuit 1012, wherein the input data of this replacement circuit is configured to start at "all-zeros," and then switch to a "1010 . . . " pattern at the moment when a clock cycle of ref_clk 1004 corresponding to the first parallel data 1002 appears on the clock path. In some embodiments, the first edge of ref_clk 1004 used to start injection into MILO 1010 is the first edge also used to sample parallel data 1002.

In some embodiments the use of frequency divider 1016 at the end of a power-on burst will leave the counters in an indeterminate state. In some embodiments, the dividers in frequency divider 1016 are reset upon each power-down event so that when a fast power-up is executed they will start from a determinate state.

Figure 11:
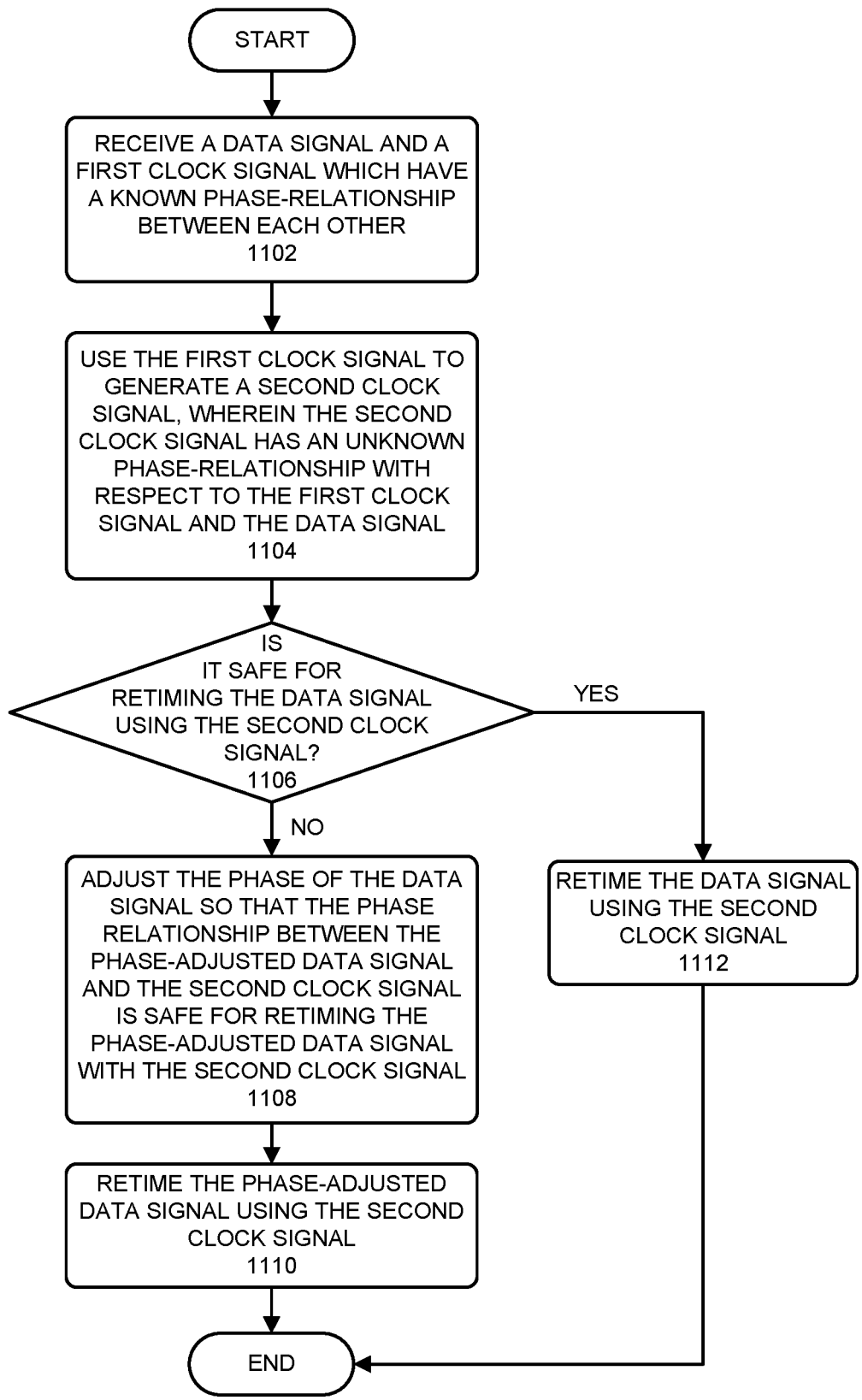
FIG. 11 presents a flowchart illustrating a process of retiming a data signal from a first clock domain to a second clock domain where the two clock domains have an unknown phase-relationship.

FIG. 11 presents a flowchart illustrating a process of retiming a data signal from a first clock domain to a second clock domain wherein the two clock domains have an unknown phase-relationship.

During operation, a chip signaling interface receives the data signal and the first clock signal which have a known phase-relationship between each other (step 1102). While the data signal and the first clock signal may be phase-locked when received, the chip signaling interface may further use the received first clock signal to retime the received data signal, for example, by using a rising edge triggered latch circuit. In doing so, the rising edge transitions of the first clock signal regenerate the data transitions in the retimed data signal.

Next, a second clock signal is generated based on the first clock signal, wherein the second clock signal has an unknown phase-relationship with respect to the first clock signal and the data signal (step 1104). In one embodiment, the second clock signal and the first clock signal are mesochronous, i.e., having the same frequency but an unknown phase-relationship.

A logic circuit is then used to determine whether the phase-relationship between the data signal and the second clock signal is safe for retiming the data signal using the second clock signal (step 1106). In one embodiment, the logic circuit is configured to determine whether the phase-relationship between the data signal and the second clock signal is safe for retiming by determining whether a sampling edge of the second clock signal is located outside of a predetermined phase distance from a sampling edge of the first clock signal, wherein the sampling edge of the first clock signal is used to generate a data transition in the data signal. In one embodiment, the predetermined phase distance is less than or equal to 90°.

Figure 12:
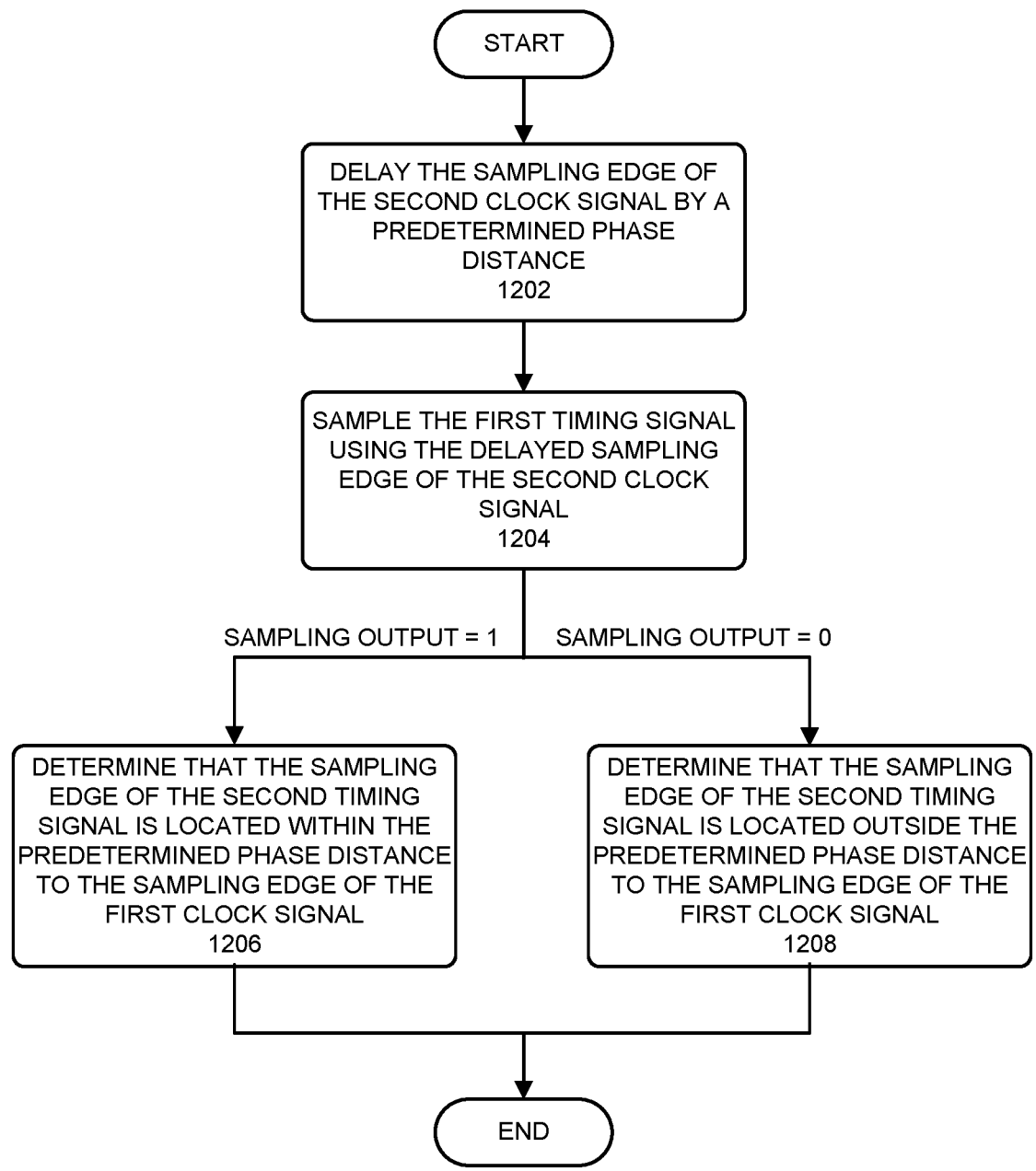
FIG. 12 presents a flowchart illustrating a process for determining whether a sampling edge of the second clock signal is located within or outside of a predetermined phase distance to a sampling edge of the first clock signal.

FIG. 12 presents a flowchart illustrating a process for determining whether a sampling edge of the second clock signal is located within or outside of a predetermined phase distance from a sampling edge of the first clock signal.

During operation, a delay module is used to first delay the sampling edge of the second clock signal by the predetermined phase distance (step 1202). A sampling circuit then samples the first timing signal using the delayed sampling edge of the second clock signal (step 1204). If the sampling output equals 1, the process determines that the sampling edge of the second timing signal is located within the predetermined phase distance from the sampling edge of the first clock signal (step 1206). If the sampling output equals 0, the process determines that the sampling edge of the second timing signal is located outside of the predetermined phase distance from the sampling edge of the first clock signal (step 1208).

Referring back to FIG. 11, if the logic circuit determines that the phase-relationship between the data signal and the second clock signal is not safe for retiming the data signal using the second clock signal, a phase-adjustment circuit is used to adjust the phase of the data signal so that the phase-relationship between the phase-adjusted data signal and the second clock signal is within a safe range for retiming the phase-adjusted data signal using the second clock signal (step 1108). In one embodiment, the phase-adjustment circuit adjusts the phase of the data signal by delaying the data signal relative to the first clock signal by one half of a clock cycle of the first clock signal. Note that in step 1108 it is also possible to adjust the phase of the second clock signal so that the phase-relationship between the data signal and the phase-adjusted second clock signal is within a safe range for retiming the data signal using the phase-adjusted second clock signal. A retiming circuit subsequently retimes the phase-adjusted data signal using the second clock signal (step 1110). On the other hand, if the logic circuit determines that the phase-relationship between the data signal and the second clock signal is safe for retiming the data signal using the second clock signal, the retiming circuit directly retimes the data signal using the second clock signal (step 1112). In both cases, the data signal is safely retimed into the second clock domain.

In one embodiment, SS system 700 can be configured as a memory system such that transmitter 706 is configured as part of a memory controller and receiver 708 is configured as part of a memory device. In this embodiment, memory system 700 can be used to perform fast write transactions using the single transmitter-side MILO 718. In some embodiments, read transactions from a memory device can also be accommodated in a fully matched source-synchronous manner by placing a fast clock multiplier (e.g., a MILO) on the memory controller. Note that in these embodiments, the transmitter is on the memory device, and the fast clock multiplier is on the receiver, which itself is on the memory controller.

Figure 13:
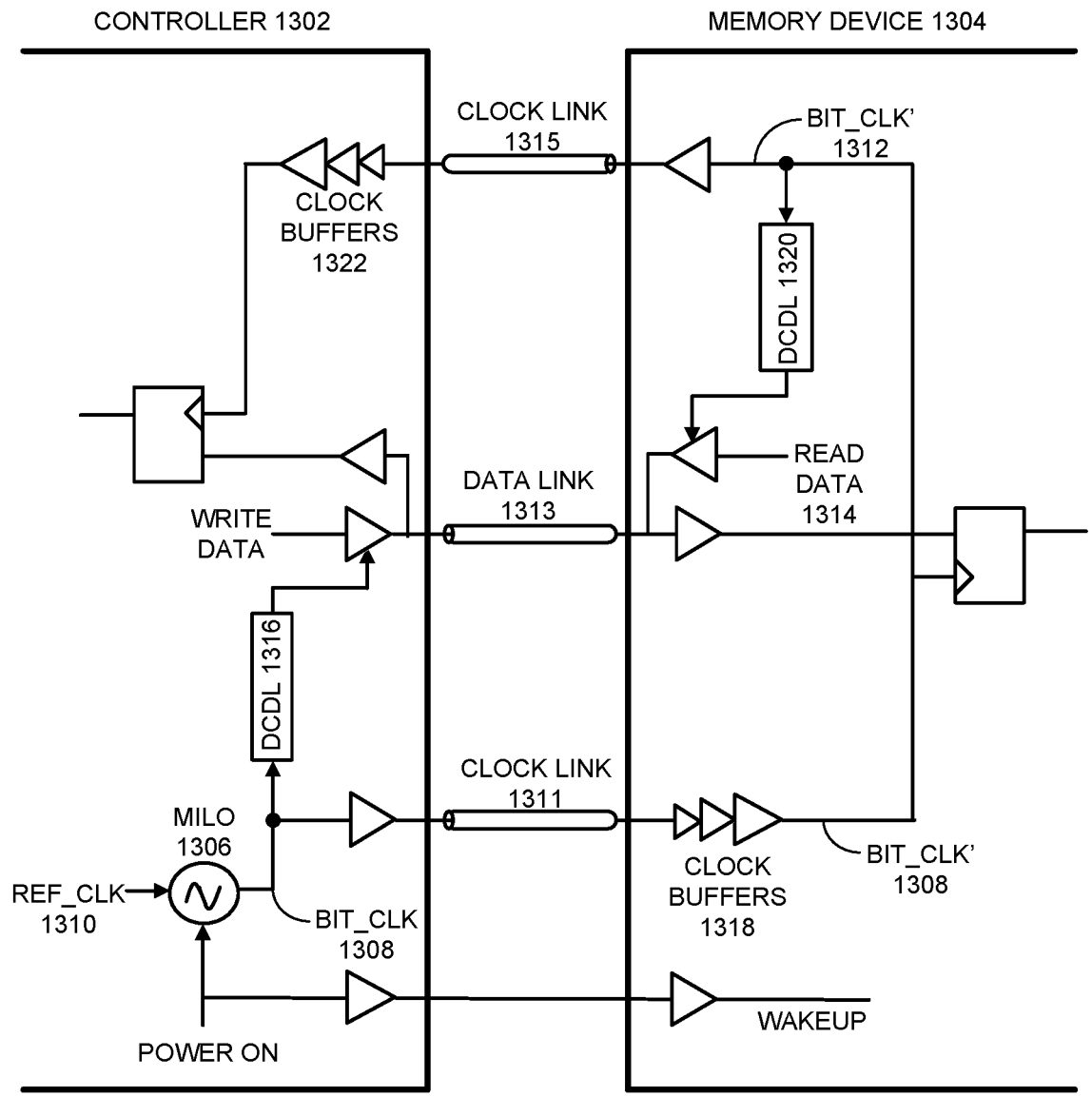
FIG. 13 illustrates an embodiment of an MSSC memory system which uses a single controller-side MILO 1306 and a return clock.

FIG. 13 illustrates an embodiment of an MSSC memory system 1300 which uses a single controller-side MILO 1306 and a return clock. More specifically, memory controller 1302 of MSSC memory system 1300 uses MILO 1306 to generate a bit clock bit_clk 1308 based on a reference clock ref_clk 1310. Memory controller 1302 then forwards bit_clk 1308 via a first clock link 1311 to memory device 1304 of MSSC memory system 1300. Memory device 1304 receives bit_clk' 1312 which is the delayed bit_clk 1308, and subsequently transmits bit_clk' 1312 and read data 1314 back to memory controller 1302 via a second clock link 1313 and a bi-directional data link 1315, respectively. Note that memory system 1300 includes a controller-side DCDL 1316 which can be configured to compensate for skews between the forward data and clock paths, such as those caused by clock buffers 1318. Similarly, it also includes a memory device DCDL 1320 to compensate for controller clock buffer skew 1322. Such DCDLs can, in some embodiments, be split into 'master' and µDCDL' structures as has been previously discussed to minimize power.

The embodiment of MSSC memory system 1300 circulates the receive clock on the memory device by using the same clock as the transmit clock from the memory device. One problem which can arise from this scheme is accumulation of high-frequency jitter via clock recirculation on the memory device. However, memory system 1300 can use a memory-side DCDL 1320 on the return path of memory system 1300 to compensate for skews between the return data and clock paths, such as those caused by clock buffers 1322, thereby creating a matched-source-synchronous return path. Consequently, the impact from this increased high-frequency jitter can be significantly mitigated. While the embodiment of memory system 1300 describes placing a single MILO on the memory controller, i.e., the receiver-side for reads, some embodiments can place a single MILO on the memory device, i.e., the transmitter-side, instead of the memory controller.

In some embodiments, read transactions from a memory device can also be accommodated in a fully matched source-synchronous manner by placing fast clock multipliers (e.g., MILOs) on both the memory controller and memory device.

Figure 14:
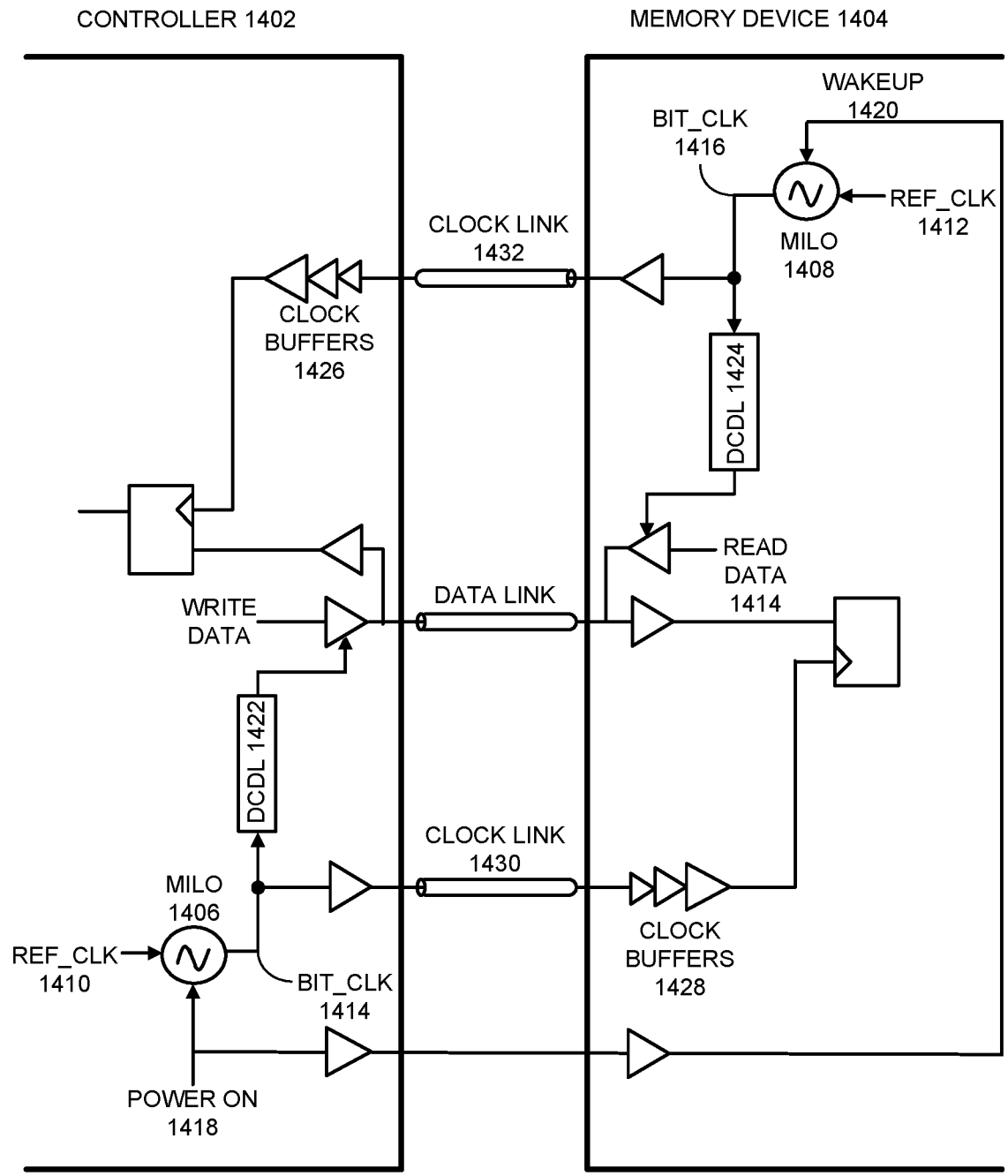
FIG. 14 illustrates an embodiment of an MSSC memory system which uses MILOs on both the memory controller and the memory device.

FIG. 14 illustrates an embodiment of an MSSC memory system 1400 which uses MILOs on both the memory controller and the memory device. As illustrated in FIG. 14, matched MILOs 1406 and 1408 are placed on memory controller 1402 and memory device 1404, respectively. Each of the MILOs 1406 and 1408 receives a respective reference clock ref_clk 1410 and ref_clk 1412 (which can have arbitrary phase between each other), and generate a respective bit clock bit_clk 1414 and bit_clk 1416. Moreover, controller-side MILO 1406 receives a "fast-power-on" input 1418, which is also sent from memory controller 1402 to memory device 1404 as a "fast-wakeup" input 1420 to MILO 1408. In this embodiment, each read transaction can operate with as much timing margin as write transactions (e.g., being fully source-synchronous and symmetric to the write operations). In some embodiments, the reference clocks ref_clk 1410 and ref_clk 1412 received by the two devices 1402 and 1404 can be from different sources, as can the 'power on' and 'wakeup' signals 1418 and 1420.

In one embodiment, a controller-side DCDL 1422 and a memory-side DCDL 1424 can be used to compensate for skews caused by clock buffers 1426 and 1428 and by other sources in the similar manner as in memory system 1300. While embodiment of memory system 1400 uses two unidirectional clock links 1430 and 1432, some embodiments can use one bidirectional clock link to transmit both bit_clk 1414 and bit_clk 1416 to save device pins but with a trade-off of incurring additional turnaround latency. These embodiments may also help to compensate for the cost of more device pins as both controller and memory devices now need a separate reference clock input. A similar tradeoff can be made on the data links in embodiments of 1300 or 1400 where the data links can be made either unidirectional or bidirectional in order to properly balance the tradeoffs between turn-around latency and pin-count.

Clock Multiplier Based on a MILO

Figure 15A:
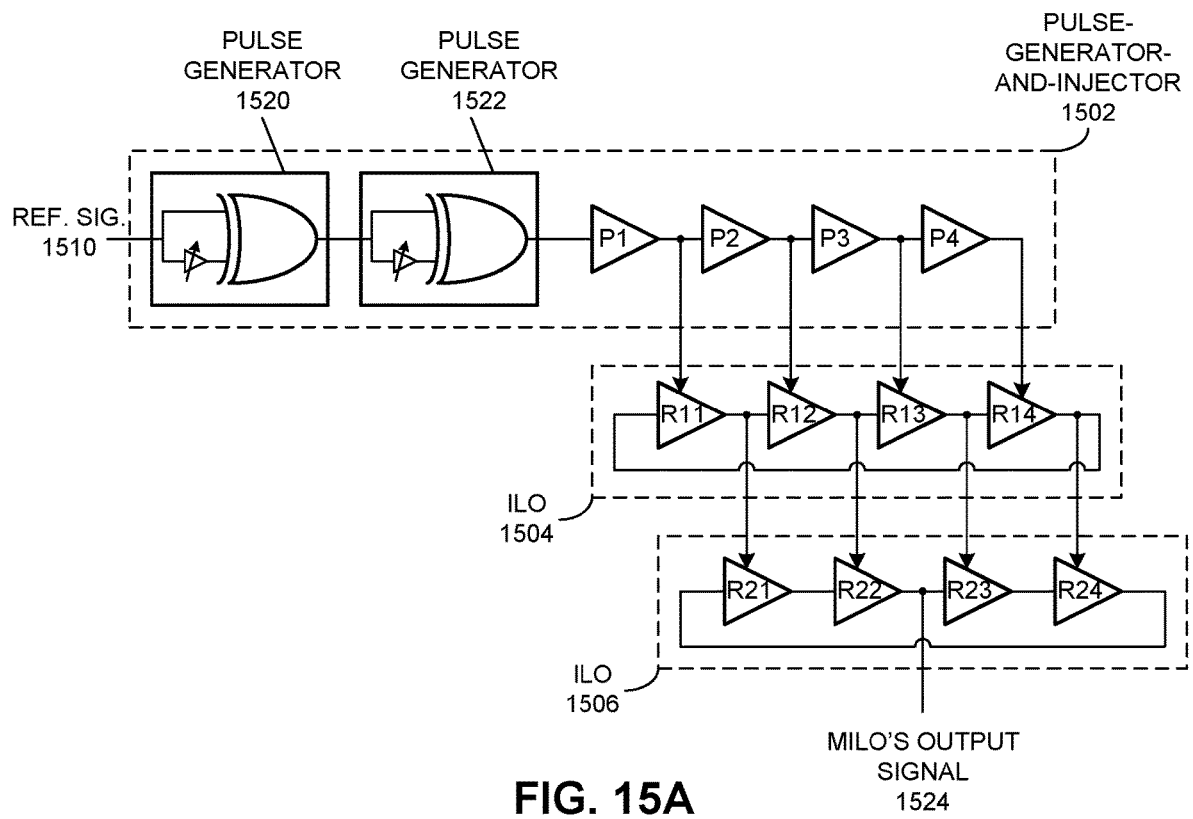
FIG. 15A illustrates a MILO in accordance with embodiments described herein.

FIG. 15A illustrates a MILO in accordance with embodiments described herein. The MILO illustrated in FIG. 15A includes pulse-generator-and-injector 1502, and injection-locked oscillators 1504 and 1506.

Pulse-generator-and-injector 1502 can include pulse generators 1520 and 1522, and delay elements P1-P4. Pulse generator 1520 can receive reference signal 1510 and generate a first sequence of pulses which can be provided as input to pulse generator 1522. The number of edges in the first sequence of pulses can be twice the number of edges in reference signal 1510 over the same time period. Pulse generator 1522 can then generate a second sequence of pulses that has twice the number of edges than the number of edges in the first sequence of pulses over the same time period. In this manner, the output signal of pulse generator 1522 can have four times the number of edges in reference signal 1510 over a given time period.

The output of pulse generator 1522 can then be provided as input to the delay chain comprising delay elements P1-P4. As shown in FIG. 15A, the output signals from delay elements P1-P4 can be injected into corresponding delay elements R11-R14 of injection-locked oscillator 1504. In some embodiments the design of delay elements P1-P4 matches that of delay elements R11-R14 in order for the injection pulses to arrive at the same relative phase at delay elements R11-R14.

In some embodiments described in this disclosure, the sequence of pulses generated by pulse generator 1522 may not have equal widths and/or may not have the same amplitude. These variations in the width and/or amplitude of the pulses can show up as deterministic jitter in the output signals from injection-locked oscillator 1504. In some embodiments, the amount of deterministic jitter in the output signals can be reduced by adding more injection-locked oscillator blocks to the MILO. Specifically, in some embodiments, the output signals from injection-locked oscillator 1504 can be injected into corresponding injection points in another injection-locked oscillator, e.g., a non-multiplying injection-locked oscillator 1506. Specifically, as shown in FIG. 15A, the outputs from delay elements R11-R14 of injection-locked oscillator 1504 can be injected into corresponding delay elements R21-R24 of injection-locked oscillator 1506.

In some embodiments described herein, the output signals from delay elements R21-R24 can be used to generate the output of the MILO. Specifically, in some embodiments, the output signal from one of the delay elements in the last injection-locked oscillator can be output as the MILO's output signal. For example, as shown in FIG. 15A, the output from delay element R22 can be output as the MILO's output signal 1524. In some embodiments other outputs in the delay chain can be used, and in some embodiments all outputs can be used to provide separately spaced vectors for interpolation, edge detection, or other purposes.

In some embodiments described herein, the delay elements in the injection-locked oscillators can use differential signals. However, differential signals have not been shown in FIG. 15A for the sake of clarity and ease of discourse.

Figure 15B:
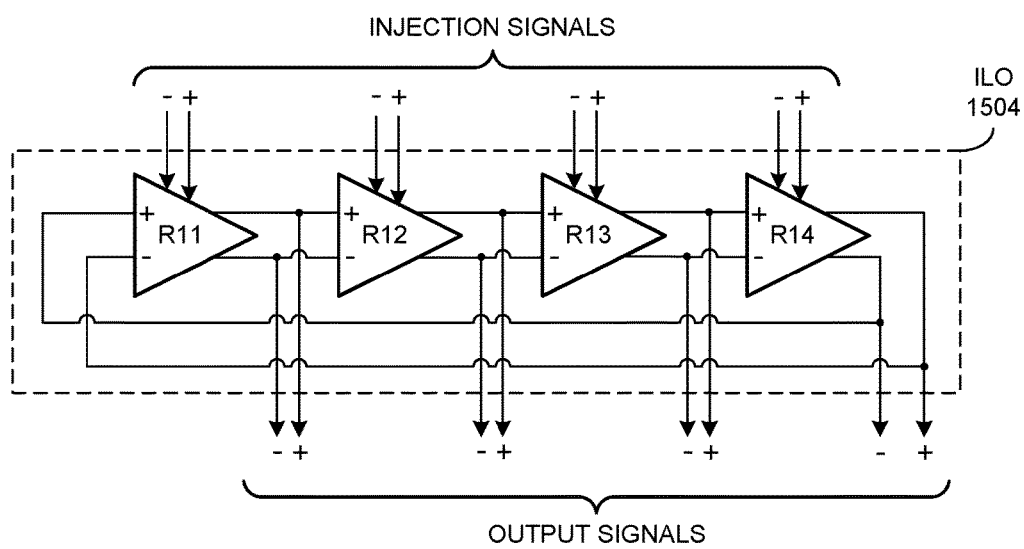
FIG. 15B illustrates a 4-stage injection-locked oscillator in accordance with embodiments described herein.

FIG. 15B illustrates a 4-stage injection-locked oscillator in accordance with embodiments described herein.

Injection-locked oscillator 1504 can include delay elements R11-R14 arranged in a loop. As shown in FIG. 15B, each delay element can receive and output differential signals. In some embodiments, one or more stages of the injection-locked oscillator may invert the signal. For example, as shown in FIG. 15B, the differential outputs of delay element R14 are provided to the opposite polarity inputs of delay element R11 (e.g., the "+" and "−" outputs of delay element R14 can be coupled with the "−" and "+" inputs of delay element R11, respectively).

Figure 15C:
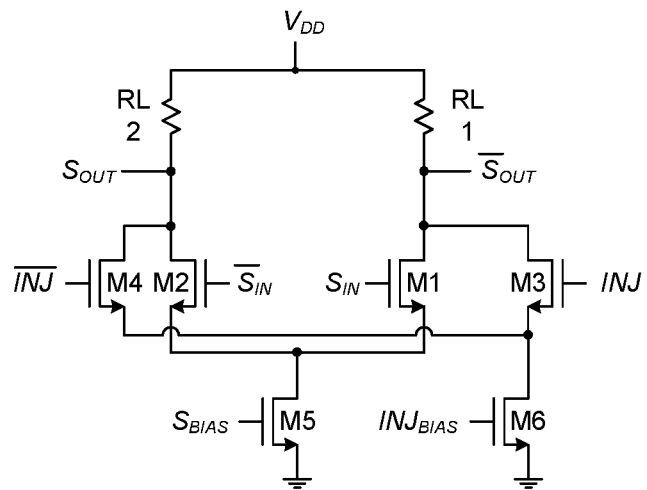
FIG. 15C illustrates a delay element of an injection-locked oscillator in accordance with embodiments described herein.

FIG. 15C illustrates a delay element of an injection-locked oscillator in accordance with embodiments described herein. The delay element illustrated in FIG. 15C can correspond to a delay element shown in FIG. 15B, e.g., delay element R11.

The delay element shown in FIG. 15C can include differential transistor pair M1 and M2 which can receive the differential input signal $S_{IN}$ and $\overline{S}_{IN}$ as input, and differential transistor pair M3 and M4 which can receive the differential injection signal INJ and $\overline{INJ}$ as input. Transistors M5 and M6 can act as current sources for the differential pairs, and their currents can be controlled by bias signals $S_{BIAS}$ and $INJ_{BIAS}$, respectively. RL1 and RL2 can be load resistances, and $V_{DD}$ can be the supply voltage. The differential output signal $S_{OUT}$ and $\overline{S}_{OUT}$ can be based on the sum of the drain currents of the corresponding transistors in the differential pairs. Specifically, output signal $S_{OUT}$ is based on the sum of the drain currents of transistors M2 and M4, and output signal $\overline{S}_{OUT}$ is based on the sum of the drain currents of transistors M1 and M3.

The injection strength can be modified by adjusting the strength of $S_{BIAS}$ and $INJ_{BIAS}$ relative to one another. For example, injection strength can be increased by increasing $INJ_{BIAS}$ and/or decreasing $S_{BIAS}$. Conversely, injection strength can be decreased by decreasing $INJ_{BIAS}$ and/or increasing $S_{BIAS}$. In some embodiments, the total current into the load is maintained at a constant level, i.e., a constant swing is developed across $S_{OUT}$ and $\overline{S}_{OUT}$. In some embodiments, the injection strength used for injecting the sequence of pulses into injection-locked oscillator 1504 is greater than the injection strength used to inject the output of injection-locked oscillator 1504 into injection-locked oscillator 1506.

Figure 15D:
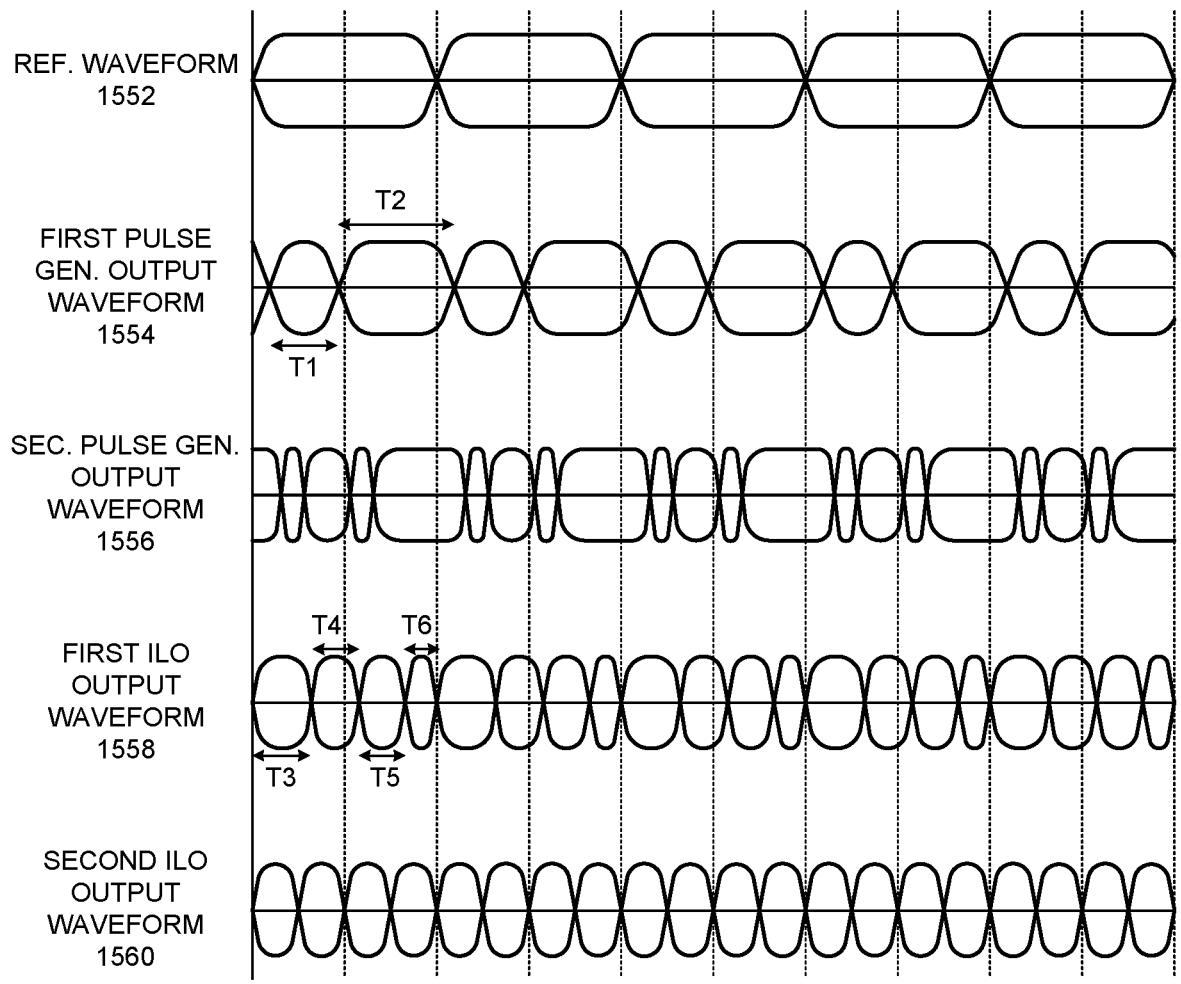
FIG. 15D illustrates waveforms associated with the MILO shown in FIG. 10A in accordance with embodiments described herein.

FIG. 15D illustrates waveforms associated with the MILO shown in FIG. 15A in accordance with embodiments described herein. The differential signal waveforms shown in FIG. 15D are for illustration purposes only, and are not intended to limit the scope of the described embodiments.

Although the MILO and ILO embodiments described in the preceding figures and text are ring-based, in alternate embodiments such MILO and ILO blocks can be implemented as one or more inductor capacitor (LC) type oscillators.

Glitch-Free Clock Gating

In MSSC system 100, further power savings can be achieved by gating the clock signal. Clock gating can be performed in MSSC system 100 globally at the root of the clock distribution network or locally at selected locations within the clock distribution network which are associated with individual data paths in the system. If clock gating is performed globally, clock gating may be applied to the master clock bit_clk 118 by inserting clock gating logic between the output of clock multiplier 114 and node 124. On the other hand, when clock gating is performed locally, clock gating logic may be inserted within a local clock path. For example, to selectively gate the clock to data path 111, clock gating logic may be inserted in both local clock path 134 on the transmitter side and local clock path 138 on the receiver side. While the following discussion focuses on techniques for gating a CML clock, the embodiments described below are applicable to general clock gating operations within MSSC system 100. In one embodiment, the main clock ref_clk 120 in MSSC system 100 can be a CML clock received from a CML clock source.

According to an embodiment, a high-speed clock distribution system uses a low-swing CML clock signal generated by a CML clock source as the input clock, because such a clock signal generally has a low PSIJ sensitivity. In such systems, power savings can be achieved by gating the CIVIL clock signal (i.e., selectively turning on and off the clock distribution) with a synchronous gate signal. In one embodiment, the clock gating operation is performed by a CML multiplexer which receives the CML clock signal as a data input, and the gate signal as the select input. However, the clock gating operation can be performed by other clock gating means.

In some embodiments, the gate signal is the output of a digital logic (e.g., a high-speed finite state machine (FSM)) built in CMOS technology to achieve higher power efficiency. As a result, the gate signal has a full-swing CMOS level. Moreover, the digital logic generating the gate signal is often in a reference clock domain which is associated with a low timing resolution. Because the CMOS gate signal and the CML clock signal are generated from different clock domains, a finite delay often exists between these two signals. Consequently, when synchronous clock gating is necessary, such as in MSSC system 100, it can be challenging for the CMOS gate signal to start at exactly the right time/phase as required for a glitch-free gated clock. This problem is illustrated in FIG. 16, which illustrates timing relationships between a CIVIL clock signal and a CMOS gate signal in both an asynchronous case and a synchronous case.

Figure 16:
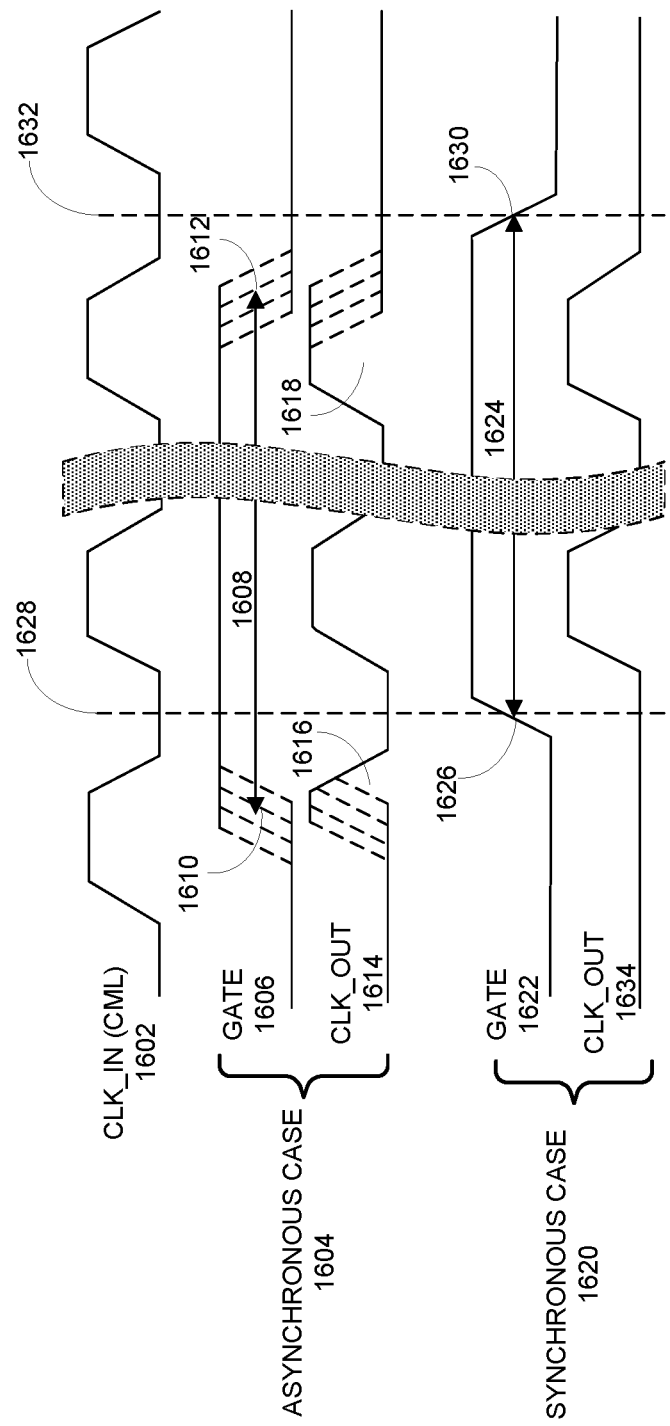
FIG. 16 illustrates timing relationships between a CML clock signal and a CMOS gate signal in both an asynchronous case and a synchronous case.

As illustrated in FIG. 16, an exemplary CML clock signal clk_in 1602 is a high-speed, low-swing input clock to a clock distribution network. In the asynchronous case 1604, an exemplary gate signal gate 1606 is a CMOS signal which comprises an opening 1608. In the discussion below, the terms "clock gate," "opening," "window" and "enable window" are used interchangeably to refer to an enabled time interval in the gate signal which is defined between a rising edge transition (also referred to as "the beginning") and a falling edge transition (also referred to as "the end"). For example, the beginning of opening 1608 is a rising edge transition 1610 and the end of opening 1608 is a falling edge transition 1612. Moreover, because a transition can have a finite width, when making a reference to a transition in the following discussion (including rising edge transitions, falling edge transitions, data transitions, clock transitions, and other types of signal level transitions), reference to an approximate middle of that transition is implied.

Note that both transition 1610 and transition 1612 are associated with a band of uncertainty, which is shown as a set of parallel dashed lines. As such, the beginning of opening 1608 is not phase-aligned with clk_in 1602. The asynchronous phase relationship between clk_in 1602 and gate 1606 produces an output clock clk_out 1614 which includes a glitch 1616 and a narrow pulse 1618.

Also illustrated in FIG. 16 is a synchronous case 1620, wherein an exemplary gate signal gate 1622 comprises an enable window 1624 that is synchronized to clk_in 1602. More specifically, the beginning of window 1624 (i.e., rising edge transition 1626) is phase-aligned with clk_in 1602 at a location marked by dashed line 1628, and the end of window 1624 (i.e., falling edge transition 1630) is phase-aligned with clk_in 1602 at a later location marked by dashed line 1632. Note that both dashed lines 1628 and 1632 mark an approximate midpoint in the logic low half of the clock cycle. The synchronous phase relationship between clk_in 1602 and gate 1622 produces an output clock clk_out 1634 which is free of glitches or narrow pulses.

Figure 17A:
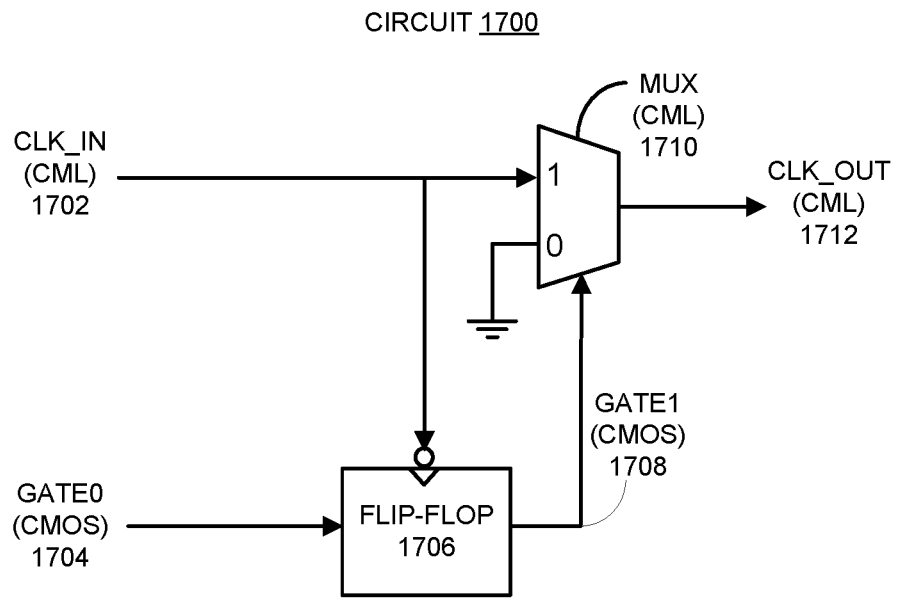
FIG. 17A illustrates a circuit which includes a synchronization mechanism for phase-aligning a CMOS gate signal to a CML clock signal.

FIG. 17A illustrates a circuit 1700 which includes a synchronization mechanism for phase-aligning a CMOS gate signal generated in a CMOS reference clock domain to a CML clock signal generated in a CML clock domain. In an embodiment, circuit 1700 provides an open-loop synchronization mechanism which does not require a PLL or a DLL.

In the embodiment shown in FIG. 17A, circuit 1700 receives both a CML clock signal clk_in 1702 and a CMOS gate signal gate0 1704. Circuit 1700 includes a flip-flop 1706 which receives gate0 1704 as a data input and a 180° phase-inverted version of clk_in 1702 as the clock input. In a particular embodiment, flip-flop 1706 is configured as a negative edge triggered flip-flop so that when clk_in 1702 transitions from high to low, gate0 1704 is sampled and propagated to the output of flip-flop 1706 as a retimed CMOS gate signal gate1 1708. Circuit 1700 also includes a clock gating block in the form of a CML multiplexer (MUX) 1710, which receives clk_in 1702 as a data input and gate1 1708, which is now phase-aligned with clk_in 1702, as a select input. As such, MUX 1710 outputs a gated CML clock signal clk_out 1712 without glitches or narrow pulses. Note that the clock gating function in circuit 1700 may be implemented in other means different from MUX 1710.

In one embodiment, flip-flop 1706 includes at least one CMOS-CIVIL hybrid latch configured to operate with both CMOS level data signals and CML level clock signals, thereby allowing gate0 1704 in the CMOS level to be synchronized to clk_in 1702 in the CIVIL level. An exemplary design of a hybrid flip-flop is described below in conjunction with FIG. 18.

Figure 17B:
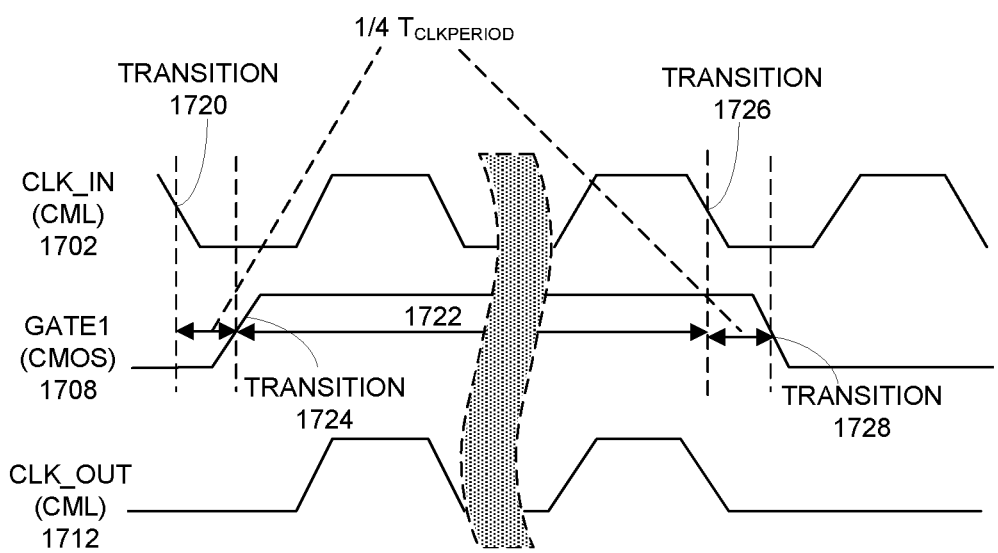
FIG. 17B presents a timing diagram illustrating a phase relationship and time constraints between the CML input clock and the retimed CMOS gate signal in FIG. 17A.

FIG. 17B presents a timing diagram illustrating a phase relationship and time constraints between the CML input clock clk_in 1702 and the retimed CMOS gate signal gate1 1708 in FIG. 17A. As illustrated in FIG. 17B, a falling edge transition 1720 in clk_in 1702 triggers the beginning of an enable window in gate0 1704 (not shown) to cross the clock domain from the CMOS clock domain to the CML clock domain. This produces a delayed (relative to transition 1720) beginning (i.e., transition 1724) of an enable window 1722 which is substantially phase-aligned with a desired location in clk_in 1702. In the embodiment shown, this desired location is approximately ¼ of one CML clock period ($T_{ClkPERIOD}$) from the middle of transition 1720 or in the middle of the logic low half cycle of clk_in 1702. This requirement provides a timing constraint for the flip-flop design, which can be expressed as:

$$T_{C-Q,HybridFF} \approx \frac{1}{4}(T_{ClkPERIOD}),$$

wherein $T_{C-Q,HybridFF}$ is the clock to data output delay of flip-flop 1706, measured from a triggering event (e.g., transition 1720) to the time when the flip-flop output switches.

Similarly, FIG. 17B also shows that a second falling edge transition 1726 in clk_in 1702 triggers the end of the enable window in gate0 1704 (not shown) to cross the clock domain from the CMOS clock domain to the CIVIL clock domain. This produces a falling edge transition 1728 in gate1 1708 to mark the end of window 1722, wherein transition 1728 is substantially delayed by ¼ of $T_{ClkPERIOD}$ from transition 1726 to satisfy the above-described timing constraint. Note that window 1722 can have an opening duration equal to multiple (e.g., 4, 8, 16, etc.) $T_{ClkPERIOD}$. Consequently, a properly designed flip-flop 1706 allows synchronizing the CMOS gate signal to the CML input clock. The retimed clock gate1 1708 is subsequently used to gate the input clock clk_in 1702 to generate a glitch-free CMOS output clock clk_out 1712. Note that the design of synchronizing circuit 1700 provides a direct and fast open-loop solution to achieve glitch-free clock gating. Because no feedback is used in circuit 1700, substantial power saving is also achieved when compared to feedback-based techniques.

Figure 18:
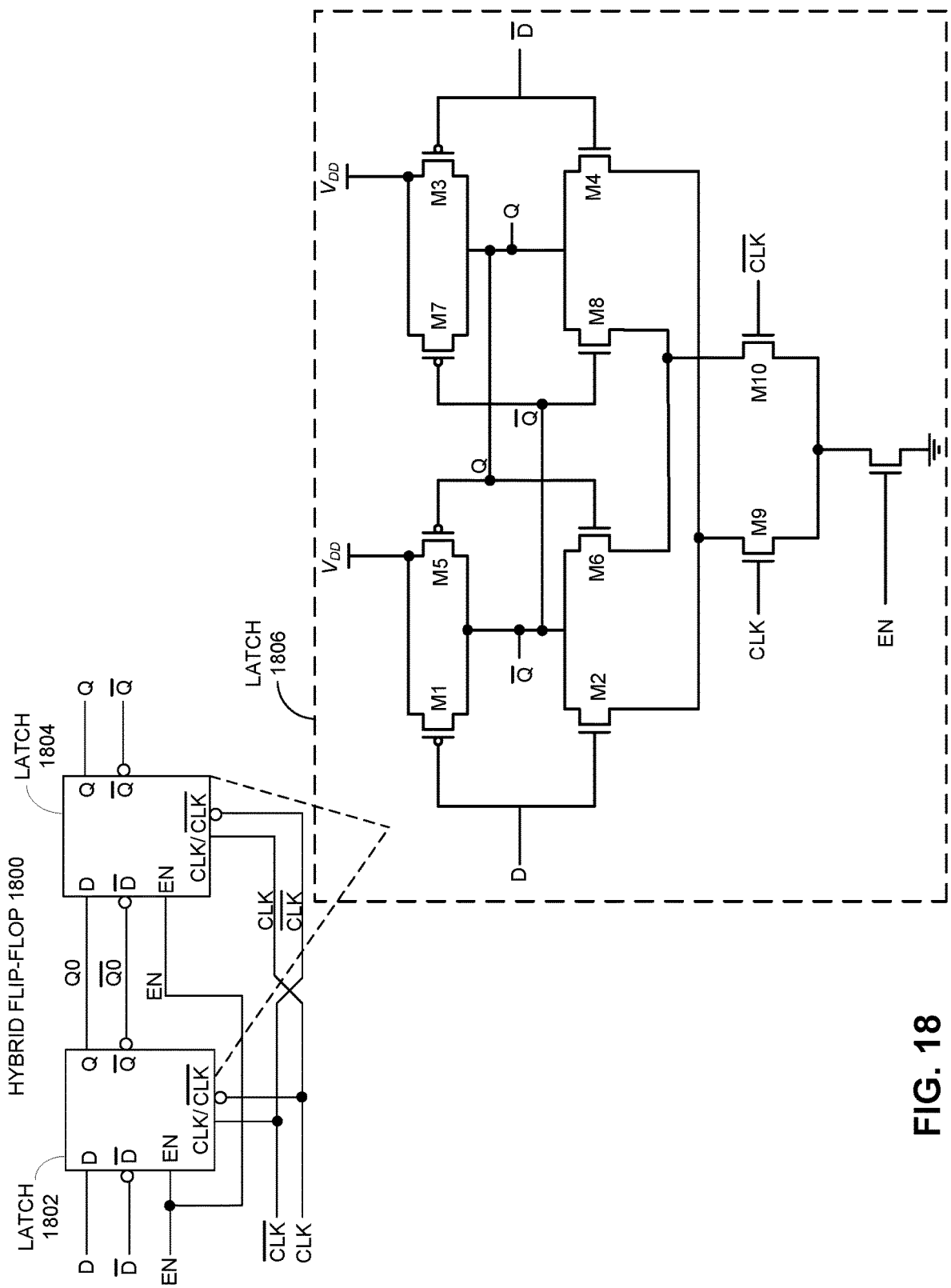
FIG. 18 illustrates an exemplary implementation of a hybrid flip-flop for synchronizing a CMOS input signal with a CML clock signal.

FIG. 18 illustrates an exemplary implementation of a hybrid flip-flop 1800 for synchronizing a CMOS input signal with a CML clock signal. The hybrid flip-flop illustrated in FIG. 18 can correspond to hybrid flip-flop 1706 in FIG. 17A.

As illustrated in FIG. 18, hybrid flip-flop 1800 comprises two substantially identical hybrid latches 1802 and 1804 cascaded in a manner similar to a conventional master-slave flip-flop. Note that each of the latches receives full-swing CMOS data input and low-swing differential CML clock inputs, and generates full-swing CMOS data output. In one embodiment, hybrid latches 1802 and 1804 are "level sensitive" such that each of the latches buffers CMOS input D/$\overline{D}$ from the data input to the data output Q/$\overline{Q}$ when low-swing differential CIVIL clock inputs CLK/$\overline{CLK}$ are differentially high, and regenerates Q/$\overline{Q}$ when the differential CML clock inputs CLK/$\overline{CLK}$ are differentially low. One difference between a conventional clocked regenerative latch and the hybrid latches illustrated in FIG. 18 is that the hybrid latches operate with low-swing differential CIVIL clocks. In other words, a conventional latch is generally "level sensitive" when the input clocks have rail-to-rail CMOS swings, while each of the hybrid latches in FIG. 18 is "level sensitive" to a typical differential CML clock signal.

FIG. 18 also illustrates a detailed transistor level implementation 1806 of each of the latches 1802 and 1804. More specifically, within hybrid latch 1806, the top-outer four transistors M1, M2, M3, and M4 coupled to CMOS inputs D/$\overline{D}$ form an amplification stage, while the top-inner four transistors M5, M6, M7, and M8 are cross-coupled to form a latching stage. In one embodiment, transistors M1-M8 are low threshold voltage (LVT) devices. Below those two stages is the differential clock input stage comprising transistors M9 and M10 coupled to CLK/$\overline{CLK}$. In one embodiment, transistors M9 and M10 are regular threshold voltage (RVT) devices. Further below the clock inputs is the enable signal (EN) input which operates at full-swing CMOS level.

In one embodiment, each of the hybrid latches 1802 and 1804 is constructed such that the low-swing CLK/$\overline{CLK}$ signals are able to toggle the dominance between the outer buffering branch (e.g., the amplification stage in hybrid latch 1806) and the inner regenerative branch (e.g., the latching stage in hybrid latch 1806) when CLK/$\overline{CLK}$ are differentially high and low. To achieve the above function, the transistors in the hybrid latches can be sized so that: (1) without the ability to completely turn off the inner branch, Q/$\overline{Q}$ would follow D/$\overline{D}$ when CLK/$\overline{CLK}$ are differentially high; and (2) without the ability to completely turn off the outer branch, the inner branch regenerates Q/$\overline{Q}$ when CLK/$\overline{CLK}$ are differentially low. Note that cascading two identically hybrid latches in series with CLK/$\overline{CLK}$ connection reversed between them results in a hybrid flip-flop that behaves like a master-slave flip-flop, but with the additional benefit of the ability to use low-swing differential CML input clocks.

Referring back to FIG. 17A, note that while the simple design of circuit 1700 provides the basic function of aligning the CML clock signal and the CMOS gate signal, the particular design does not fully address the following issues when the gate signal crosses clock domain directly. First, the gate signal is typically generated from a digital domain that is often associated with a much larger clock period than the CML clock period. As such, each opening duration ("the duration" hereinafter) of the gate signal is often much longer than one CIVIL clock period, and hence offers only a coarse duration control. Second, the gate signal can often have edge skew problems (i.e., the edge can wander early or late due to process-voltage-temperature (PVT) variations), which is common to all synthesized circuits. These variations can make the CML MUX 1710 toggle at a non-fixed cycle (although the phase can be synchronized), thus resulting in a gate opening duration that fluctuates with time.

Figure 19A:
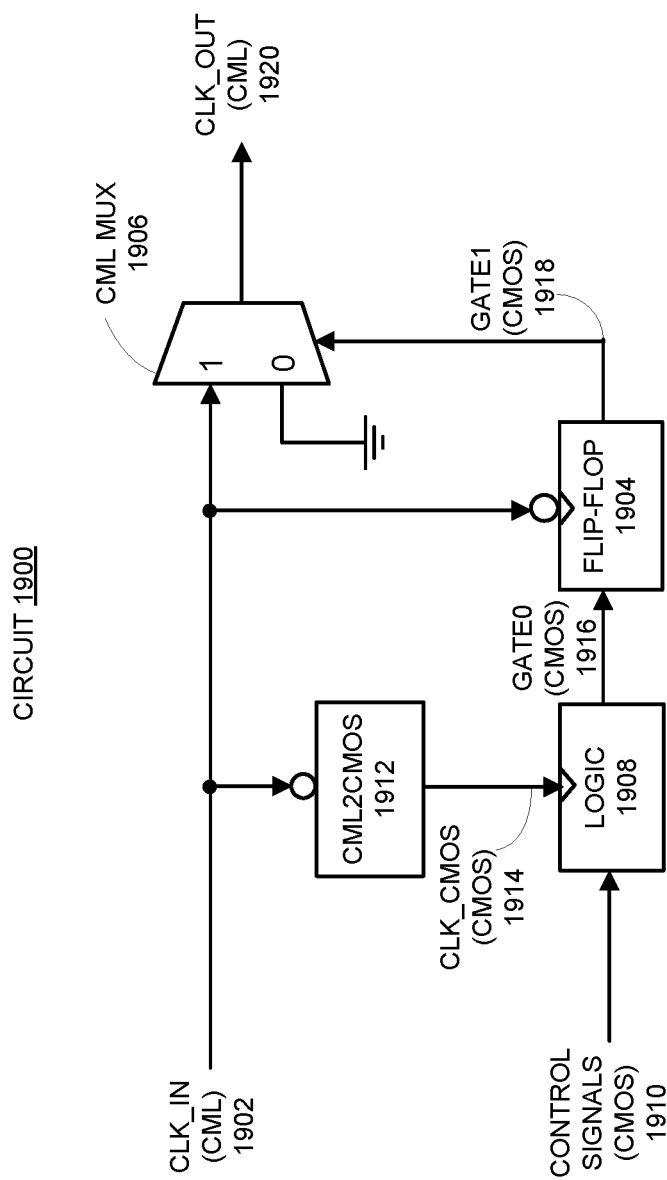
FIG. 19A illustrates a circuit which includes a finite state machine (FSM) for synthesizing a gate signal with a controllable duration and a synchronization mechanism for phase-aligning the synthesized gate signal to a CIVIL clock signal.

In order to provide more accurate time resolution and finer duration control for the CMOS gate signal, a finite-state machine (FSM) with a built-in counter can be inserted before flip-flop 1706 to refine the gate signal. FIG. 19A illustrates a circuit 1900 which includes an FSM for synthesizing a gate signal with a controllable duration and a synchronization mechanism for phase-aligning the synthesized gate signal to a CML clock signal.

As illustrated in FIG. 19A, synchronization circuit 1900 also receives a high-speed CML clock signal clk_in 1902 from a CML clock domain, and includes a hybrid CMOS-CML flip-flop 1904 (or "flip-flop 1904") for synchronizing clk_in 1902 with a CMOS gate signal, and a CML MUX 1906 for gating clk_in 1902 based on a synchronized gate signal output from flip-flop 1904. Note that flip-flop 1904 may be substantially similar in design to flip-flop 1706 in FIG. 17A. Therefore, the exemplary design of hybrid flip-flop 1800 described in conjunction with FIG. 18 is also applicable to flip-flop 1904.

One difference between circuit 1700 and circuit 1900 is that circuit 1900 does not directly receive a CMOS gate signal from a CMOS reference clock domain. Instead, circuit 1900 uses a CMOS-based FSM (i.e., logic 1908) to receive one or more control signals 1910 from a CMOS reference clock domain, wherein logic 1908 is configured to use these control signals to synthesize a CMOS gate signal. In some embodiments, control signals 1910 include initialization control information for initializing logic 1908. In one embodiment, the initialization control information includes a trigger signal transition (e.g., a rising edge transition) which is configured to cause logic 1908 to initialize and subsequently begin the gate signal synthesis. Control signals 1910 can also include duration control information which specifies the duration of an opening in the gate signal.

In one embodiment, logic 1908 operates at high speed based on the CIVIL clock signal clk_in 1902. Because logic 1908 is implemented predominantly in CMOS logic for low power operation purposes, a clock converter CML2CMOS 1912 is inserted between clk_in 1902 and a clock input of logic 1908 to convert clk_in 1902 in the CIVIL level into a new clock clk_CMOS 1914 in the CMOS level to accommodate logic 1908. In the embodiment shown, CML2CMOS 1912 receives a 180° phase-inverted version of clk_in 1902 for the same reason as explained in conjunction with circuit 1700. As a result, clk_CMOS 1914 is a CMOS clock signal that is delayed from the inverse version of clk_in 1902 by a propagation delay $T_{CML2CMOS}$ intrinsic to CML2CMOS 1912. Note that logic 1908 can operate at the speed of the input CML clock signal based on CMOS clock signal clk_CMOS 1914, thereby facilitating a tighter timing constraint and high resolution (up to one CML clock period) for synthesizing the gate signal.

In one embodiment, when synthesizing a gate signal based on control signals 1910, logic 1908 operates to control the gate opening duration as a variable equal to the clock period of clk_in 1902 multiplied by an integer variable N (N≥1) provided in the duration control information in control signals 1910. For example, after initializing logic 1908 based on control signals 1910, logic 1908 generates a rising edge transition as the beginning of the enable window. Next, logic 1908 may use the duration control information, a built-in counter and clk_CMOS 1914 to generate the enable window of the gate signal. Logic 1908 then generates a falling edge transition as the end of the enable window after the counter has counted down N clock cycles.

In some embodiments, when synthesizing a gate signal based on control signals 1910, logic 1908 operates to generate the gate opening duration to be one of a set of predetermined durations. More specifically, logic 1908 can store a set of predetermined counter values corresponding to a set of fixed gate durations, e.g., 4, 8, 16, and 32, and control signals 1910 can include one or more selection bits to select one of these counter values. In this way, logic 1908 can synthesize a gate signal with a predetermined opening duration based on the selection bits received from control signals 1910. Note that while embodiments of FIG. 19A show logic 1908 and CML2CMOS 1912 as separate modules, other embodiments can combine the function of both logic 1908 and CML2CMOS 1912 into a single module.

Still referring to FIG. 19A, note that the output of logic 1908 is a synthesized CMOS gate signal gate0 1916 with a programmed duration measured in the clock period of CML clock clk_in 1902 and can be as short as one CML clock period. While gate0 1916 is retimed based on clk_in 1902, it may not have the desired phase relationship to gate clk_in 1902, as explained previously in conjunction with FIG. 16. At this point, circuit 1900 uses flip-flop 1904 to realign gate0 1916 to clk_in 1902 in a manner substantially similar to the operation of flip-flop 1706 in FIG. 17A. As illustrated in FIG. 19A, flip-flop 1904 receives gate0 1916 as a data input and 180° inverted clk_in 1902 as the clock input, and outputs a retimed CMOS gate signal gate1 1918 which has a desired phase relationship with respect to clk_in 1902. The phase relationship between gate1 1918 and clk_in 1902 is described in more detail below in conjunction with FIG. 19B. Gate1 1918 is the input to clock gate circuit MUX 1906, which also receives clk_in 1902 and outputs a glitch-free gated CML clock signal clk_out 1920.

Figure 19B:
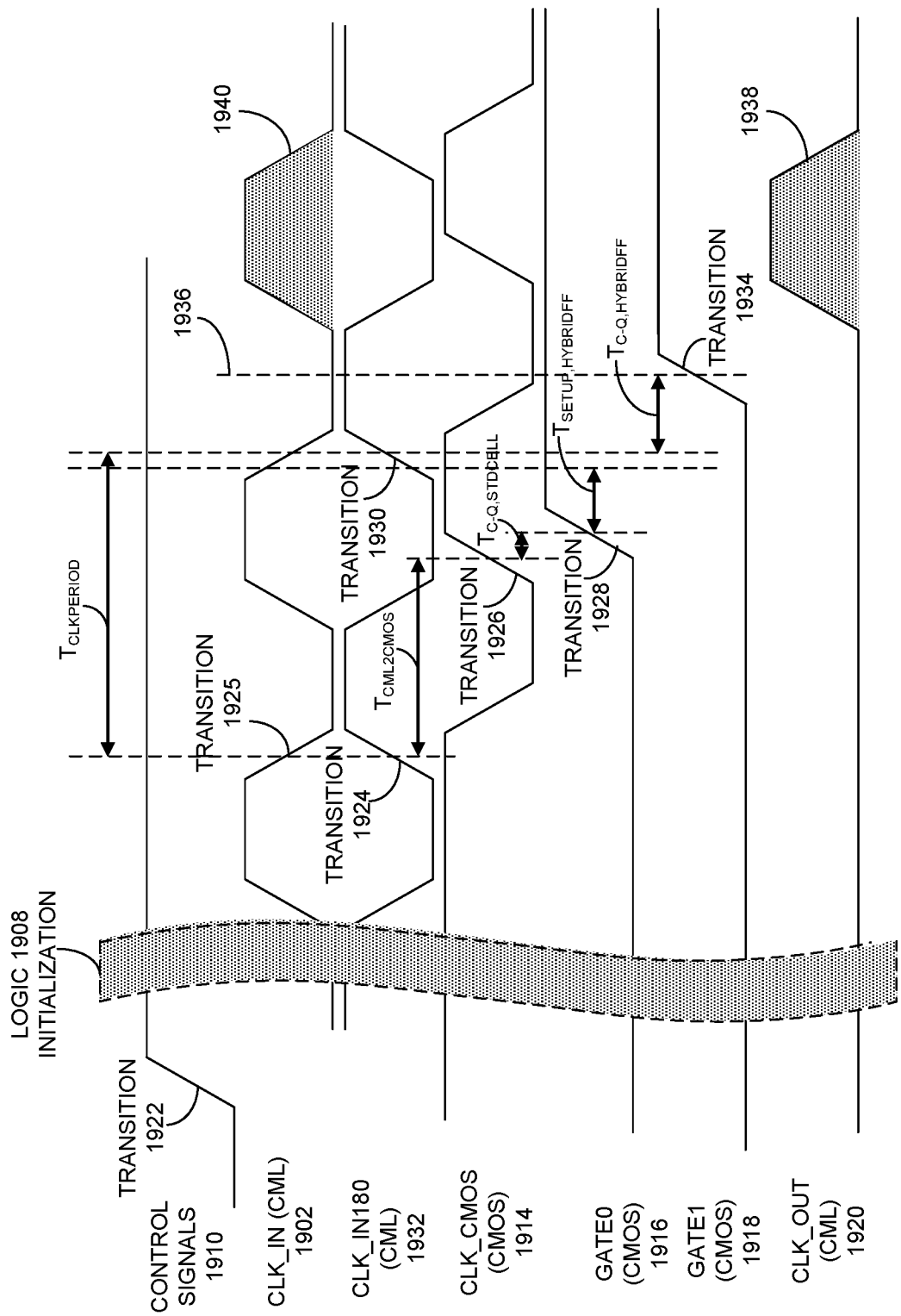
FIG. 19B presents a timing diagram illustrating the phase relationship and time constraints between the CML input clock and the retimed CMOS gate signal described in FIG. 19A.

FIG. 19B presents a timing diagram illustrating the phase relationship and time constraints between CML input clock clk_in 1902 and the retimed CMOS gate signal gate1 1918 described in FIG. 19A. As illustrated in FIG. 19B, a rising edge transition 1922 in control signals 1910 causes logic 1908 to initialize itself. In one embodiment, the time for this initialization is substantially equal to one CML clock period ($T_{ClkPERIOD}$). In other embodiments, the initialization can take multiple $T_{ClkPERIOD}$ to complete. This latency associated with logic initialization may be compensated by properly designed control signals 1910, for example, through the time of arrival of transition 1922.

Upon completing the initialization, logic 1908 is conditioned to generate the gate signal in response to the next clock transition of input clock clk_in 1902. Note that logic 1908 does not receive clk_in 1902 directly. Instead, clk_in 1902 is first 180° phase-inverted to create an inverse clock clk_in180 1932, which is subsequently converted to a CMOS clock clk_CMOS 1914 by CML2CMOS 1912. Clk_CMOS 1914 is delayed relative to clk_in180 1932 due to a propagation delay of CML2CMOS 1912, denoted as $T_{CML2CMOS}$. This is shown by a rising edge transition 1926 in clk_CMOS 1914 which is delayed from transition 1924 by $T_{CML2CMOS}$. In the embodiment shown, logic 1908 is configured to propagate an input value to the output on rising edge transitions of clk_CMOS 1914, such as transition 1926. Note that various delays shown in FIG. 19B are referenced relative to transition 1924 in clk_in180 1932. However, these delays can also be equivalently referenced relative to a corresponding falling edge transition 1925 in clk_in 1902.

Further referring to FIG. 19B, note that transition 1926 in clk_CMOS 1914 is used by logic 1908 to sample control signals 1910 and generate a rising edge transition 1928 in gate0 1916 corresponding to the beginning of a synthesized enable window. In one embodiment, the delay from transition 1926 to transition 1928 is due to the output stage (i.e., one standard cell) of logic 1908 after receiving transition 1926, which is denoted as $T_{C-Q,StdCELL}$ to represent the output delay of logic 1908.

As illustrated in FIG. 19B with reference to FIG. 19A, transition 1928 in gate0 1916 is then phase-aligned with clk_in 1902 by flip-flop 1904. More specifically, flip-flop 1904, which is directly controlled by clock clk_in180 1932, samples input gate0 1916 and passes the sampled value to the output gate1 1918 on a rising edge transition of clk_in180 1932. In the embodiment shown in FIG. 19B, this rising edge transition in clk_in180 1932 is transition 1930 one clock cycle after transition 1924. In order to satisfy a setup time requirement of flip-flop 1904, the time interval between transition 1928 in gate0 1916 and transition 1930 in clk_in180 1932 should be greater than the setup time of flip-flop 1904, referred to as $T_{SETUP,HybridFF}$. As indicated in FIG. 19B, this timing constraint can be collectively expressed as:

$$T_{CML2CMOS} + T_{C-Q,StdCELL} + T_{SETUP,HybridFF} < T_{ClkPERIOD}, \quad (1)$$

wherein $T_{ClkPERIOD}$ is the clock period of clk_in 1902, or the time between transitions 1924 and 1930.

After the retiming operation by flip-flop 1904, transition 1928 in gate0 1916 is retimed and output as transition 1934 in gate1 1918. As illustrated in FIG. 19B, transition 1934 in gate1 1918 is substantially phase-aligned with a midpoint location between two consecutive clock transitions in clk_in180 1932 marked by dashed line 1936. In reference to the input clock clk_in 1902, location 1936 corresponds to a midpoint in the logic low half of a clock cycle in clk_in 1902. In other words, location 1936 is approximately equal to ¼ of $T_{ClkPERIOD}$ from transition 1930, as previously described in conjunction with FIG. 17B. This timing requirement provides a second time constraint for the design of flip-flop 1904, which can be expressed as:

$$T_{C\text{-}Q,HybridFF} \approx \tfrac{1}{4} T_{ClkPERIOD}, \quad (2)$$

wherein $T_{C\text{-}Q,HybridFF}$ is the clock to data output delay of flip-flop 1904 measured from a triggering clock edge (e.g., transition 1930 in clk_in180 1932) to the flip-flop output switch values (e.g., transition 1934 in gate1 1918). Note that the second time constraint does not have to be exact, and depending on a particular design, a tolerance may be added to eqn. (2). For example, this tolerance can be expressed as:

$$T_{C\text{-}Q,HybridFF} = \tfrac{1}{4} T_{ClkPERIOD} \pm p \times T_{ClkPERIOD}, \quad (3)$$

wherein p is a percentage value, such as 10% or 15%. Note that a combination of the two timing constraints (1) and (2) (or (3)) facilitates determining a lower bound for the CML clock cycle $T_{ClkPERIOD}$ (i.e., how fast the CML clock can be).

Further referring to FIG. 19B with reference to FIG. 19A, note that gate1 1918 is used to control MUX 1906 to generate glitch-free gated CIVIL clock clk_out 1920. As illustrated in FIG. 19B, clk_out 1920 includes a complete half clock cycle 1938 corresponding to an original half clock cycle 1940 in clk_in 1902. Also note that FIG. 19B does not explicitly show the end of the enable window in gate0 1916 or gate1 1918. However, because the end of an enable window in a gate signal is programmed to occur an integer multiple of $T_{ClkPERIOD}$ from the beginning of the enable window, all above-described timing constraints also apply to and can be simultaneously satisfied by the end of the enable window.

Figure 20:
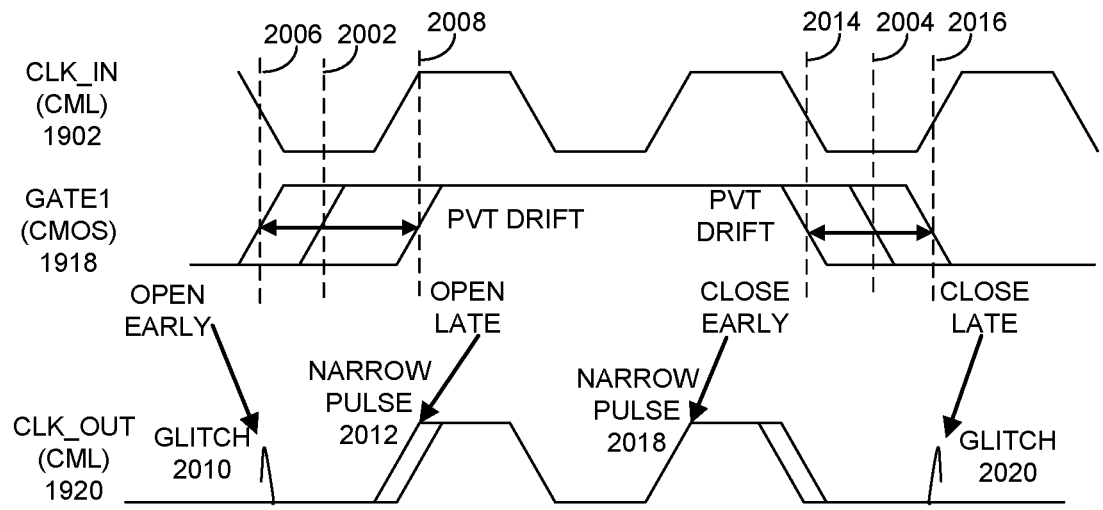
FIG. 20 presents a timing diagram illustrating the effects of PVT variations on the phase relationship between the CML input clock and the retimed CMOS gate signal.

Note that the second timing constraint of eqn. (2) or eqn. (3) does not take into account the effects of PVT variations in the system. FIG. 20 presents a timing diagram illustrating the effects of PVT variations on the phase relationship between the CML input clock and the retimed CMOS gate signal.

More specifically, FIG. 20 includes three of the signals described in FIGS. 19A and 19B: clk_in 1902, gate1 1918, and clk_out 1920. Gate1 1918 comprises an opening defined by a rising edge transition as the beginning of the enable window and a falling edge transition as the end of the enable window. Ideally, the beginning and end of the enable window are phase-aligned with clk_in 1902 at locations 2002 and 2004 marked by the dashed lines, which are midpoints between adjacent clock transitions. However, PVT variations cause the enable window boundaries to drift away from these desired locations. For example, the beginning of the enable window can open early to location 2006 or open late to location 2008. When opened early, gate1 1918 causes a glitch 2010 in clk_out 1920. On the other hand, late opening of the enable window causes a narrow pulse 2012 in clk_out 1920. Similarly, the end of the enable window can also open early to location 2014 or open late to location 2016. When opened early, the beginning of the enable window causes a narrow pulse 2018 in clk_out 1920. On the other hand, late opening of the enable window causes a glitch 2020 in clk_out 1920. However, circuit 1900 described in conjunction with FIG. 19A does not provide a compensation mechanism for the PVT drifts within gate1 1918. Note that the PVT drifts shown in FIG. 20 are for illustration purposes only.

Figure 21:
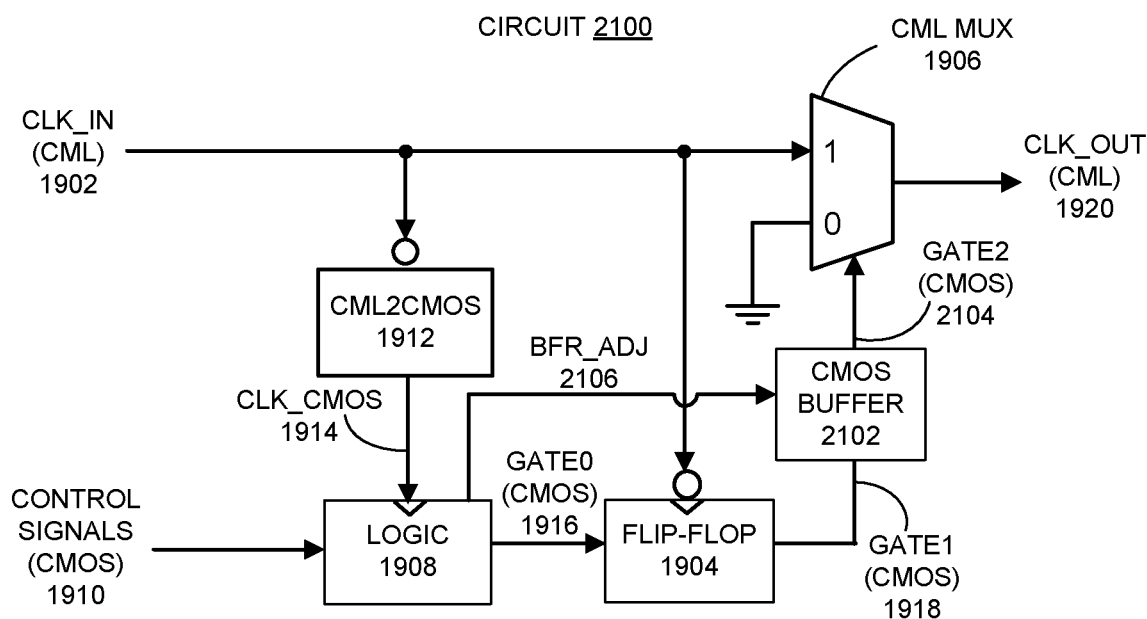
FIG. 21 illustrates a synchronization circuit which is modified version of circuit 1900 in FIG. 19A that includes a mechanism for compensating for PVT variations.

FIG. 21 illustrates a circuit 2100 which is modified version of circuit 1900 that includes a mechanism for compensating for PVT variations.

Note that circuit 2100 is substantially similar to circuit 1900 but includes a compensation module, referred to as CMOS buffer 2102, that is inserted between the output of flip-flop 1904 and the select input of MUX 1906. More specifically, CMOS buffer 2102 receives gate1 1918 as an input, adds a delay to gate1 1918, and outputs a delayed gate signal gate2 2104, which is then used to gate clk_in 1902. The amount of delay added by CMOS buffer 2102 is denoted as $T_{BFR}$. Note that CMOS buffer 2102 also receives a control input bfr_adj 2106 from logic 1908. In one embodiment, CMOS buffer 2102 is configured to set the delay value of $T_{BFR}$ based on bfr_adj 2106. Note that by introducing the delay $T_{BFR}$, the second time constraint in eqn. (2) is modified to:

$$T_{C\text{-}Q,HybridFF} + T_{BFR} \approx \tfrac{1}{4} T_{ClkPERIOD}, \quad (4)$$

wherein $T_{BFR}$ is a controllable delay. Note that PVT variations can be treated as an additional delay term $T_{PVT}$ which has a positive value if the enable window opens or closes late, and a negative value if the enable window opens or closes early. Hence, eqn. (4) can be rewritten as $$T_{C\text{-}Q,HybridFF} + T_{BFR} + T_{PVT} \approx \tfrac{1}{4} T_{ClkPERIOD}. \quad (5)$$

Note that adjustable delay $T_{BFR}$ can be dynamically varied to compensate for a varying $T_{PVT}$ for both the open and close of the enable window.

For example, if logic 1908 determines that the beginning of the enable window drifts to an early location 2006, logic 1908 can send bfr_adj 2106 which causes $T_{BFR}$ to take on a greater delay value. This way, CMOS buffer 2102 adjusts the beginning of the enable window back to the desired location 2002. Separately, if logic 1908 determines that the end of the enable window drifts to a late location 2016, logic 1908 can send bfr_adj 2106 which causes $T_{BFR}$ to take on a smaller delay value. This way, CMOS buffer 2102 adjusts the end of the enable window back to the desired location 2004. In one embodiment, CMOS buffer 2102 comprises a set of serially coupled inverters, wherein each inverter causes a unit delay. CMOS buffer 2102 can generate variable delays by passing gate1 1918 through a subset of the set of inverters. In this embodiment, control signal bfr_adj 2106 may comprise multiple bits to select a specific number of inverters to program $T_{BFR}$ to compensate for a dynamically calibrated $T_{PVT}$.

Applications and Systems

Note that because the above-described techniques for communicating between integrated circuit devices are applicable to source-synchronous communication between two integrated circuit devices, these techniques can be used in any system that includes a source-synchronous dynamic random access memory device ("DRAM"). Such a system can be, but is not limited to, a mobile system, a desktop computer, a server, and/or a graphics application. Moreover, the DRAM may be, e.g., graphics double data rate (GDDR, GDDR2, GDDR3, GDDR4, GDDR5, and future generations), double data rate (DDR2, DDR3 and future memory types), and low-power double data rate (LPDDR2 and future generations).

The source-synchronous apparatus and techniques described may be applicable to other types of memory, for example, flash and other types of non-volatile memory and static random access memory (SRAM). One or more of the techniques or apparatus described herein are applicable to front side bus, (i.e., processor to bridge chip, processor to processor, and/or other types of chip-to-chip interfaces). Note that the two communicating integrated circuit IC chips (i.e., the transmitter and receiver) can also be housed in the same package, e.g., in a stacked die approach. Furthermore, the transmitter, receiver and the channel can all be built on-die in a system-on-a-chip (SOC) configuration.

Moreover, throughout this description, a clock signal is described and it should be understood that a clock signal in the context of the instant description may be embodied as a strobe signal or other signal that conveys a timing reference.

Figure 22:
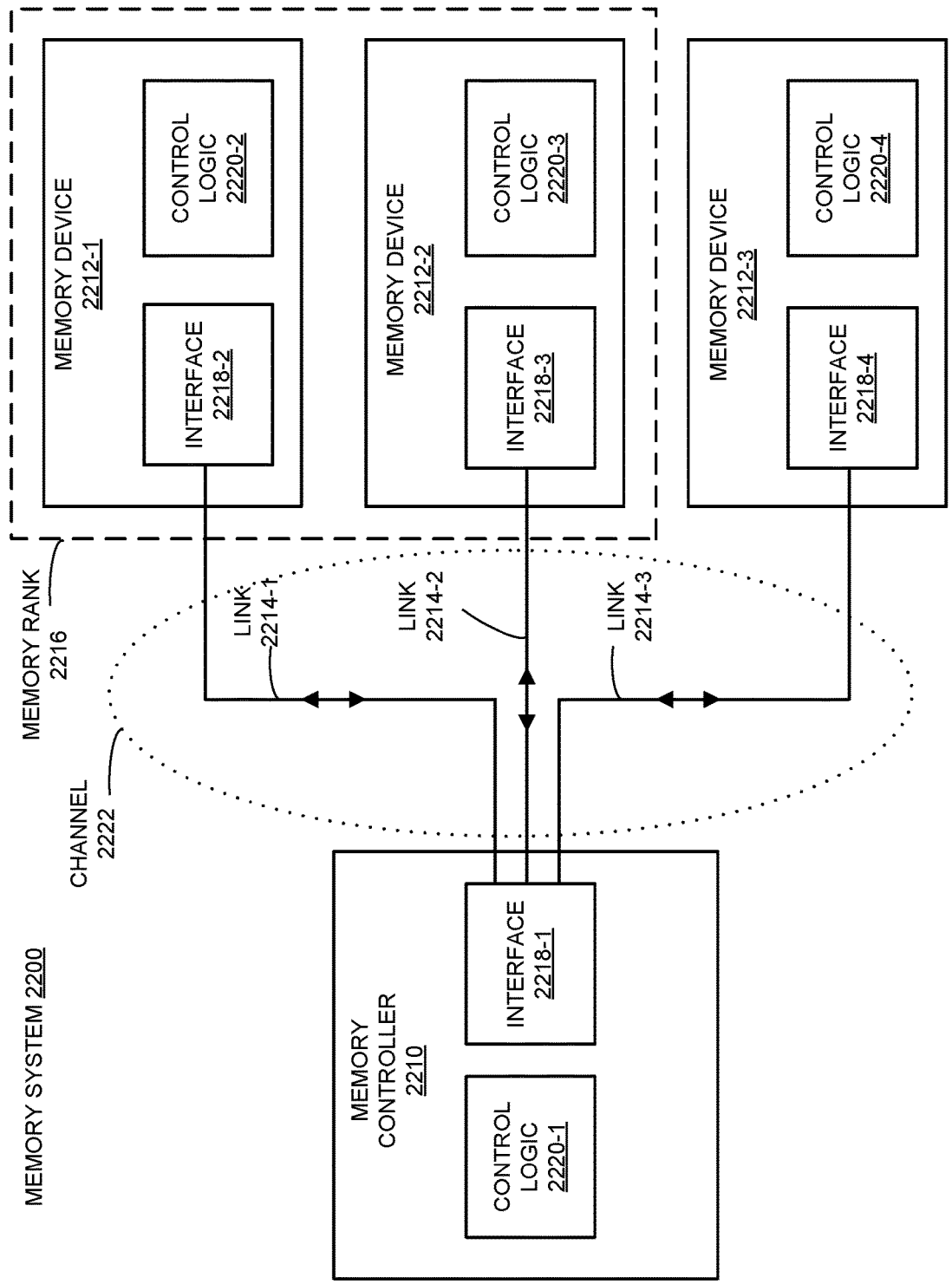
FIG. 22 presents a circuit diagram illustrating an embodiment of a memory system, which includes at least one memory controller and one or more memory devices.

Additional embodiments of memory systems that may use one or more of the above-described apparatus and techniques are described below with reference to FIG. 22. FIG. 22 presents a block diagram illustrating an embodiment of a memory system 2200, which includes at least one memory controller 2210 and one or more memory devices 2212. While FIG. 22 illustrates memory system 2200 with one memory controller 2210 and three memory devices 2212, other embodiments may have additional memory controllers and fewer or more memory devices 2212. Note that the one or more integrated circuits may be included in a single-chip package, e.g., in a stacked configuration.

Memory controller 2210 may include an I/O interface 2218-1 and control logic 2220-1. In some embodiments, one or more of memory devices 2212 include control logic 2220 and at least one of interfaces 2218. However, in some embodiments some of the memory devices 2212 may not have control logic 2220. Moreover, memory controller 2210 and/or one or more of memory devices 2212 may include more than one of the interfaces 2218, and these interfaces may share one or more control logic 2220 circuits. In some embodiments two or more of the memory devices 2212, such as memory devices 2212-1 and 2212-2, may be configured as a memory rank 2216.

As discussed in conjunction with FIGS. 7 to 12, one or more of control logic 2220-1, control logic 2220-2, control logic 2220-3, and control logic 2220-4 may be used to perform clock multiplication and frequency division to generate a set of new clocks from a reference clock, and to retime a received data signal from the reference clock domain to the new clock domain. When performing the retiming operation, the one or more of control logic may use a logic circuit to determine whether it is safe to retime the received data signal using the new clocks. The one or more of control logic may also use a circuit to phase-adjust the received data signal so that it becomes safe to retime the phase-adjusted received data signal based on the new clocks when it is unsafe to directly retime the received data signal. Moreover, the one or more of control logic may use a serializer to serialize a parallel data received by memory controller 2210 into a retimed serial data signal.

Memory controller 2210 and memory devices 2212 are coupled by one or more links 2214, such as multiple wires, in a channel 2222. While memory system 2200 is illustrated as having three links 2214, other embodiments may have fewer or more links 2214. Furthermore, links 2214 may be used for bi-directional and/or unidirectional communication between the memory controller 2210 and one or more of the memory devices 2212. For example, bi-directional communication between the memory controller 2210 and a given memory device may be simultaneous (full-duplex communication). Alternatively, the memory controller 2210 may transmit a command to the given memory device, and the given memory device may subsequently provide requested data to the memory controller 2210, e.g., a communication direction on one or more of the links 2214 may alternate (half-duplex communication). Also, one or more of the links 2214 and corresponding transmit circuits and/or receive circuits may be dynamically configured, for example, by one of the control logic 2220 circuits, for bidirectional and/or unidirectional communication.

In some embodiments, commands are communicated from the memory controller 2210 to one or more of the memory devices 2212 using a separate command link, i.e., using a subset of the links 2214 which communicate commands. However, in some embodiments commands are communicated using the same portion of the channel 2222 (i.e., the same links 2214) as data.

Devices and circuits described herein may be implemented using computer-aided design tools available in the art, and embodied by computer-readable files containing software descriptions of such circuits. These software descriptions may be: behavioral, register transfer, logic component, transistor and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

The preceding description was presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein. Accordingly, many modifications and variations will be apparent to practitioners skilled in the art. Additionally, the above disclosure is not intended to limit the present description. The scope of the present description is defined by the appended claims.

Also, some of the above-described methods and processes can be embodied as code and/or data, which can be stored in a non-transitory computer-readable storage medium as described above. When a computer system reads and executes the code and/or data stored on the non-transitory computer-readable storage medium, the computer system performs the methods and processes embodied as data structures and code and stored within the non-transitory computer-readable storage medium. Furthermore, the methods and processes described below can be included in hardware. For example, the hardware can include, but is not limited to, application-specific integrated circuit (ASIC) chips, field-programmable gate arrays (FPGAs), and other programmable-logic devices now known or later developed. When the hardware is activated, the hardware performs the methods and processes included within the hardware.

What is claimed is:

1. An integrated circuit, comprising:
   circuitry to produce a first data signal that has a determinate phase-alignment to a first timing reference signal;
   a multiplying injection-locked oscillator to produce, based on the first timing reference signal, a second timing reference signal that has an indeterminate phase relationship to the first timing reference signal;
   circuitry to, based on a third timing reference signal, retime the first data signal to have a determinate phase relationship to the second timing reference signal, the third timing reference signal having a determinate phase relationship to the second timing reference signal.

2. The integrated circuit of claim 1, further comprising:
   circuitry to transition the multiplying injection-locked oscillator from a power-off state to a power-on state.

3. The integrated circuit of claim 2, wherein the first timing reference signal is switching at a first frequency and the third timing reference signal is switching at a second frequency that is an integer multiple of a first frequency.

4. The integrated circuit of claim 3, wherein the third timing reference signal is generated by circuitry that comprises at least one counter circuit.

5. The integrated circuit of claim 4, wherein the at least one counter circuit is set to a determinate state at the start of the power-on state.

6. The integrated circuit of claim 1, wherein the multiplying injection-locked oscillator comprises a first injection-locked oscillator and a second injection-locked oscillator.

7. The integrated circuit of claim 4, wherein a plurality of output signal from the first injection-locked oscillator are injected into corresponding injection points of the second injection-locked oscillator.

8. The integrated circuit of claim 5, wherein the second injection-locked oscillator is a non-multiplying injection-locked oscillator.

9. An integrated circuit device, comprising:
   circuitry to produce a first data signal that has a determinate phase relationship to a first timing reference signal;
   a multiplying injection-locked oscillator to produce, based on the first timing reference signal, a second timing reference signal that has an indeterminate phase relationship to the first timing reference signal;
   circuitry to, based on a third timing reference signal, retime the first data signal to have a determinate phase relationship to the second timing reference signal, the third timing reference signal having a determinate phase relationship to the second timing reference signal;
   clock buffer circuitry to couple the third timing reference signal to a second integrated circuit;
   circuitry to transition the multiplying injection-locked oscillator from a power-off state to a power-on state.

10. The integrated circuit of claim 9, wherein the first timing reference signal is switching at a first frequency and the third timing reference signal is switching at a second frequency that is an integer multiple of a first frequency.

11. The integrated circuit of claim 10, the third timing reference signal is generated by circuitry that comprises at least one counter circuit.

12. The integrated circuit of claim 11, wherein the at least one counter circuit is set to a determinate state at the start of the power-on state.

13. The integrated circuit of claim 12, wherein the multiplying injection-locked oscillator comprises a first injection-locked oscillator and a second injection-locked oscillator.

14. The integrated circuit of claim 13, wherein a plurality of output signal from the first injection-locked oscillator are injected into corresponding injection points of the second injection-locked oscillator.

15. The integrated circuit of claim 14, wherein the second injection-locked oscillator is a non-multiplying injection-locked oscillator.

16. A method for operating an integrated circuit device, comprising:
    producing a first data signal that has a determinate phase relationship to a first timing reference signal;
    providing the first timing reference signal to a multiplying injection-locked oscillator to produce, based on the first timing reference signal, a second timing reference signal that has an indeterminate phase relationship to the first timing reference signal;
    retiming, based on a third timing reference signal, the first data signal to produce a second data signal that has a determinate phase relationship to the second timing reference signal, the third timing reference signal having a determinate phase relationship to the second timing reference signal.

17. The method of claim 16, wherein the first timing reference signal switches at a first frequency and the third timing reference signal switches at a second frequency that is an integer multiple of a first frequency.

18. The method of claim 17, further comprising:
    switching the multiplying injection-locked oscillator from a powered-off state to a powered-on state.

19. The method of claim 18, wherein the third timing reference signal is generated using at least one counter circuit, and the method further comprises:
    setting the at least one counter circuit to a deterministic state at the start of the powered-on state.

20. The method of claim 18, wherein the multiplying injection-locked oscillator comprises a plurality of injection-locked oscillators.